United States Patent
Ueda et al.

(10) Patent No.: US 6,940,740 B2
(45) Date of Patent: Sep. 6, 2005

(54) MULTILEVEL SEMICONDUCTOR MEMORY DEVICE AND METHOD FOR DRIVING THE SAME AS A NEURON ELEMENT IN A NEURAL NETWORK COMPUTER

(75) Inventors: Michihito Ueda, Osaka (JP); Takashi Ohtsuka, Osaka (JP); Kiyoyuki Morita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 311 days.

(21) Appl. No.: 10/428,840

(22) Filed: May 5, 2003

(65) Prior Publication Data

US 2003/0198077 A1 Oct. 23, 2003

Related U.S. Application Data

(62) Division of application No. 10/379,795, filed on Mar. 6, 2003, which is a continuation of application No. PCT/JP02/06250, filed on Jun. 21, 2002, now abandoned.

(30) Foreign Application Priority Data

Jun. 22, 2001 (JP) ........................................ 2001-190370
Sep. 11, 2001 (JP) ........................................ 2001-274526

(51) Int. Cl.[7] ............................................. G11C 11/22
(52) U.S. Cl. ..................... 365/145; 365/168; 365/46; 365/45; 365/148; 365/149; 365/167
(58) Field of Search ................................ 365/226, 229, 365/168, 46, 45, 148, 149, 145, 167

(56) References Cited

U.S. PATENT DOCUMENTS

| | | | |
|---|---|---|---|
| 5,307,304 A | | 4/1994 | Saito et al. .................. 365/145 |
| 5,933,366 A | * | 8/1999 | Yoshikawa ............. 365/185.03 |
| 6,344,991 B1 | | 2/2002 | Mikami et al. ............. 365/145 |
| 2003/0142533 A1 | * | 7/2003 | Ueda et al. .................. 365/145 |
| 2003/0198077 A1 | * | 10/2003 | Ueda et al. .................. 365/145 |

FOREIGN PATENT DOCUMENTS

| | | | |
|---|---|---|---|
| CN | 1059798 | 3/1992 | ........... G11C/11/34 |
| EP | 469934 | 2/1992 | |
| JP | 4-090189 | 3/1992 | ........... G11C/22/00 |
| JP | 7-122661 | 5/1995 | ........... G11C/11/22 |
| JP | 8-124378 | * 5/1996 | ........... G11C/11/22 |
| JP | 11-039860 | 2/1999 | ........... G11C/11/22 |
| JP | 11-040757 | 2/1999 | ........... H01L/27/04 |
| JP | 11-220105 | 8/1999 | ......... H01L/27/108 |
| JP | 2001-94065 A | 4/2001 | ........... H01L/27/10 |
| JP | 2002-43538 | 2/2002 | ......... H01L/27/105 |
| KR | 236994 | 1/2000 | ........... H01L/27/10 |
| KR | 2002-010454 | 2/2002 | |
| TW | 230259 | 9/1994 | ........... H01L/21/00 |
| WO | WO95/26570 | 10/1995 | ........... H01L/27/10 |

* cited by examiner

Primary Examiner—Andrew Q. Tran
(74) Attorney, Agent, or Firm—McDermott Will & Emery LLP

(57) ABSTRACT

A semiconductor device includes: a control-voltage supply unit 110; an MOS transistor including a gate electrode 109 and drain and source regions 103a and 103b; a dielectric capacitor 104; and a resistor 106. The dielectric capacitor 104 and the resistor 106 are disposed in parallel and interposed between the gate electrode 109 and the control-voltage supply unit 110. With this structure, a charge is accumulated in each of an intermediate electrode of the dielectric capacitor 104 and the gate electrode 109 upon the application of a voltage, thereby varying a threshold value of the MOS transistor. In this manner, the history of input signals can be stored as a variation in a drain current in the MOS transistor, thus allowing multilevel information to be held.

24 Claims, 41 Drawing Sheets

(a)　　　　　　　　　(b)

MULTILEVEL SEMICONDUCTOR MEMORY DEVICE AND METHOD FOR DRIVING THE SAME AS A NEURON ELEMENT IN A NEURAL NETWORK COMPUTER

This application is a divisional of application Ser. No. 10/379,795 filed Mar. 6, 2003, which is a continuation of Application No. PCT/JP02/06250, filed Jun. 21, 2002, now abandoned.

BACKGROUND OF THE INVENTION

The present invention relates to semiconductor devices and methods for driving the same. More particularly, the present invention relates to semiconductor devices which are applicable to neural network computers (neurocomputers), for example, and allows multilevel information to be stored therein, and also relates to methods for driving the devices.

As multimedia has been developed, semiconductor devices are more and more required to improve their performance. For example, to process a large capacity of digital information, even CPUs of personal computers operating at high speeds of 1 GHz or more have come onto the market.

To meet such a demand for improving the performance of semiconductor devices, semiconductor fabricators have improved the performance mainly with techniques of downsizing the semiconductor devices.

However, even physical limitations are now pointed out in downsizing the semiconductor devices, and therefore, improvement in the semiconductor devices by further downsizing is not expected in consideration of fabrication cost.

To solve this problem, in place of digital information processing techniques to date that perform computations using a binary signal of "1" or "0", multilevel cell technologies for converting information into three or four levels, technologies for computers (neurocomputers) that perform computation by mimicking the behavior of the brain of an animal with the application of the multilevel cell technologies, and the like, have been researched.

The brain of an animal is basically composed of nerve cells, which are called neurons and have a computing function, and nerve fibers, each of which transmits a computing result of a neuron to another neuron, i.e., serves as so-called wiring.

A neurocomputer is composed of a large number of neuron units, which are made of semiconductor elements corresponding to neurons, and a large number of synapse units, which transmits signals to the neuron units and add weights to the signals. Combinations of the neuron units and the synapse units are hereinafter referred to as neuron elements.

When information signals having different "weights" and being output from a plurality of previous-stage neuron elements are input to a neuron element, the information signals are added to this neuron element. When the sum of the information signals exceeds a threshold value, the neuron element "fires" to allow a signal to be output to a subsequent-stage neuron element. Information is processed by repeating this operation.

A process by which the brain of an animal learns is considered a process of varying weights on synaptic connections. That is to say, the weights are gradually modified with respect to various input signals so as to obtain an appropriate output, and finally the weights stay at appropriate values.

To configure a neural network having such a leaning function, it is necessary to vary the strength on each synaptic connection as required and to store the varied strength. Therefore, the multilevel cell technologies have become essential for implementing neurocomputers.

The neurocomputer described above is an example of application of the multilevel cell technologies. Naturally, multilevel memories in which multilevel information is stored therein with stability have been researched actively. As is evident from these factors, the multilevel cell technologies for information have become extremely important for future semiconductor devices.

As an example of such multilevel cell technologies, a known technique for allowing information with at least three levels to be stored in a single memory cell was disclosed in Japanese Laid-Open Publication No. 8-124378.

FIG. 49 is a cross-sectional view showing a known semiconductor device functioning as a multilevel memory. As shown in FIG. 49, the known semiconductor device includes: a silicon substrate 1107; well lines BUL1 and BUL 2 buried in the silicon substrate 1107; PZT films 1109 made of a ferroelectric and formed on the well lines BUL1 and BUL 2, respectively; a word line WL1 formed on the PZT films 1109; a bit line BL1 formed over the word line WL1 and the well line BUL1; and a bit line BL2 formed over the word line WL1 and the well line BUL2. Although not shown, source and drain are provided in each of the well lines BUL1 and BUL2. The bit line BL1 is connected to the drain in the well line BUL1 via a bit contact (not shown), while the bit line BL2 is connected to the drain in the well line BUL2 via a bit contact.

Information is written by changing the polarization in the PZT film 1109 upon the application of a voltage to the word line WL1 and the well lines BUL1 and BUL2.

FIG. 50 is a graph showing a relationship between a voltage VGB applied to the gate electrode (=the potential at the gate electrode-the potential at the well) and the magnitude of the polarization of the ferroelectric (i.e., hysteresis characteristics) in each memory cell of the known device. Since the ferroelectric has hysteresis characteristics, the polarization state changes depending on the history of the applied voltage, and even after the voltage has been removed, the polarization state remains as indicated by a point A, B or C in FIG. 50. If a voltage $V=V_1$, at which the ferroelectric is in a saturated polarization state is applied and then removed, the polarization is at the point A. When a voltage is removed after the application of a voltage $V=-V_2$, the polarization is at the point C. If a voltage $V=-V_1$ is applied and then removed, the polarization is at the point B.

FIG. 51 is a graph showing the relationship between a drain current I and a gate voltage VGB in a memory cell when the ferroelectric is in the state indicated by the point A, C or B in FIG. 50. In FIG. 51, the left-side curve, the middle curve and the right-side curve correspond to the states indicated by the points A, C and B, respectively. In the state indicated by the point A, the ferroelectric exhibits a large positive polarization, so that a threshold voltage VtA of the memory cell is lower than a threshold voltage VtC in the state indicated by the point C at which no polarization is exhibited. In the state indicated by the point B, the ferroelectric exhibits a large negative polarization, so that a threshold voltage VtB of the memory cell is higher than the threshold voltage VtC in the state indicated by the point C at which no polarization is exhibited. By thus providing the ferroelectric with the three polarization states indicated by the point A, C and B, the memory cell can be controlled to have three different levels of threshold voltages. Therefore, it is possible to store information with three levels in the memory cell corresponding to the values of these threshold voltages. The known technique described above indicates that if a polarization state between the points A and C is used, the number of levels can be further increased.

However, the known technique has a basic problem that the polarization state "C" is difficult to obtain accurately. Specifically, in the known technique, when a voltage is removed after the ferroelectric has exhibited a small polarization upon the application of an appropriate voltage, the polarization comes close to zero. However, as shown in FIG. 50, the hysteresis of the ferroelectric changes greatly in the vicinity of a coercive voltage Vc, while the absolute value of the voltage $-V_2$ is essentially close to the coercive voltage Vc. Thus, the polarization of the ferroelectric is extremely difficult to control, resulting in that the polarization value after the removal of the voltage changes greatly only by a small variation in the voltage $V_2$ caused by noise or the like. In addition to such a variation in the write voltage, variations in the crystal state and the thickness of the ferroelectric, for example, also vary the coercive voltage Vc. This results in difficulty in obtaining stable multilevel storage properties with high reliability and excellent reproducibility. The coercive voltage herein refers to a voltage required for changing the hysteresis of the ferroelectric largely to alter the distribution of the charge in a ferroelectric capacitor.

SUMMARY OF THE INVENTION

An object of the present invention is providing a highly reliable semiconductor device in which information can be stored with stability and which is applicable as a neuron element for a neurocomputer and a method for driving the semiconductor device.

A first semiconductor device of the present invention includes: a semiconductor substrate; and a memory in which a first capacitor, including a first upper electrode, a first dielectric layer and a first lower electrode and formed over the semiconductor substrate, and a second capacitor, including a second upper electrode, a second dielectric layer and a second lower electrode and formed over the semiconductor substrate, are disposed. The semiconductor device can store information with three or more levels. The first and second dielectric layers have hysteresis characteristics exhibiting mutually differing coercive voltages.

In this device, a metastable point is created on a hysteresis loop of the whole of the capacitors, thus allowing information with three or more levels to be stored with stability even when a write voltage varies.

The first and second capacitors may be polarized in one direction during operation. Then, at least one metastable point is created on the hysteresis loop due to the difference in coercive voltage between the first and second capacitors. As a result, information with three or more levels can be stored with stability.

The semiconductor device may further include a transistor including: a gate insulating film formed on the semiconductor substrate; and a gate electrode formed on the gate insulating film and made of a conductor film. Both of the first and second lower electrodes may be united with the gate electrode. Then, the number of process steps for fabricating a semiconductor device in which multilevel information can be stored with stability is reduced, thus reducing the fabrication cost.

The semiconductor device may further include: a gate insulating film formed on the semiconductor substrate; and a gate electrode formed on the gate insulating film and made of a conductor film. Each of the first and second lower electrodes may be connected to the gate electrode. Then, a voltage applied to the capacitors is transmitted to the gate electrode so that a drain current flowing upon the application of the gate voltage is varied depending on the state of the memory. As a result, multilevel information can be stored with stability.

In respective first-half stages in ranges in which the polarizations of the first and second capacitors are from zero to saturation, the polarizations of the first and second capacitors may vary at mutually different rates with change in voltage. Then, a metastable point can be created on the hysteresis loop of the whole of the capacitors as intended. That is to say, the storing operation is performed with stability even when the write voltage is varied by noise or the like.

Each of the first and second dielectric layers may include a ferroelectric layer. Then, polarization states corresponding to multiple levels are created depending on a remanent polarization after the application of the voltage to the capacitors, thus allowing a multilevel storing operation.

The first and second upper electrodes may be connected to each other. Then, write voltages can be applied using an identical line.

The first and second dielectric layers are preferably formed out of an identical film. Then, the area of the memory can be reduced, as compared to the case where the first and second dielectric layers are separately formed. In addition, the number of fabricating process steps can be also reduced.

The first and second dielectric layers are preferably made of an identical material, and the semiconductor device may further include a paraelectric capacitor connected in parallel with the first and second capacitors.

The semiconductor device preferably includes a capacitor interposed between the second capacitor and the gate electrode. Then, an apparent coercive voltage of the second capacitor can be varied, thus further enhancing the flexibility in designing.

The first and second dielectric layers may differ mutually in area. Then, the coercive voltages of the capacitors can be varied.

The first and second dielectric layers may be made of mutually different materials. Then, the first and second capacitors can be formed to have mutually different coercive voltages.

The first and second dielectric layers may differ mutually in thickness. Then, the first and second capacitors can be formed to have mutually different coercive voltages.

The area ratio between the electrodes of the first and second capacitors, i.e., (the area of the first capacitor)/(the area of the second capacitor), is in the range of 0.2 to 2, both inclusive. Then, if the first and second dielectric layers are made of an identical material, separation of stored information is excellent, resulting that information with three levels can be held with stability.

In particular, the area ratio between the electrodes of the first and second capacitors, i.e., (the area of the first capacitor)/(the area of the second capacitor), is in the range of 0.5 to 2, both inclusive. Then, separation of stored information is excellent, resulting that even information with four or more levels can be held with stability in the semiconductor device.

A second semiconductor device of the present invention includes: a control-voltage supply unit; a field-effect transistor including a gate electrode having a function of accumulating a charge; and a capacitor and a resistor, disposed in parallel and interposed between the control-voltage supply unit and the gate electrode. The semiconductor device can store multilevel information.

In this device, current flows through the resistor upon the application of a write voltage to the resistor, so that a charge is accumulated in the gate electrode to vary the threshold value of the field-effect transistor. In addition, the field-effect transistor has a plurality of states which are held for a given period, so that multilevel information can be stored. Furthermore, the information is read out according to the variation in a drain current in the field-effect transistor. Thus, the semiconductor device is usable not only as a multilevel memory but also as an element for assigning weights to signals in a neurocomputer.

A charge may be injected from the control-voltage supply unit into the gate electrode. Then a charge can be injected in a manner different from that in a flash memory.

The semiconductor device may function as an analog memory in which multilevel information can be stored continuously according to the amount of the charge accumulated in the gate electrode. Then, the device is usable for various purposes such as weighing in a neurocomputer, as compared to a flash memory, for example.

The resistor may be made of a dielectric material. Then, the charge accumulated in the gate electrode is unlikely to leak. Thus, input information can be held for a longer period than in the case where the resistor is made of undoped silicon, for example. In addition, since the resistor can be formed on the transistor, the cell size can be reduced.

The control-voltage supply unit may be as an upper electrode. The gate electrode of the field-effect transistor may be connected to an intermediate electrode. The capacitor may be a dielectric capacitor including the upper electrode, the intermediate electrode and a dielectric layer interposed between the upper electrode and the intermediate electrode. The dielectric layer may have a resistance component functioning as the resistor. For example, the dielectric layer of the dielectric capacitor and the resistor may be one and the same. In such a case, the area of the device is reduced, as compared to the case where the resistor and the dielectric layer are separately provided.

The resistor preferably has a resistance value that varies according to the strength of an electric field applied to the resistor. Then, the amount of the charge accumulated in the gate electrode can be adjusted.

The resistor preferably has a resistance value which is almost constant when the strength of an electric field applied to the resistor is at a level equal to or smaller than a given level and which decreases when the strength of the electric field exceeds the given level. Then, the device can be driven by a plurality of methods, e.g., by accumulating a charge in the gate electrode in a short time by applying an electric field exceeding a given value or by accumulating a charge for a relatively long time by applying an electric field not higher than the given value.

A pass current flowing through the resistor preferably increases substantially in proportion to a voltage applied to both ends of the resistor when the absolute value of the applied voltage is equal to or smaller than a given value, while the pass current preferably increases exponentially when the absolute value of the applied voltage exceeds the given value. Then, the device can be driven by a plurality of methods as described above.

A pass current flowing per unit area of the resistor is preferably 100 [$mA/cm^2$] or less in a voltage range in which the pass current flowing through the resistor increases substantially in proportion to the voltage. Then, written information or the history of the written information can be held for a given period. The smaller the pass current is, the longer the holding time (the recovery time) of the information is required.

The capacitor may include a ferroelectric layer, and the resistor may be made of a ferroelectric material. Then, the amount of the charge accumulated in each of the intermediate electrode and the gate electrode can be also varied depending on the polarization direction in the ferroelectric layer. As a result, the semiconductor device of the present invention is usable as a multilevel memory with more levels than in the case where a capacitor including a paraelectric layer is used. In addition, the inventive device is applicable as a neuron element with extremely high flexibility in weighting.

The semiconductor device preferably further includes at least one resistor provided separately from the capacitor. Then, materials having various properties are usable for the resistor, thereby easily ensuring a semiconductor device holding multilevel information more effectively.

The resistor provided separately from the capacitor is preferably a variable resistor that includes an oxide containing an element selected from the group consisting of Ba, Sr, Ti, Zn, Fe and Cu, or includes an element selected from the group consisting of SiC, Si and Se. Then, the following controls can be performed. That is to say, a charge is injected in the gate electrode in a voltage range in which the resistance value of the resistor is small, while the charge injection is finely controlled in a voltage range in which the resistance value is large.

The resistors are preferably diodes that are connected in parallel and disposed in opposite orientations.

The semiconductor device preferably further includes an MIS transistor which has an ON resistance functioning as the resistor provided separately from the capacitor.

The resistor provided separately from the capacitor is preferably a variable resistance element made of a variable resistance material having a resistance value that varies depending on the crystallinity of the material.

The semiconductor device is preferably used as a synapse unit in a neurocomputer. Then, a high-performance neurocomputer is implementable.

An inventive method for driving a semiconductor device including a control-voltage supply unit, a field-effect transistor including a gate electrode having a function of accumulating a charge, a capacitor, and a resistor, the capacitor and the resistor being disposed in parallel and interposed between the control-voltage supply unit and the gate electrode, includes the steps of: a) applying a write voltage to both ends of the resistor to vary the amount of the charge accumulated in the gate electrode via the resistor, thereby changing a threshold voltage of the field-effect transistor; and b) reading out information according to variation in a drain current in the field-effect transistor.

According to this method, information written by applying a voltage to a capacitor and a resistor in the step a) is held for a given time period. In addition, in the step b), multilevel information according to a variation in a drain current in a field-effect transistor can be read out. Thus, the semiconductor device of the present invention can be driven as a multilevel memory. If the semiconductor device of the present invention is applied to a neurocomputer, the device is usable as an element having a function of adding weights to input information.

The capacitor may include a dielectric layer. Then, the charge accumulated in the gate electrode is unlikely to leak.

Therefore, input information can be held for a longer time than in the case where the resistor is made of an undoped silicon having a smaller resistance value.

In the step a), a pass current flowing through the resistor preferably increases substantially in proportion to the write voltage when the absolute value of the write voltage is equal to or smaller than a give value; and the pass current preferably increases exponentially as the write voltage increases, when the absolute value of the write voltage exceeds the given value. Then, the operation of writing information performed in a short time by applying a pulse voltage exceeding a given value, and the operation of writing information by applying a voltage equal to or lower than the given voltage, can be used properly. In particular, in the case where the device is used as a neuron element, the threshold value of the field-effect transistor is varied by applying a voltage exceeding a given voltage, thereby executing learning with a storing operation replayed at a relatively low voltage.

In the step a), when the absolute value of the write voltage is equal to or smaller than the given value, the amount of the charge accumulated in the gate electrode is preferably controlled depending on the length of a time period over which the write voltage is applied. That is to say, multilevel information can be written by a relatively simple manner.

In the step a), when the absolute value of the write voltage is equal to or smaller than the given value, a pass current flowing per unit area of the resistor is preferably 100 [mA/cm$^2$] or less. Then, the recovery time of the semiconductor device, i.e., the holding time of information, can be ensured for a given period of time or longer.

In the step a), when the absolute value of the write voltage exceeds the given value, the write voltage is preferably set to have an uniform pulse width and the amount of the charge accumulated in the gate electrode is preferably controlled depending on the magnitude of the absolute value of the write voltage. Thus, multilevel information can be written also depending on the magnitude of the absolute value of the write voltage. In this case, the time period required for writing can be reduced, thereby allowing information to be stored for a short time.

In the step a), when the absolute value of the write voltage exceeds the given value, the amount of the charge accumulated in the gate electrode is preferably subjected to a coarse control, and when the absolute value of the write voltage is lower than the give value, the amount of the charge accumulated in the gate electrode is preferably subjected to a fine control.

In the step a), the write voltage is preferably in positive- and negative-voltage ranges that extend to an identical absolute value. Then, the drain current characteristic of the field-effect transistor differs between the application of a positive voltage and the application of a negative voltage. As a result, a larger amount of information can be stored in the semiconductor device, than in the case of application of only a positive voltage.

DESCRIPTION OF THE PREFERRED EMBODIMENTS

Embodiment 1

Hereinafter, a first embodiment of the present invention will be described with reference to the drawings.

Figure 1:
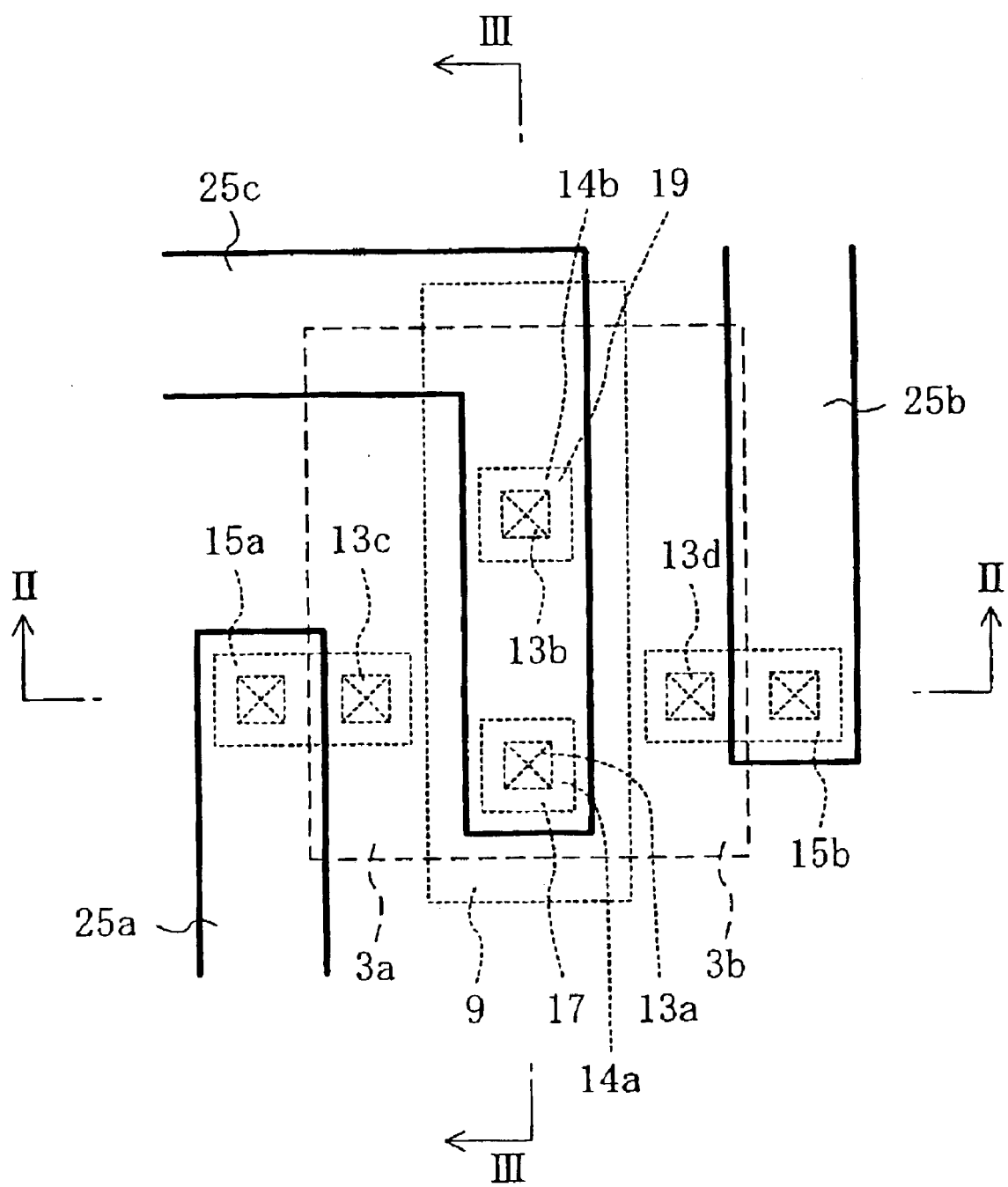
FIG. 1 is a top plan view showing a multilevel memory according to a first embodiment of the present invention.
Figure 2:
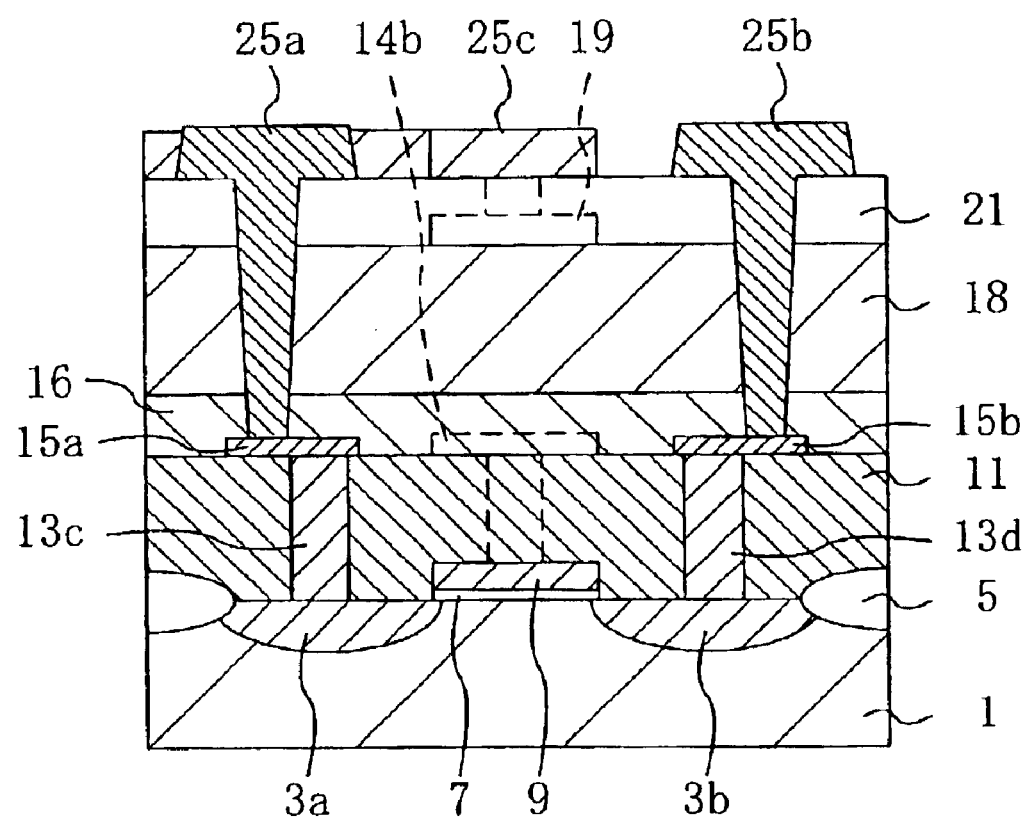
FIG. 2 is a cross-sectional view of the multilevel memory of the first embodiment, taken along the line II—II in FIG. 1.
Figure 3:
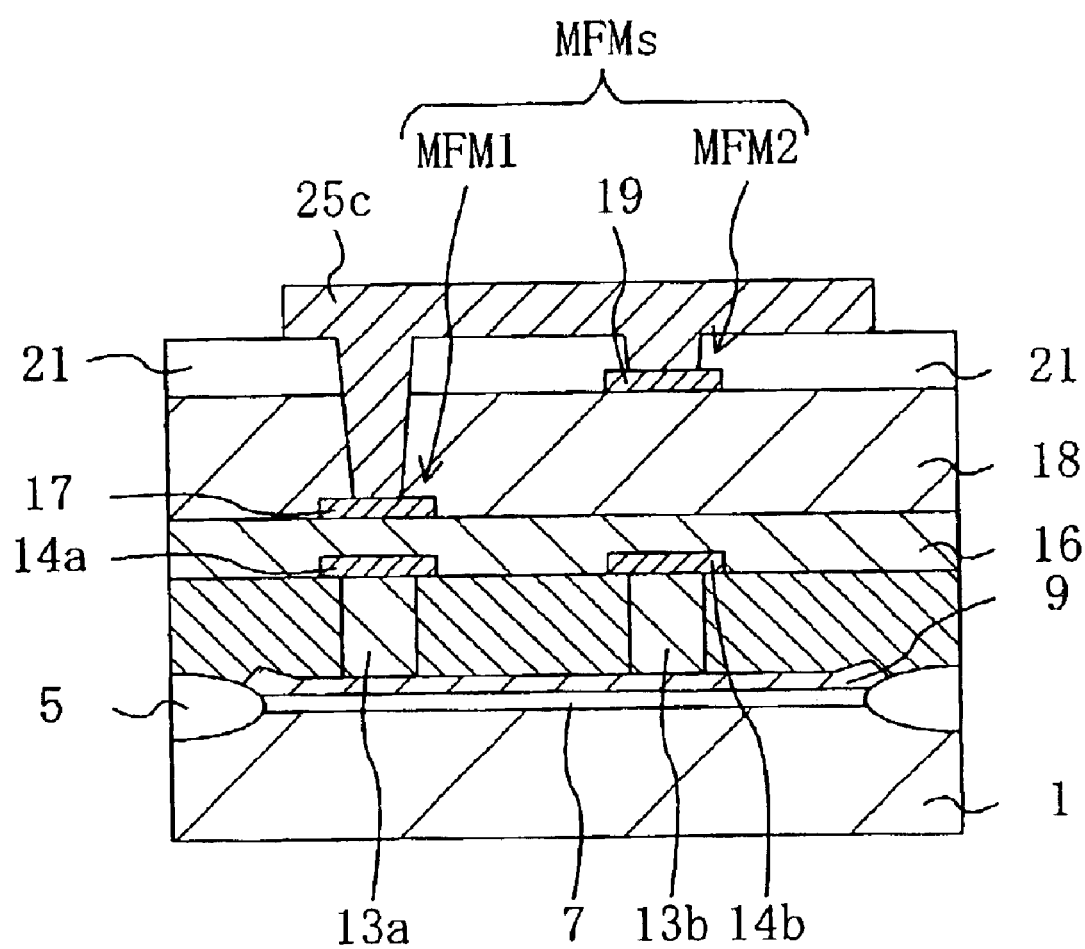
FIG. 3 is a cross-sectional view of the multilevel memory of the first embodiment, taken along the line III—III in FIG. 1.

FIG. 1 is a top plan view of a multilevel memory according to the first embodiment of the present invention. FIG. 2 is a cross-sectional view taken along the line II—II in FIG. 1. FIG. 3 is a cross-sectional view taken along the line III—III in FIG. 1. In FIGS. 1, 2 and 3, identical components are denoted by respectively identical reference numerals. In FIG. 1, only the components located on the uppermost surface are indicated by solid lines. Some of reference numerals of the portions that are commonly shown in FIGS. 2 and 3 are omitted for better viewability.

As shown in FIG. 2, the multilevel memory of this embodiment includes: a p-type Si substrate 1; an isolation film 5 of silicon oxide formed by a LOCOS process in the Si substrate 1; a gate insulating film 7 of silicon oxide having a thickness of 3 nm and formed on an active region of the Si substrate 1 defined by the isolation film 5; a gate electrode 9 formed on the gate insulating film and made of polysilicon containing an n-type impurity; drain and source regions 3a and 3b that are formed in the Si substrate 1 to the sides of the gate electrode 9, are in contact with the isolation film 5 and contain an n-type impurity; a plug interconnect 13c connecting the drain region 3a to a pad 15a; a plug interconnect 13d connecting the source region 3b to a pad 15b; a first interlevel dielectric film 11 filling in the gap between the plug interconnects 13c and 13d; a first ferroelectric layer 16 of bismuth titanate (BIT) formed on the first interlevel dielectric film 11 and having a thickness of 100 nm; a second ferroelectric layer 18 of BIT formed on the first ferroelectric layer 16 and having a thickness of 400 nm; a second interlevel dielectric film 21 of silicon oxide formed on the second ferroelectric layer 18; an interconnect 25c formed on the second interlevel dielectric film 21; an interconnect 25a formed through the first and second ferroelectric layers 16 and 18 and the second interlevel dielectric film 21 to connect the pad 15a to the interconnect 25c; and an interconnect 25b connected to the pad 15b through the first and second ferroelectric layers 16 and 18 and the second interlevel dielectric film 21. In this embodiment, the gate length of the gate electrode 9 is 0.5 μm and the gate width thereof is 5 μm.

As shown in FIG. 3, the multilevel memory of this embodiment includes: the p-type Si substrate 1; the isolation film 5 made of a silicon oxide film formed by a LOCOS process in the Si substrate 1; the gate insulating film 7 of silicon oxide having a thickness of 3 nm and formed on the active region of the Si substrate 1 defined by the isolation film 5; the gate electrode 9 formed on the gate insulating film 7 and made of polysilicon containing an n-type impurity; the first interlevel dielectric film 11 of silicon oxide formed on the gate electrode 9 and the isolation film 5; a first intermediate electrode 14a of Pt/TiN formed on the first interlevel dielectric film 11 and having a size of 0.5 μm×0.5 μm; a second intermediate electrode 14b of Pt/TiN formed on the first interlevel dielectric film 11 and having a size of 0.5 μm×0.5 μm; a plug interconnect 13a formed through the first interlevel dielectric film 11 to connect the gate electrode 9 to the first intermediate electrode 14a; a plug interconnect 13b formed through the first interlevel dielectric film 11 to connect the gate electrode 9 to the second intermediate electrode 14b; the first ferroelectric layer 16 of BIT formed on the first interlevel dielectric film 11 and the first and second intermediate electrodes 14a and 14b and having a thickness of 100 nm; a first upper electrode 17 of Pt/TiN that is formed on the first ferroelectric layer 16, is in parallel with the first intermediate electrode 14a to face the first intermediate electrode 14a, and has a size of 0.5 μm×0.5 μm; the second ferroelectric layer 18 of BIT formed on the first ferroelectric layer 16 and having a thickness of 400 nm; a second upper electrode 19 of Pt/TiN that is formed on the second ferroelectric layer 18, is in parallel with the second intermediate electrode 14b to face the second intermediate electrode 14b, and has a size of 0.5 μm×0.5 μm; the second interlevel dielectric film 21 of silicon oxide formed on the second ferroelectric layer 18; and the interconnect 25c, which penetrates through the second ferroelectric layer 18 and the second interlevel dielectric film 21 to connect with the first upper electrode 17 and penetrates through the second interlevel dielectric film 21 to connect with the second upper electrode 19 by way of the upper face of the second interlevel dielectric film 21.

A ferroelectric capacitor made up of a part of the first ferroelectric layer 16 and the first intermediate electrode 14a and the first upper electrode 17, between which the first ferroelectric layer 16 is sandwiched, is herein referred to as a capacitor MFM1. A ferroelectric capacitor made up of a part of the first and second ferroelectric layers 16 and 18, the second intermediate electrode 14b and the second upper electrode 19, between which the first and second ferroelectric layers 16 and 18 are sandwiched, is herein referred to as a capacitor MFM2. The capacitors MFM1 and MFM2 together form a capacitor MFMs.

Figure 5:
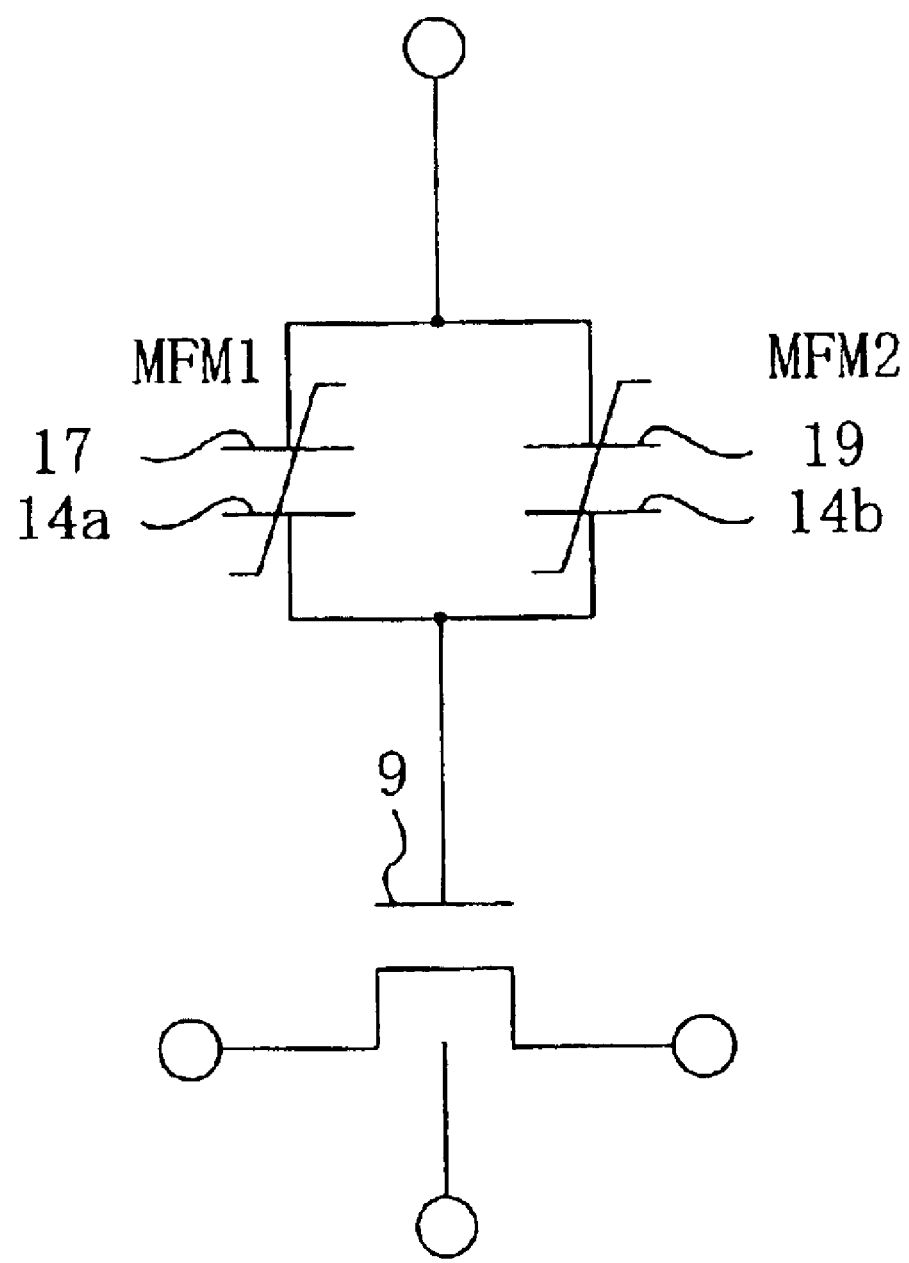
FIG. 5 is an equivalent circuit diagram showing the multilevel memory of the first embodiment.

FIG. 5 is an equivalent circuit diagram showing the multilevel memory of this embodiment.

As shown in FIG. 5, the multilevel memory of this embodiment has a structure in which the two ferroelectric capacitors are disposed in parallel and connected to each other above the gate electrode of the MOS transistor. In FIG. 5, the ferroelectric layer of the capacitor MFM1 has a thickness of 100 nm and the electrode thereof has a size of 0.5 μm ×0.5 μm. The ferroelectric layers of the capacitor MFM2 have a thickness of 500 nm and the electrode thereof has a size of 0.5 μm×0.5 μm.

FIGS. 4A through 4E are cross-sectional views showing respective process steps for fabricating the multilevel memory of this embodiment. The cross-sectional views in FIGS. 4A through 4E are taken along the line III—III in FIG. 1. Hereinafter, a method for fabricating the multilevel memory of this embodiment will be described with reference to FIGS. 4A through 4E.

Figure 4:
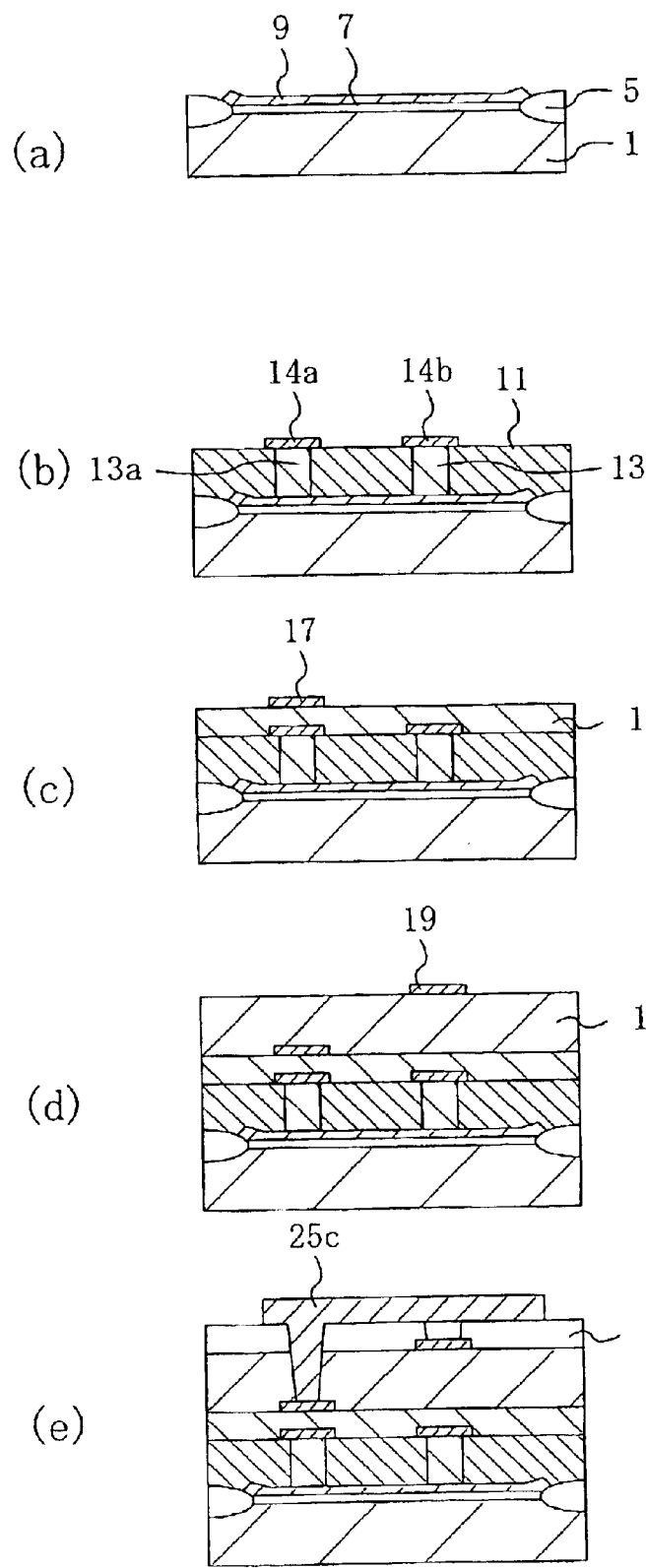
FIGS. 4A through 4E are cross-sectional views showing respective process steps for fabricating the multilevel memory of the first embodiment.

First, in a process step shown in FIG. 4A, a p-type Si substrate 1 is subjected to oxidation using silicon nitride (not shown) as a mask through a LOCOS process, thereby forming an isolation film 5. Thereafter, the silicon nitride (not shown) is dissolved by heated phosphoric acid, for example. Then, the Si substrate 1 is thermally oxidized at 900° C., for example, thereby forming a silicon oxide film with a thickness of 3 nm on the Si substrate 1. This silicon oxide film is a gate insulating film 7. Then, polycrystalline silicon doped with phosphorus is deposited by a LPCVD process to form a gate electrode 9. Subsequently, the gate electrode 9 and the gate insulating film 7 are patterned through dry etching. Boron ions are then implanted into portions on the sides of the gate electrode 9 using the gate electrode 9 as a mask, and then heat treatment is performed at 900° C. for 30 minutes, thereby forming drain and source regions 3a and 3b shown in FIG. 2. The MOS transistor fabricated in this process step has a gate length of 0.5 μm and a gate width of 5 μm.

Next, in a process step shown in FIG. 4B, silicon dioxide ($SiO_2$) is deposited over the substrate by an LPCVD process, thereby forming a first interlevel dielectric film 11. Then, dry etching is performed using a resist mask formed on the first interlevel dielectric film 11 so that contact holes are formed, and thereafter, polysilicon is deposited by an LPCVD process in the contact holes. Subsequently, the polysilicon is planarized by a CMP process, thereby forming plug interconnects 13a, 13b, 13c and 13d. Then, after titanium nitride has been deposited by a sputtering process to a thickness of 20 nm over the first interlevel dielectric film 11, a Pt layer is deposited by a sputtering process to a thickness of 50 nm. Subsequently, silicon oxide that has been deposited by a sputtering process over the Pt layer is patterned to form a hard mask (not shown). The Pt/TiN layer is patterned by Ar milling using the hard mask as a mask, thereby forming first and second intermediate electrodes 14a and 14b and pads 15a and 15b shown in FIG. 2. Thereafter, the hard mask made of silicon oxide, for example, is removed by diluted hydrofluoric acid or the like.

Then, in a process step shown in FIG. 4C, BIT is deposited by a sputtering process to a thickness of 100 nm over the substrate under conditions that the substrate temperature is 550° C., the partial pressure of oxygen is 20% and the RF power is 100 W, thereby forming a first ferroelectric layer 16. Then, a Pt layer is deposited by a sputtering process and then is patterned by Ar milling using a hard mask of silicon oxide (not shown), thereby forming a first upper electrode 17. Thereafter, the hard mask of silicon oxide (not shown) is removed by diluted hydrofluoric acid or the like. In this embodiment, each of the first intermediate electrode 14a and the first upper electrode 17 has a size of 0.5 μm×0.5 μm.

Then, in a process step shown in FIG. 4D, BIT is deposited by a sputtering process to a thickness of 400 nm over the substrate under conditions that the substrate temperature is 550° C., the partial pressure of oxygen is 20% and the RF power is 100 W, thereby forming a second ferroelectric layer 18. Then, a Pt layer is deposited by a sputtering process over the second ferroelectric layer 18 and then is patterned by Ar milling using a hard mask of silicon oxide (not shown), thereby forming a second upper electrode 19. Thereafter, the hard mask (not shown) is removed by diluted hydrofluoric acid or the like. In this embodiment, each of the second intermediate electrode 14b and the second upper electrode 19 has a size of 0.5 μm×0.5 μm.

Then, in a process step shown in FIG. 4E, a silicon oxide film is deposited over the substrate by plasma CVD using TEOS, and then is planarized by a CMP process, thereby forming a second interlevel dielectric film 21. Thereafter, the second interlevel dielectric film 21 is dry-etched using a resist mask formed on the second interlevel dielectric film so that a contact hole reaching the second upper electrode 19 is formed. On the other hand, the second interlevel dielectric film 21 and the second ferroelectric layer 18 are dry-etched using a resist mask formed on the second interlevel dielectric film so that a contact hole reaching the first upper electrode 17 is formed. If the etching selectivity of the second ferroelectric layer 18 to the upper electrode 19 is sufficiently high, the contact hole reaching the second upper electrode 19 and the contact hole reaching the first upper electrode 17 can be formed simultaneously. Then, an AlSiCu alloy is deposited by a sputtering process in the contact holes and then is dry-etched, thereby forming interconnects 25a, 25b and 25c, respectively.

In this manner, the multilevel memory of this embodiment is fabricated.

Figure 6:
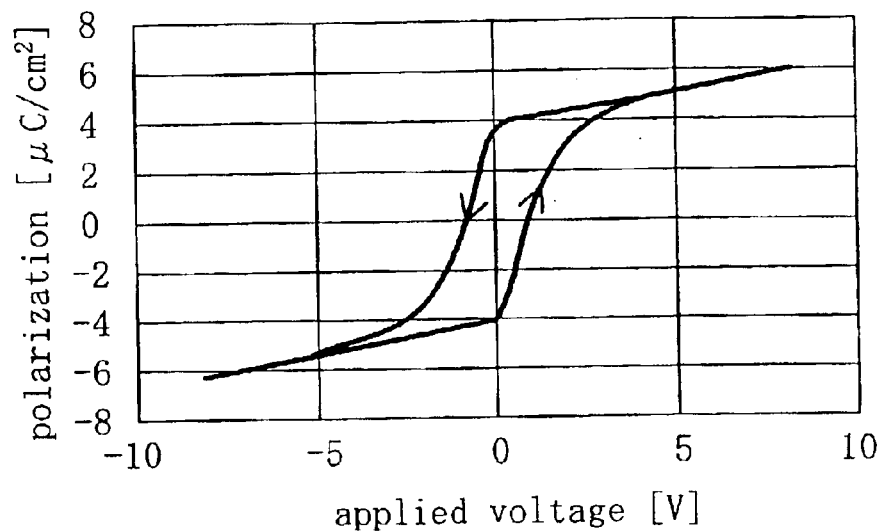
FIG. 6 is a graph showing a polarization-voltage hysteresis characteristic (P-V characteristic) of a capacitor MFM1.

FIG. 6 is a graph showing a polarization-voltage hysteresis characteristic (P-V characteristic) of the capacitor MFM1. FIG. 6 shows a hysteresis characteristic when only the capacitor MFM1 is connected to a power source.

Referring to FIG. 6, it is found that since the thickness of the capacitor MFM1 is as small as about 100 nm, the coercive voltage thereof is low, while the polarization value at a voltage of 0 V after the application of a voltage of about 5V or higher (i.e., remanent polarization) is about 4 $\mu C/cm^2$, reflecting properties of the BIT material.

Figure 7:
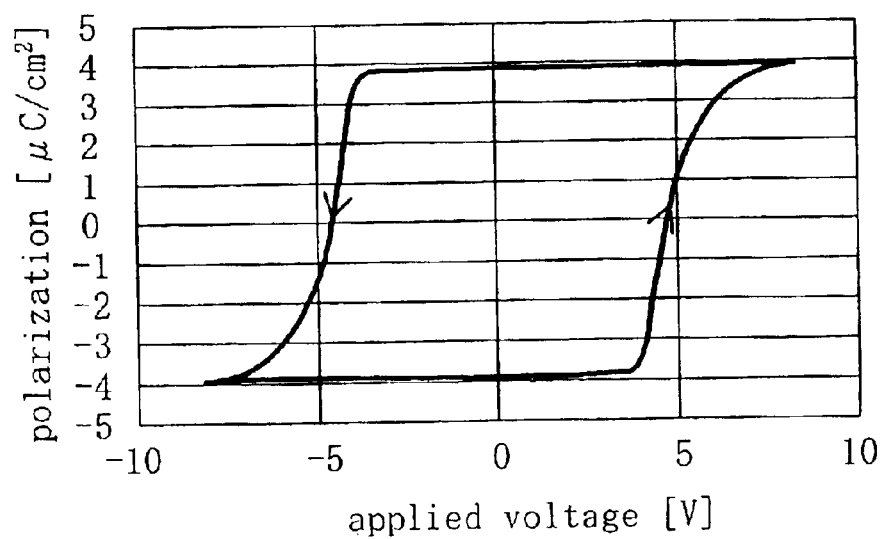
FIG. 7 is a graph showing a P-V characteristic of a capacitor MFM2.

FIG. 7 is a graph showing a P-V characteristic of the capacitor MFM2. Though the capacitor MFM2 is made of the same ferroelectric material, i.e., BIT, as that of the capacitor MFM1, the thickness of the capacitor MFM2 is as thick as 500 nm in total. Therefore, the coercive voltage thereof is about five times higher than that of the capacitor MFM1 as shown in FIG. 7. However, since remanent polarization values are determined by the material, the remanent polarization value of the capacitor MFM2 is about 4 $\mu C/cm^2$, which is substantially equal to that of the capacitor MFM1.

A method for driving the multilevel memory of this embodiment with the structure in which two ferroelectric capacitors having mutually different hysteresis characteristics are connected in parallel as described above, and operation of the multilevel memory will be described with reference to FIGS. 8 through 10.

Figure 10:
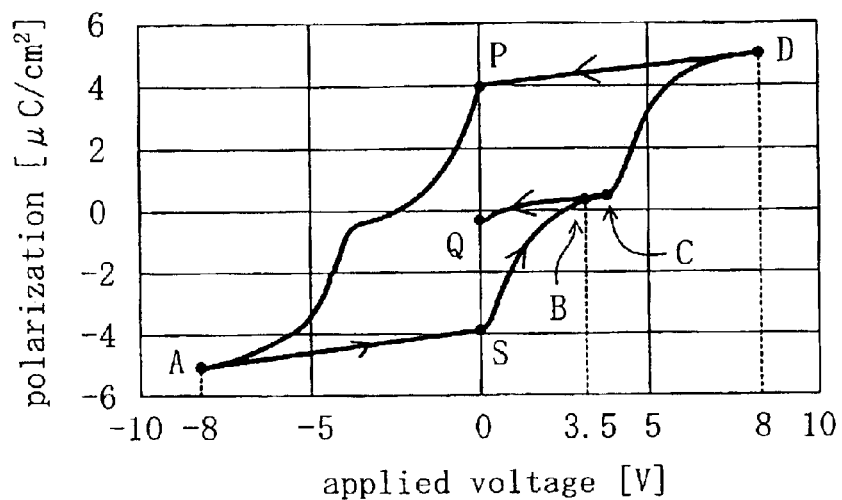
FIG. 10 is a graph showing a voltage applied between an upper gate electrode and a lower electrode and the effective polarizations of ferroelectric capacitors in the multilevel memory of the first embodiment.

FIG. 10 is a graph showing a voltage applied between the upper gate electrode and the lower electrode and the effective polarizations of the two ferroelectric capacitors in the multilevel memory of this embodiment. As shown in FIG. 10, since the capacitors used in the multilevel memory of this embodiment are connected to each other in parallel, the polarization of the whole of the capacitors has an average value corresponding exactly to the ratio between areas for the polarizations of the capacitors MFM1 and MFM2.

Figure 8:
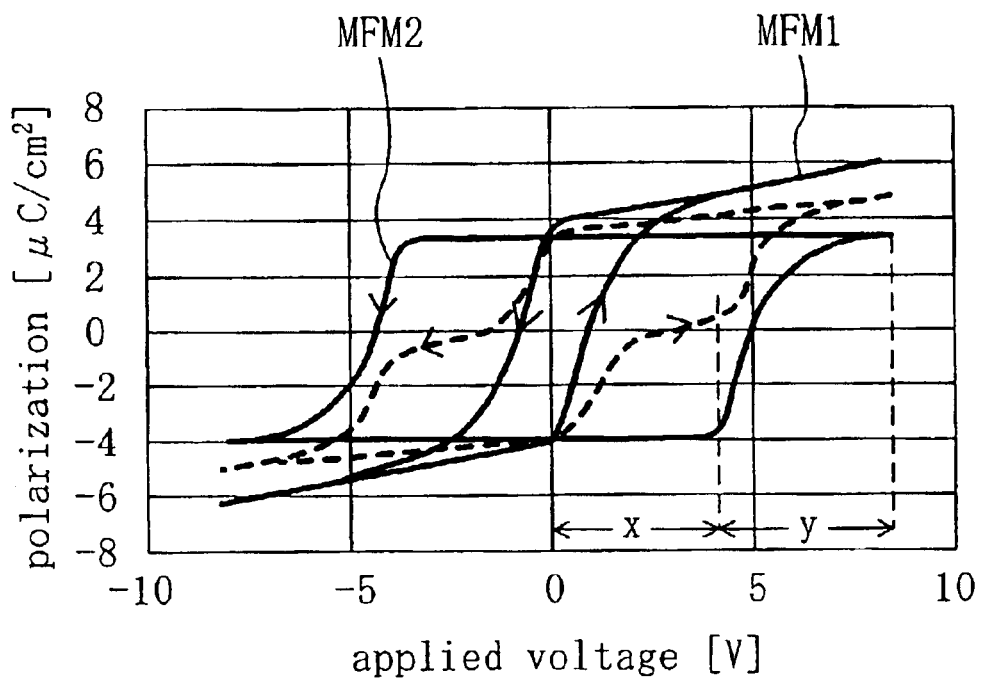
FIG. 8 is a graph showing the P-V characteristics of the capacitors MFM1 and MFM2 and a P-V characteristic of the whole of the capacitors.

FIG. 8 is a graph for describing hysteresis characteristics of polarization in the whole of the capacitors (i.e., the capacitor MFMs) made up of the capacitors MFM1 and MFM2 connected in parallel. In FIG. 8, the average value of the polarizations of the two capacitors indicated by broken lines determines the polarization of the capacitor MFMs. That is to say, the polarization of the capacitor MFMs exhibits the hysteresis characteristics shown in FIG. 10.

In a range x shown in FIG. 8, the polarization of the capacitor MFM2 hardly varies with the change in the voltage V. On the other hand, the polarization of the capacitor MFM1 increases abruptly in the first half of the range x and varies slightly in the latter half, with the change in the voltage V. As a result, the synthesized value of these polarizations changes abruptly in the first half of the range x and varies gently in the latter half of the range x. On the other hand, in a range y, the polarization of the capacitor MFM2 changes abruptly with the change in the voltage V, while the polarization of the capacitor MFM1 hardly varies with the change in the voltage V. As a result, the synthesized value of these polarizations changes abruptly in the first half of the range y but more gently than the polarization value of the capacitor MFM2 alone.

The multilevel memory of this embodiment includes the two ferroelectric capacitors having mutually different coercive voltages as described above. Thus, unlike the general hysteresis loops as shown in FIG. 6, the hysteresis loop of the multilevel memory of this embodiment has a metastable point as indicated by a point C in FIG. 10. Therefore, the polarization changes gently with the change in voltage in the vicinity of 4 V of a write voltage. As a result, even if the write voltage is swung by noise, for example, the change in polarization can be suppressed.

To achieve this effect, ranges in which hysteresis loops exhibit abrupt changes in polarizations with the change in voltage should not coincide with each other. Thus, the coercive voltages of the capacitors are required to differ from each other. In particular, in the first half stage of the range in which the polarization are from zero to saturation, if two dielectric materials exhibiting mutually different rates of changes in polarizations with the change in voltage are used, a metastable point can be created as intended. In the same manner, in the case where three or more capacitors are arranged in parallel, the difference between the coercive voltages of the capacitors is also required to differ sufficiently.

Figure 9:
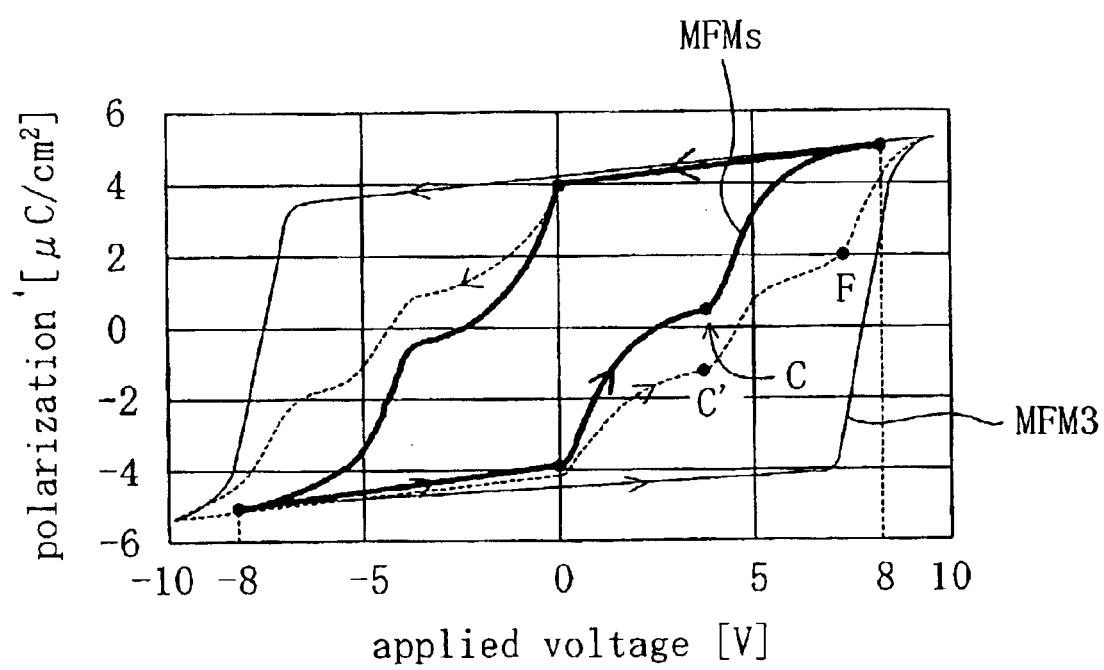
FIG. 9 is a graph showing a P-V characteristic of the whole of three capacitors.

FIG. 9 is a graph showing a P-V characteristic of capacitors in the case where a capacitor MFM3 having the same area as that of the capacitor MFM1 or MFM2 is added to the capacitors MFM1 and MFM2. The P-V characteristic of the whole of the capacitors is indicated by broken lines in FIG. 9. As in the case where two capacitors are provided, the coercive voltages of the capacitors are mutually different from each other. Thus, a metastable point F is additionally created on the hysteresis loop. In this case, the point C shifts to the point C'. In this manner, information can be stored with stability using at least four levels.

Next, a method for conducting a multilevel operation of the ferroelectric capacitors arranged in parallel in this embodiment will be described.

First, in FIG. 10, the line connecting points A, S, C, D and P indicates the polarization of the capacitors upon the application of respective voltages. When the applied voltage is increased from −8 V, the polarization of the capacitors shifts from the point A to the point S and then to the point C along the direction shown by the allows. When a voltage of 8 V is applied, the polarization of the capacitors is saturated and does not increase, so that the polarization state remains at the point D even upon the application of higher voltages. When the voltage applied to the capacitors is once increased to 8 V and then is decreased, the polarization state of the capacitors approaches the point A by way of the point P. When the applied voltage is −8 V, the polarization state returns to the point A.

Hereinafter, respective states of the capacitors MFM1 and MFM2 will be described. At the point A at which a voltage of −8 V is applied to the capacitors, the polarizations of the capacitors MFM1 and MFM2 are saturated, being negatively charged, as shown in FIGS. 6 and 7. In this state, when the voltage applied to the capacitors is removed, the applied voltage becomes 0 V so that the polarizations state is at the point S. Since the capacitors MFM1 and MFM2 have the same size, the polarization of the capacitor MFMs takes the average value of the capacitors MFM1 and MFM2 shown in FIGS. 6 and 7 (see FIG. 8).

Next, when the applied voltage at the point S is increased to about 4V, the polarization of the capacitor MFM1 is saturated, being positively charged, while the polarization of the capacitor MFM2 is positively charged but is not saturated. The polarizations of the two capacitors are averaged at the point C, which is a metastate point. FIG. 10 shows that a voltage of 3.5 V is applied to the capacitors in consideration of a noise margin, so that the polarization state is at the point B. Then, the applied voltage is removed, so that the state indicated by the point Q at which the polarization is substantially 0 $\mu C/cm^2$ is created.

Then, when the voltage applied to the capacitors is increased to 8 V, the polarization state of the capacitors is at the point D at which polarizations of the capacitors MFM1 and MFM2 are both saturated with a positive charge. Thereafter, the voltage is removed, so that the polarization state of the capacitors is at the point P.

Then, the voltage applied to the capacitors is decreased to −8 V, so that the polarization state of the capacitors returns to the point A.

In this manner, by applying three levels of write voltages such as −8 V, 3.5 V and 8V, the multilevel memory of this embodiment can perform a stable storing operation toward noise, for example.

Figure 11:
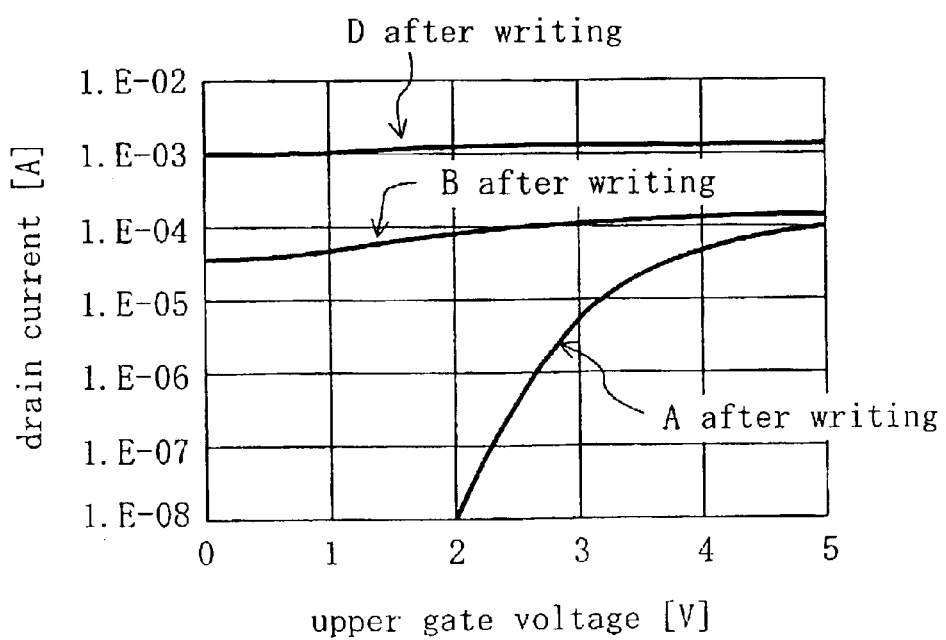
FIG. 11 is a graph showing a gate voltage-drain current characteristic with respect to respective write voltages in the multilevel of the first embodiment.

FIG. 11 is a graph showing a drain current in the case where a gate voltage, which is a read voltage, is changed after write operations at voltages of +8 V, +3.5 V and −8 V, respectively, have been performed in the multilevel memory of this embodiment.

As shown in FIG. 11, in the read voltage range of 2 V to 3 V, values of a current flowing into drain in the respective polarization states may differ by one or more orders of magnitude, and stored information can be read out with stability.

Next, a write operation at a point on a hysteresis loop at which the write operation is likely to be unstable will be described, with the case where a write voltage of half of the saturation voltage swings 10% taken as an example.

Figure 12:
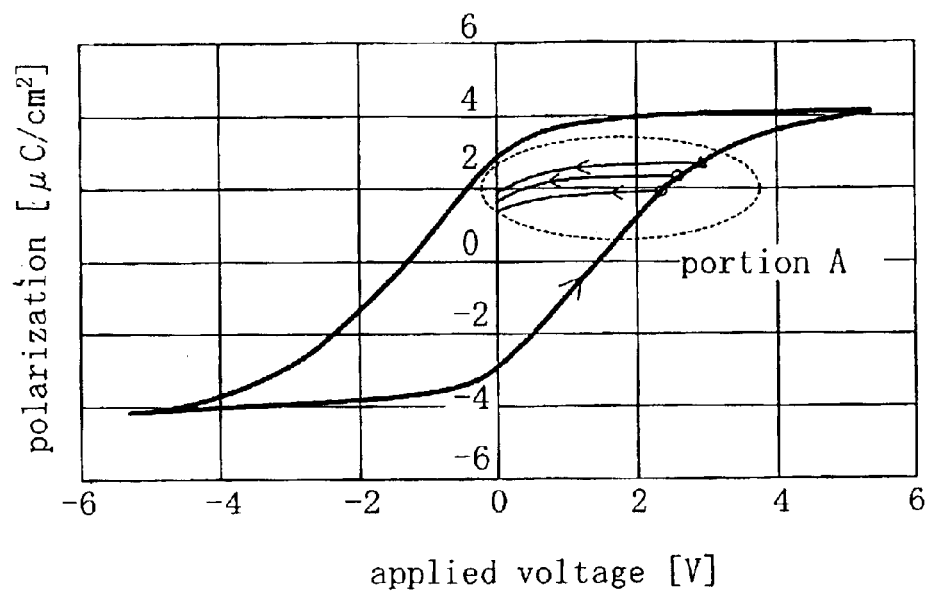
FIG. 12 is a graph for describing a correlation between swings in write voltage and shifts in polarization value in a known multilevel memory.

FIG. 12 is a graph for describing how much the polarization value shifts when a write voltage swings 10% in the known multilevel memory provided with a single ferroelectric capacitor.

Figure 13:
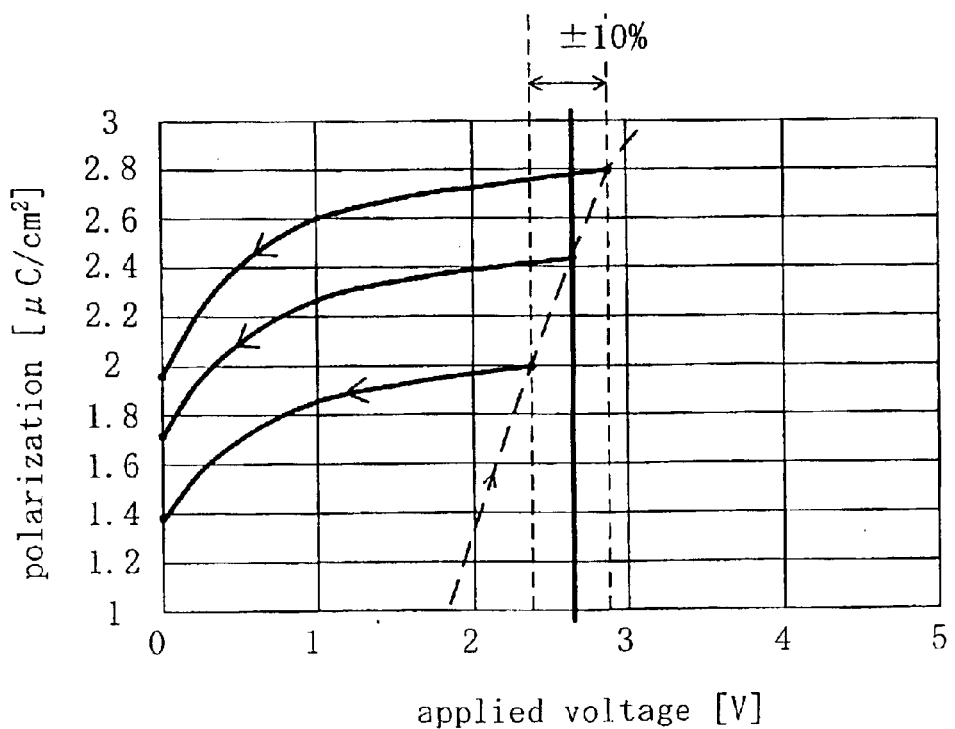
FIG. 13 is a graph showing a portion A in FIG. 12 under magnification for the known multilevel memory.

FIG. 13 is a graph showing a portion A in FIG. 12 under magnification.

As can be understood from FIGS. 12 and 13, the known technique has no other choice but to use a portion in the hysteresis loop where the polarization changes abruptly in order to obtain a polarization state at a point on the hysteresis loop, and therefore the polarization value shifts greatly between 1.4 $\mu C/cm^2$ and 2.0 $\mu C/cm^2$, which is originally expected to be 1.7 $\mu C/cm^2$, with respect to the shifts of 10% (see FIG. 13).

Figure 14:
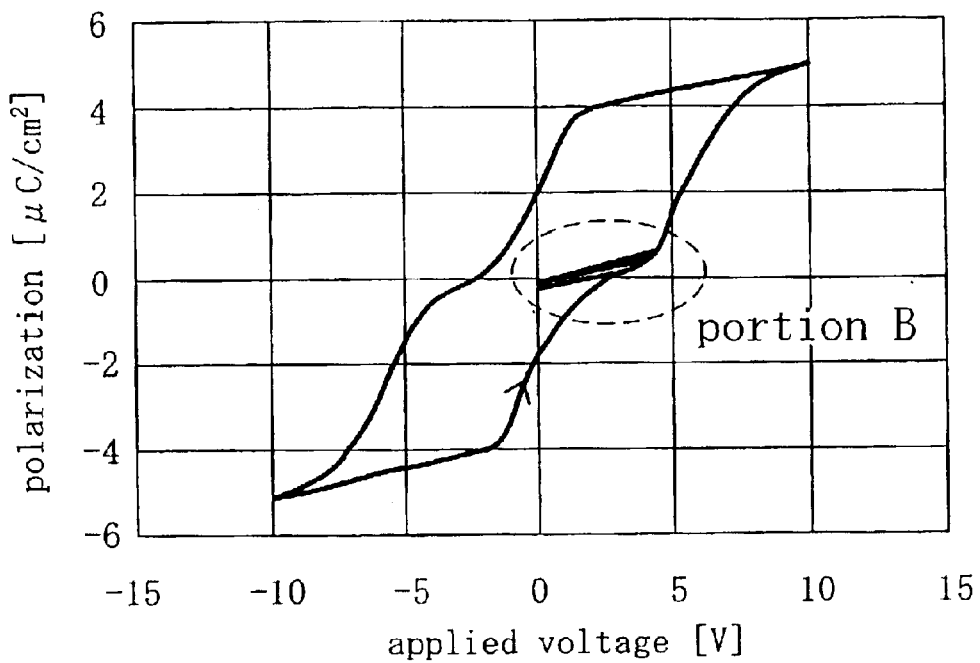
FIG. 14 is a graph for describing a correlation between swings in write voltage and shifts in polarization value in the multilevel memory of the first embodiment.
Figure 15:
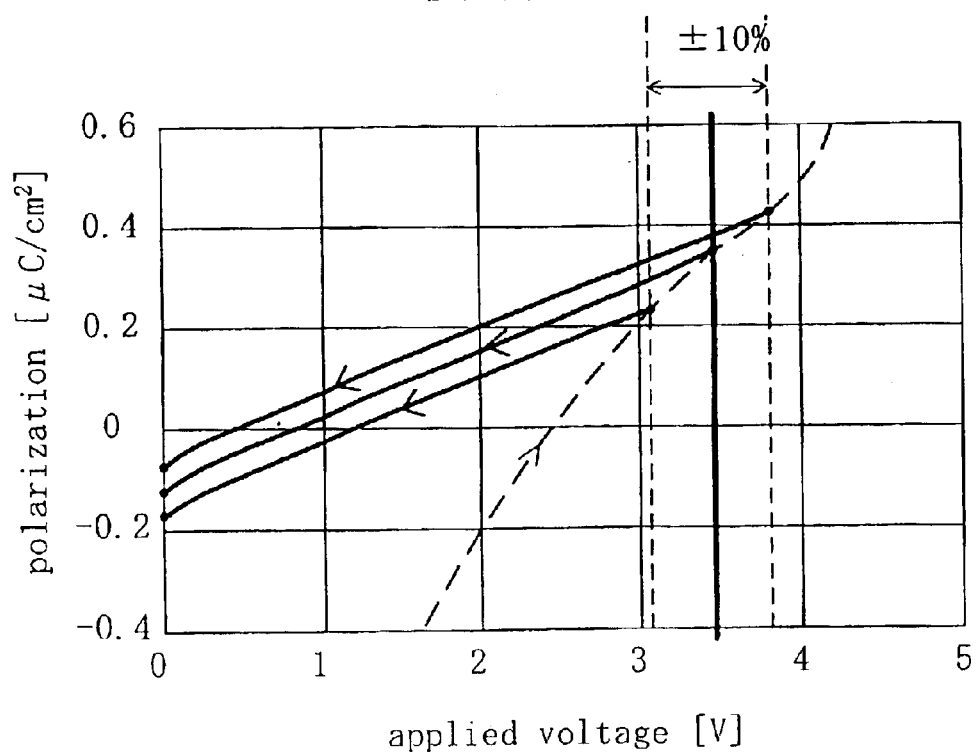
FIG. 15 shows a portion B in FIG. 14 under magnification of the multilevel memory of the first embodiment.

FIG. 14 is a graph for describing shifts in the polarization when a write voltage swings in the multilevel memory of this embodiment, as in FIGS. 12 and 13. FIG. 15 shows a portion B in FIG. 14 under magnification.

As can be understood from FIGS. 14 and 15, abrupt change in polarization with the swings in the write voltage is greatly improved in the multilevel memory of this embodiment as compared to the known technique. For example, the polarization value shifts in the range of −0.1 $\mu C/cm^2$ to −0.2 $\mu C/cm^2$, both inclusive, which is originally expected to be −0.15 $\mu C/cm^2$, with respect to voltage swings of ±10%. That is to say, the range of the shift in polarization value is considerably improved to be 0.1 $\mu C/cm^2$ or less, as compared to the known technique in which the range of the shift in polarization value is 0.6 $\mu C/cm^2$. This is because the ferroelectric capacitors are connected in parallel and the respective coercive voltages are made different from one another, resulting in creating a metastable point on the hysteresis loop.

Swings in a write voltage (electric field strength in writing) may be caused by variations such as variation in thickness of a ferroelectric layer and variation in dielectric constant due to the difference in crystallinity of the ferroelectric layer as well as noise. The write voltage swings of ±10% possibly occur in practical application.

Accordingly, the structure of the multilevel memory of this embodiment can enlarge a margin in a process by suppressing the shift in polarization value, and therefore is useful for actual device fabrication.

Figure 16:
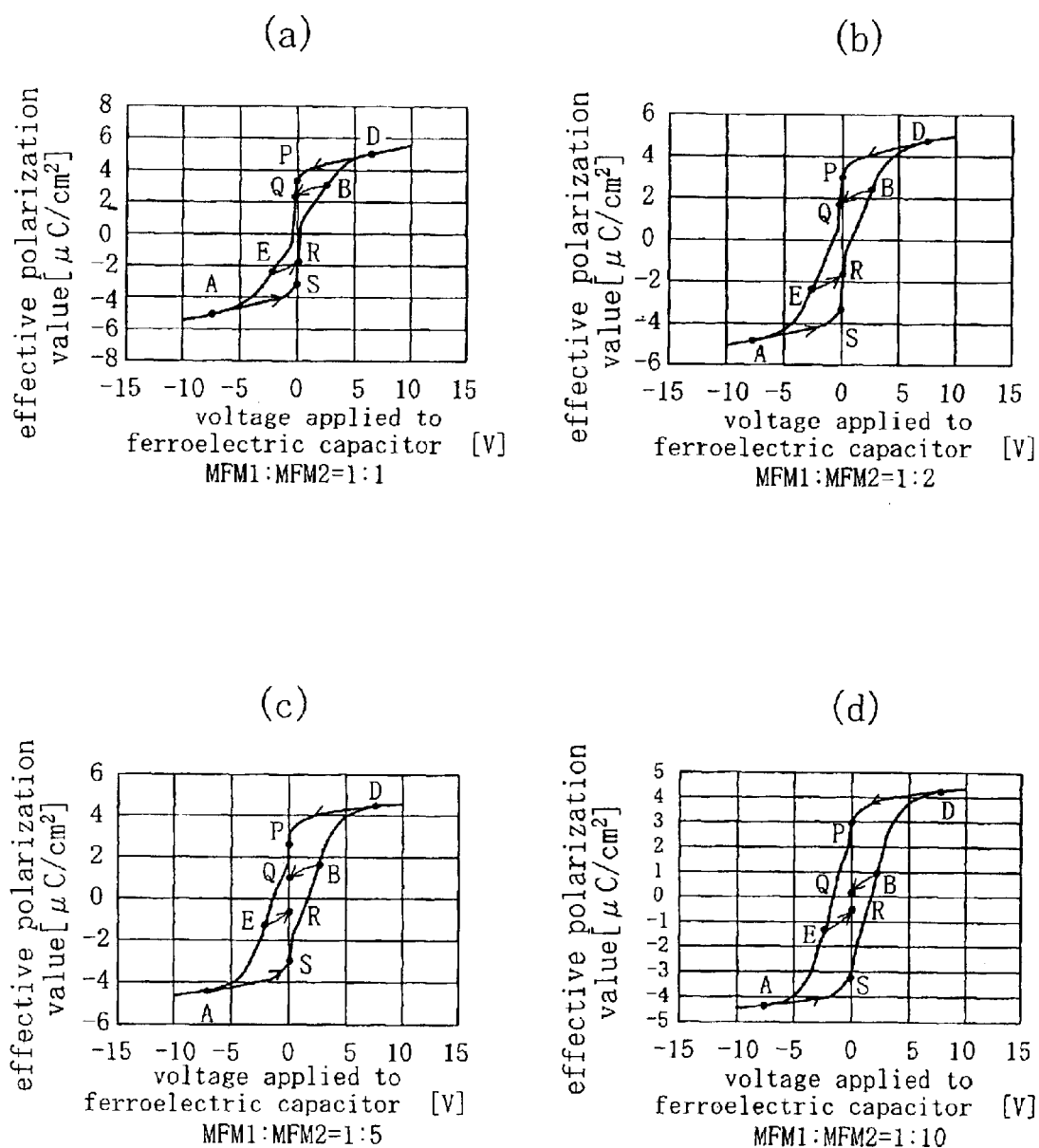
FIGS. 16A through 16D are graphs showing effective polarization values when the area of the capacitor MFM2 is changed with respect to the capacitor MFM1 in the multilevel memory of the present invention.
Figure 17:
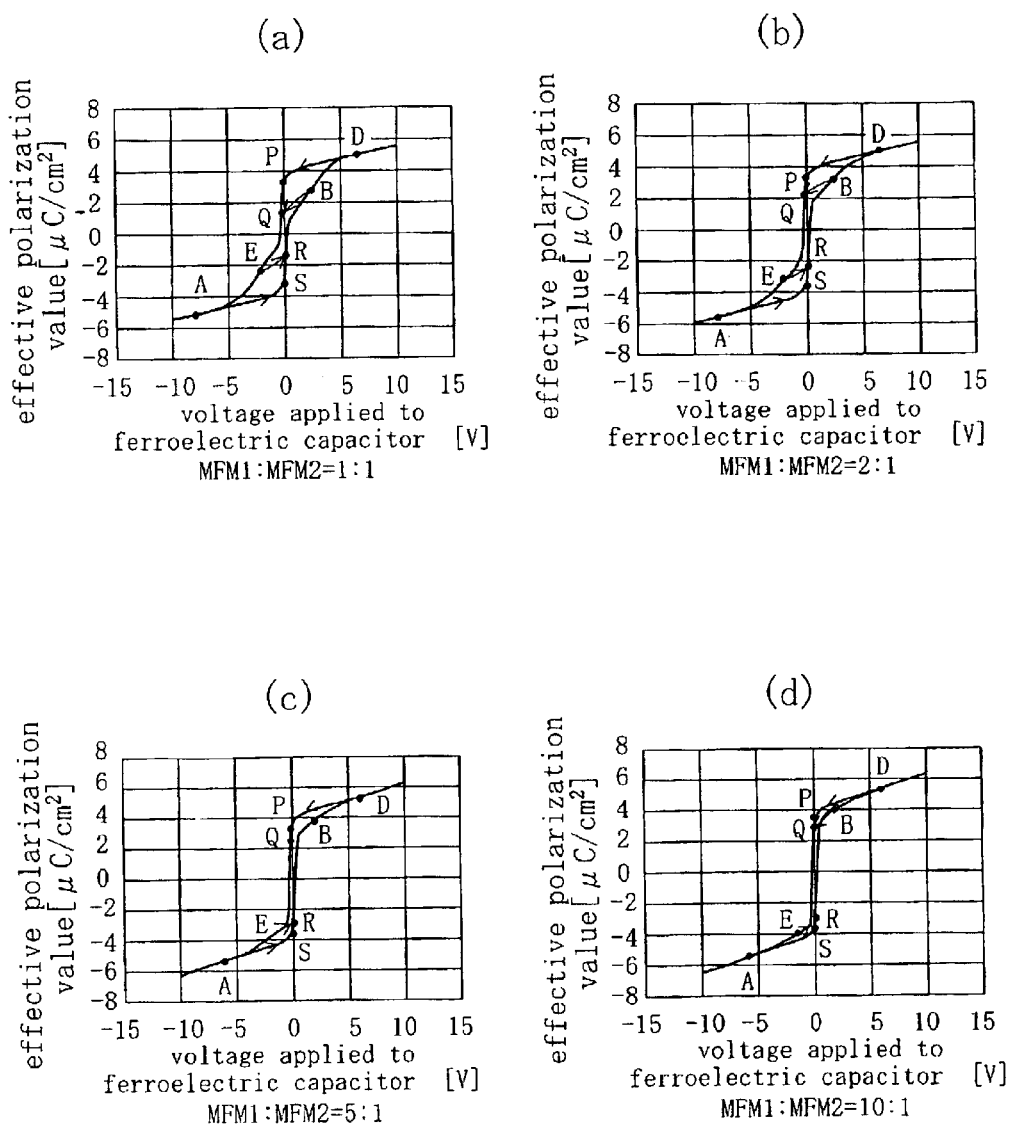
FIGS. 17A through 17D are graphs showing effective polarization values when the area of the capacitor MFM1 is changed with respect to the capacitor MFM2 in the multilevel memory of the present invention.

FIGS. 16 and 17 are graphs showing effective polarization values when the ratio between the areas of the capacitors MFM1 and MFM2 is changed in the case where the ferroelectric film of the capacitor MFM1 has a thickness of 100 nm and the ferroelectric film of the capacitor MFM2 has a thickness of 1000 nm. At points D, A, B and E in FIGS. 16A through 16D and FIGS. 17A through 17D, voltages are applied such that a positive-side maximum polarization, a negative-side maximum polarization, a positive-side intermediate polarization and a negative-side intermediate polarization are written, respectively. The polarization values after the removal of these voltages are indicated by points P, S, Q and R, respectively.

FIGS. 16A through 16D are graphs showing effective polarizations in the case where the area of the capacitor MFM2 is increased gradually with respect to the area of the capacitor MFM1. As shown in FIGS. 16A through 16D, as the area ratio of the capacitor MFM2 increases, the polarization changes abruptly with the voltage change in the ranges where the hysteresis loop passes through the points B and E.

On the other hand, FIGS. 17A through 17D are graphs showing effective polarizations in the case where the area ratio of the capacitor MFM1 is increased. As shown in FIGS. 17A through 17D, the polarization varies gently with the voltage change in the ranges where the hysteresis loop passes through the points B and E. This fact shows that, as for the area ratio between the capacitors MFM1 and MFM2, if the area of the capacitor MFM1 is larger than that of the capacitor MFM2, a multilevel memory which is more stable to swings in a write voltage can be implemented. However, as can be seen from FIG. 17D, if the area ratio of the capacitor MFM1 is extremely high, the points P and Q approach each other and the points S and R approach each other, resulting in that it is difficult to determine data. Accordingly, in this embodiment, even if the area ratio between the capacitors MFM1 and MFM2 (the area of the capacitor MFM1/the area of the capacitor MFM2) is set substantially in the range of 0.5 to 2, separation of stored information is maintained excellent, and a stable multilevel operation is achieved.

If the effective polarization value is not at the points Q and R, but is 0 $\mu C/cm^2$, i.e., if three states of polarizations are used, separation of stored information is maintained excellent even with the area ratio between the capacitors MFM1 and MFM2 (the area of the capacitor MFM1/the area of the capacitor MFM2) substantially in the range of 0.2 to 2.

As has been described above, according to this embodiment, if two or more ferroelectric capacitors having the same polarization direction and having mutually different coercive voltages are connected to the gate electrode of a field-effect transistor, it is possible to achieve a multilevel memory in which a drain current varies only slightly with the small variation in a write voltage.

According to this embodiment, a stable highly-integrated semiconductor memory can be provided. In addition, the memory is expected to be applied, as a nonvolatile transistor having a plurality of resistance values, to neuron elements mimicking neurons of the brain.

Figure 18:
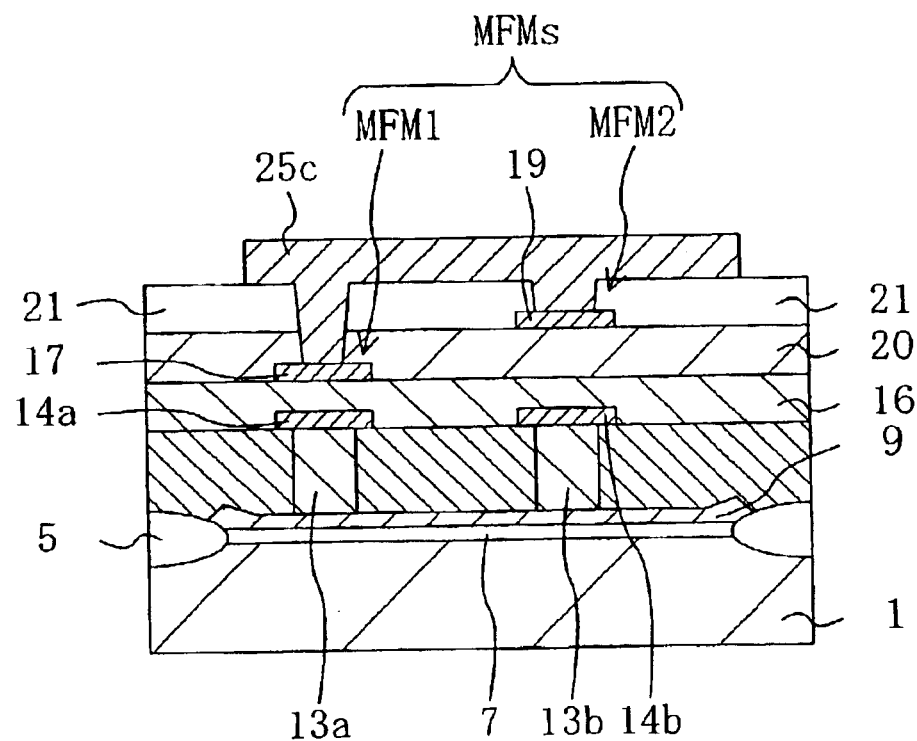
FIG. 18 is a cross-sectional view showing a modified example of the multilevel memory of the first embodiment.

FIG. 18 is a cross-sectional view showing a modified example of the multilevel memory of this embodiment. This multilevel memory has the same structure as that of the multilevel memory of this embodiment shown in FIG. 3 except for the second ferroelectric layer 18, and thus the description of the structure is herein omitted.

The multilevel memory of this modified example includes a paraelectric instead of the second ferroelectric layer 18 used in the multilevel memory of this embodiment shown in FIG. 3.

For example, in this modified example of this embodiment, tantalum oxide having a thickness of 100 nm and formed by a sputtering process is used as a paraelectric layer 20. The tantalum oxide layer has a relative dielectric constant of about 25 in this modified example of this embodiment. In this case, the paraelectric layer has a capacitance of about one-fourth of that of the ferroelectric layer, so that one-fifth of the voltage applied to the capacitor MFM2 is applied to the ferroelectric. Therefore, the apparent coercive voltage increases fivefold, and thus a metastable point can be created before the polarization of the whole of the capacitors is saturated.

In this embodiment, in obtaining the ferroelectric capacitors having mutually difference coercive voltages, the thicknesses of the ferroelectric layers are 100 nm and 500 nm, respectively, or 100 nm and 1000 nm, respectively. Alternatively, the thicknesses may take arbitrary values as well as the values described above. In such a case, the coercive voltages of the capacitors can be made differ from each other.

Alternatively, ferroelectrics made of different materials may be respectively applied to the ferroelectric capacitors. Then, the same effect is obtained as in the case where the thicknesses of the ferroelectric layers are made different from each other. For example, BIT used in this embodiment has a coercive force of about 20 kV/cm and PZT has a different coercive force, i.e., about 40 kV/cm. Thus, the coercive voltage of the capacitor using PZT is twice as large as that of the capacitor using BIT so long as the ferroelectric layers of the capacitors have the same thickness.

The multilevel memory of this embodiment has been described particularly in the case where two ferroelectric capacitors are provided. Alternatively, three or more ferroelectric capacitors having different coercive voltages may be connected as shown in FIG. 9. In such a case, the number of metastable points created on the hysteresys increases in the same manner, so that a ferroelectric gate memory with more levels can be implemented.

In the multilevel memory of this embodiment, the positive and negative states of the polarizations of the capacitors MFM1 and MFM2 coincide with each other. Alternatively, these capacitors may be polarized in opposite orientations.

Embodiment 2

Figure 19:
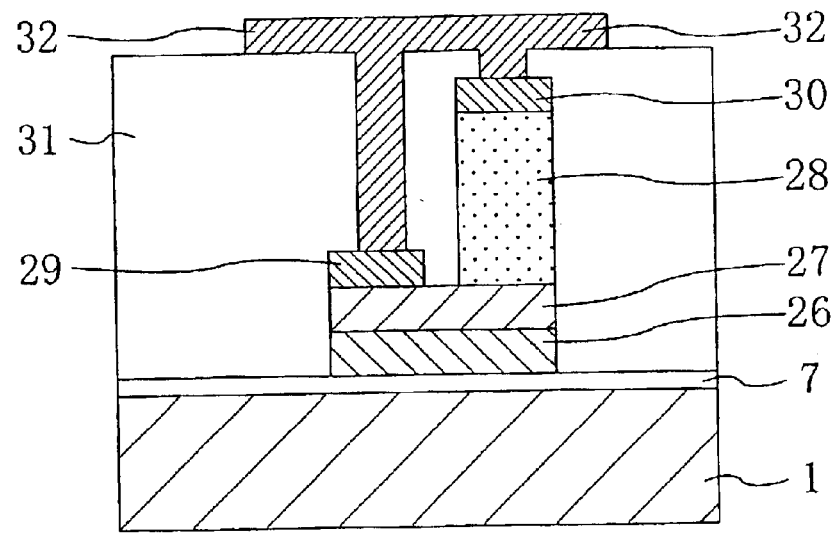
FIG. 19 is a cross-sectional view showing a structure of a multilevel memory according to a second embodiment of the present invention.

FIG. 19 is a cross-sectional view showing a structure of a multilevel memory according to a second embodiment of the present invention. As shown in FIG. 19, the multilevel memory of this embodiment includes: a p-type substrate 1; an isolation film (not shown) of silicon oxide formed in the Si substrate 1; a gate insulating film 7 of silicon oxide formed on the Si substrate 1; gate and lower electrodes 26 of Pt/TiN formed on the gate insulating film 7; a first ferroelectric layer 27 of BIT formed on the gate and lower electrodes 26 and having a thickness of 100 nm; a first upper electrode 29 which is formed on the first ferroelectric layer 27 and is not longer than half of the gate electrode in width; a second ferroelectric layer 28 of BIT which is formed on the first ferroelectric layer 27, is not longer than half of the gate electrode in width and has a thickness of 400 nm; a second upper electrode 30 formed on the second ferroelectric layer 28; an interlevel dielectric film 31 formed on the gate insulating film 7 and filling in the gap located on the sides of the gate and lower electrodes 26, first ferroelectric layer 27, first upper electrode 29, second ferroelectric layer 28, and first and second upper electrodes 29 and 30; and a plug interconnect 32 formed through the interlevel dielectric film to connect with the first and second upper electrodes 29 and 30. In this embodiment, the gate and lower electrodes 26 are formed by merging a gate electrode with a lower electrode of a capacitor.

In this embodiment, a capacitor MFM1 made up of the first upper electrode 29, the first ferroelectric layer 27 and the lower electrode 26 and a capacitor MFM2 made up of the second upper electrode 30, the second ferroelectric layer 28, the first ferroelectric layer 26 and the lower electrode 26 have mutually different coercive voltages. Thus, a metastable point is created on a hysteresis loop of the whole of the capacitors. Therefore, the multilevel memory of this embodiment achieves a stable multilevel operation exhibiting excellent separation of stored information, as the multilevel memory of the first embodiment.

In the multilevel memory of this embodiment, no intermediate electrode is needed. Therefore, the number of fabrication process steps can be reduced as compared to the multilevel memory of the first embodiment, thus reducing the fabrication cost.

A paraelectric layer may be used instead of the second ferroelectric layer 28 used in this embodiment. In such a case, the capacitors MFM1 and MFM2 also have mutually different coercive voltages.

Embodiment 3

Figure 20:
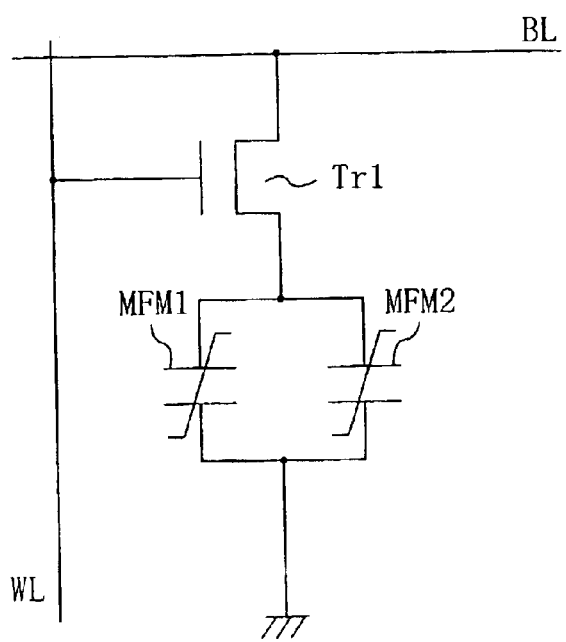
FIG. 20 is a circuit diagram schematically showing a multilevel memory according to a third embodiment of the present invention.

FIG. 20 is a circuit diagram showing a multilevel memory according to a third embodiment of the present invention. As shown in FIG. 20, the multilevel memory of this embodiment includes: a selecting transistor Tr1 whose gate is connected to a word line WL and whose drain is connected to a bit line BL; and capacitors MFM1 and MFM2 arranged in parallel and connected to source of the selecting transistor Tr and each including a ferroelectric. In the multilevel memory of this embodiment, the capacitors MFM1 and MFM2 have mutually different coercive voltages.

The multilevel memory of this embodiment is a memory called an FeRAM that reads out information depending on the amount of current flowing when the polarization of the capacitors is inverted. In this case, in the multilevel memory of this embodiment, a plurality of remanent polarization values can be obtained with stability by connecting the capacitors having mutually different coercive voltages in parallel, as described in the first and second embodiments. In the read operation of the multilevel memory of this embodiment, while a given voltage, e.g., 8V, is kept on the word line WL, the amount of current that has flowed through the selecting transistor Tr1 is determined depending on the degree of a voltage drop at the word line WL caused when the selecting transistor Tr1 is turned ON (conductive), thereby reading out information. In this case, the amount of polarization inversion varies depending on the state of the remanent polarization of the ferroelectric capacitors, so that the amount of current flowing through the transistor Tr1 varies. For example, a larger amount of current (an absolute value) is detected in the order of the points P, Q and S in FIG. 10. That is to say, a multilevel FeRAM is implementable.

This structure also achieves a stable multilevel operation with excellent separation of stored information, as in the multilevel memory of the first embodiment.

Embodiment 4

Figure 21:
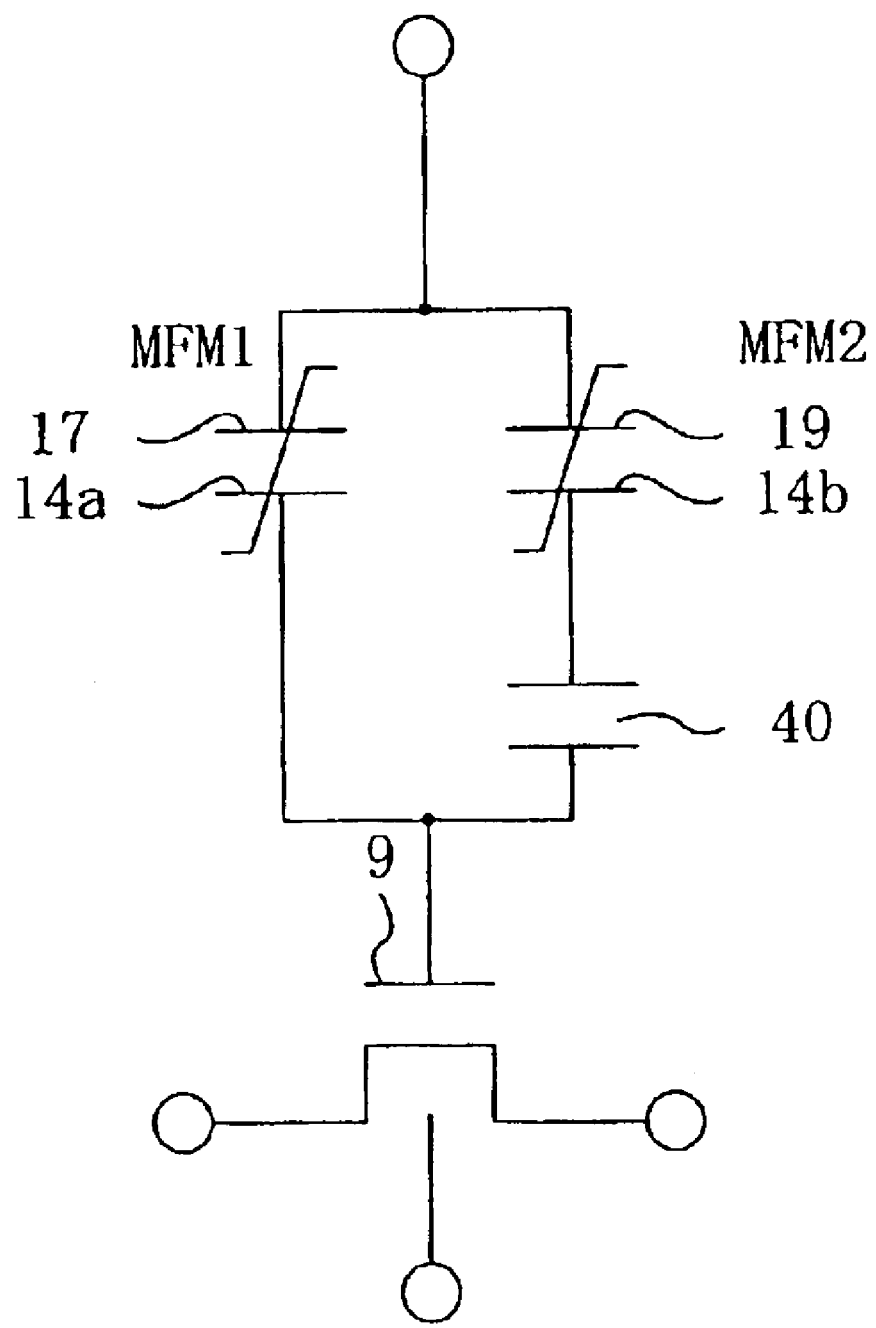
FIG. 21 is an equivalent circuit diagram showing a multilevel memory according a fourth embodiment of the present invention.

FIG. 21 is an equivalent circuit diagram showing a multilevel memory according a fourth embodiment of the present invention. The multilevel memory of this embodiment has a structure in which a capacitor 40 is interposed between the gate electrode 9 of the multilevel memory and the capacitor MFM2 of the first embodiment. Specifically, the multilevel memory of this embodiment includes: an MIS transistor; capacitors MFM1 and MFM2 arranged in parallel, connected to the gate electrode 9 of the MIS transistor and each including a ferroelectric; and the capacitor 40 interposed between the gate electrode 9 and the capacitor MFM2. In FIG. 21, components also shown in FIG. 5 are identified by the same reference numerals. The areas of the capacitors MFM1 and MFM2 and the thicknesses of the ferroelectric layers are the same as those in the first embodiment. The capacitor 40 is a capacitor including a paraelectric but may be a ferroelectric capacitor.

When a voltage is applied to the multilevel memory of the first embodiment, voltages applied to the capacitors MFM1 and MFM2 are equal to each other. On the other hand, in the multilevel memory of this embodiment, the sum of the voltages distributed to the capacitor MFM2 and the capacitor 40 is equal to the voltage distributed to the capacitor MFM1.

Therefore, in this embodiment, the voltage distributed to the capacitor MFM2 is smaller than the voltage distributed to the capacitor MFM2 in the first embodiment, upon the application of the same voltage to the multilevel memories. As a result, an apparent coercive voltage is higher than that in the first embodiment. In the multilevel memory of this embodiment, the capacitors MFM1 and MFM2 have mutually different coercive voltages, and a metastable point is created on the hysteresis loop of these capacitors. Accordingly, multilevel information can be stored in the multilevel memory of this embodiment with stability.

In addition, interposing at least one capacitor between a ferroelectric capacitor and the gate electrode of an MIS transistor allows an apparent coercive voltage to be adjusted to an arbitrary value, so that flexibility in design improves. In this embodiment, the capacitors MFM1 and MFM2 have mutually different coercive voltages. However, even if the coercive voltages of the two capacitors are equal to each other, a multilevel memory in which multilevel information is stored with stability is implementable because an apparent coercive voltage of the capacitor MFM2 is varied by interposing the capacitor 40. The multilevel memory of this embodiment is advantageous in that the ferroelectric layers of the capacitors MFM1 and MFM2 can be formed at a time.

In this embodiment, one capacitor is interposed between the capacitor MFM2 and the gate electrode 9 of the MIS transistor. Alternatively, two or more capacitors may be interposed therebetween.

Embodiment 5

Hereinafter, a semiconductor device according to a fifth embodiment of the present invention will be described with reference to the drawings.

Figure 22:
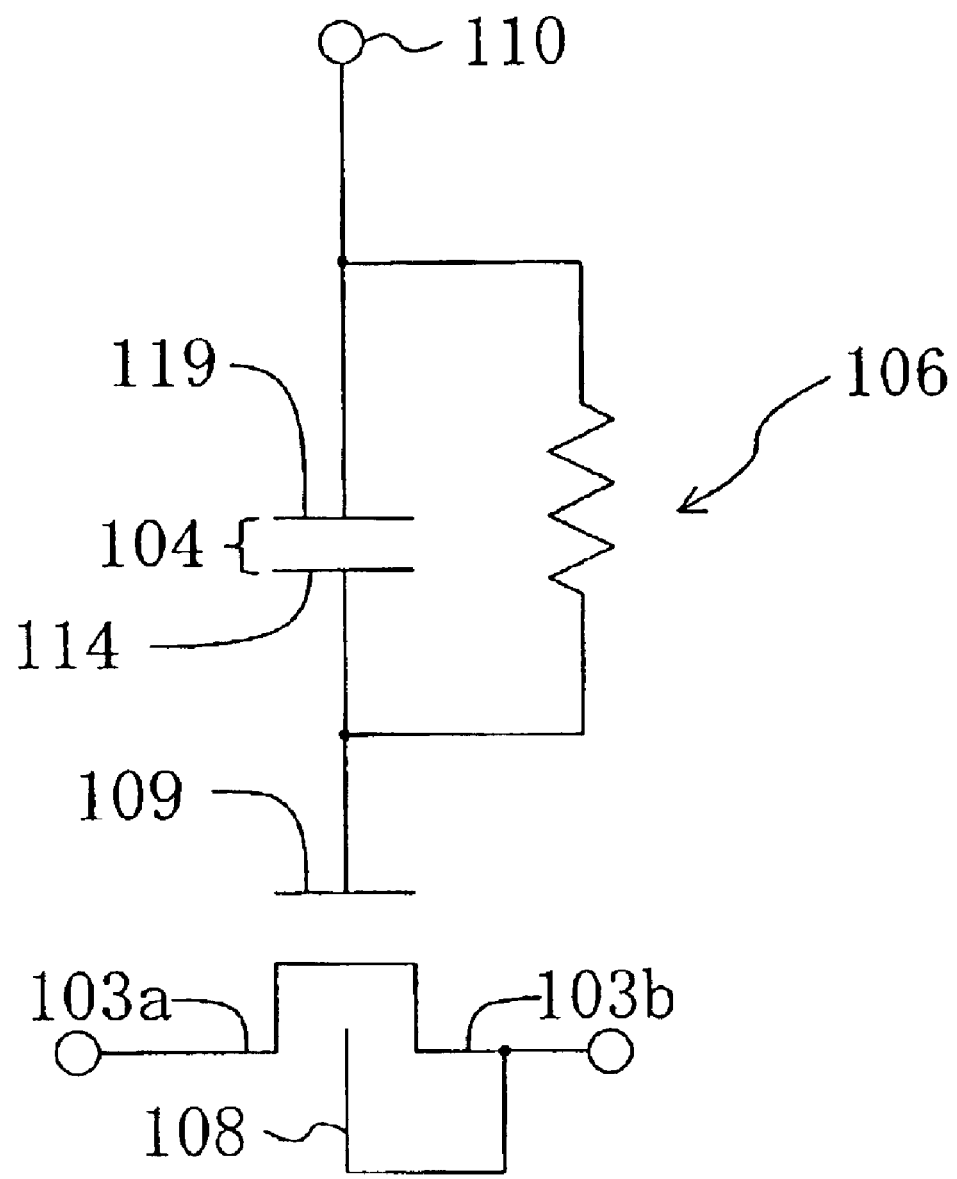
FIG. 22 is an equivalent circuit diagram showing a semiconductor device according to a fifth embodiment of the present invention.

FIG. 22 is an equivalent circuit diagram showing the semiconductor device of this embodiment. As shown in FIG. 22, the semiconductor device of this embodiment is characterized by including: a control-voltage supply unit 110; a field-effect transistor (which will be hereinafter referred to as an MOS transistor); a dielectric capacitor 104; and a resistor 106. The dielectric capacitor 104 and the resistor 106 are disposed in parallel and interposed between a gate electrode 109 of the MOS transistor and the control-voltage supply unit 110.

Figure 23:
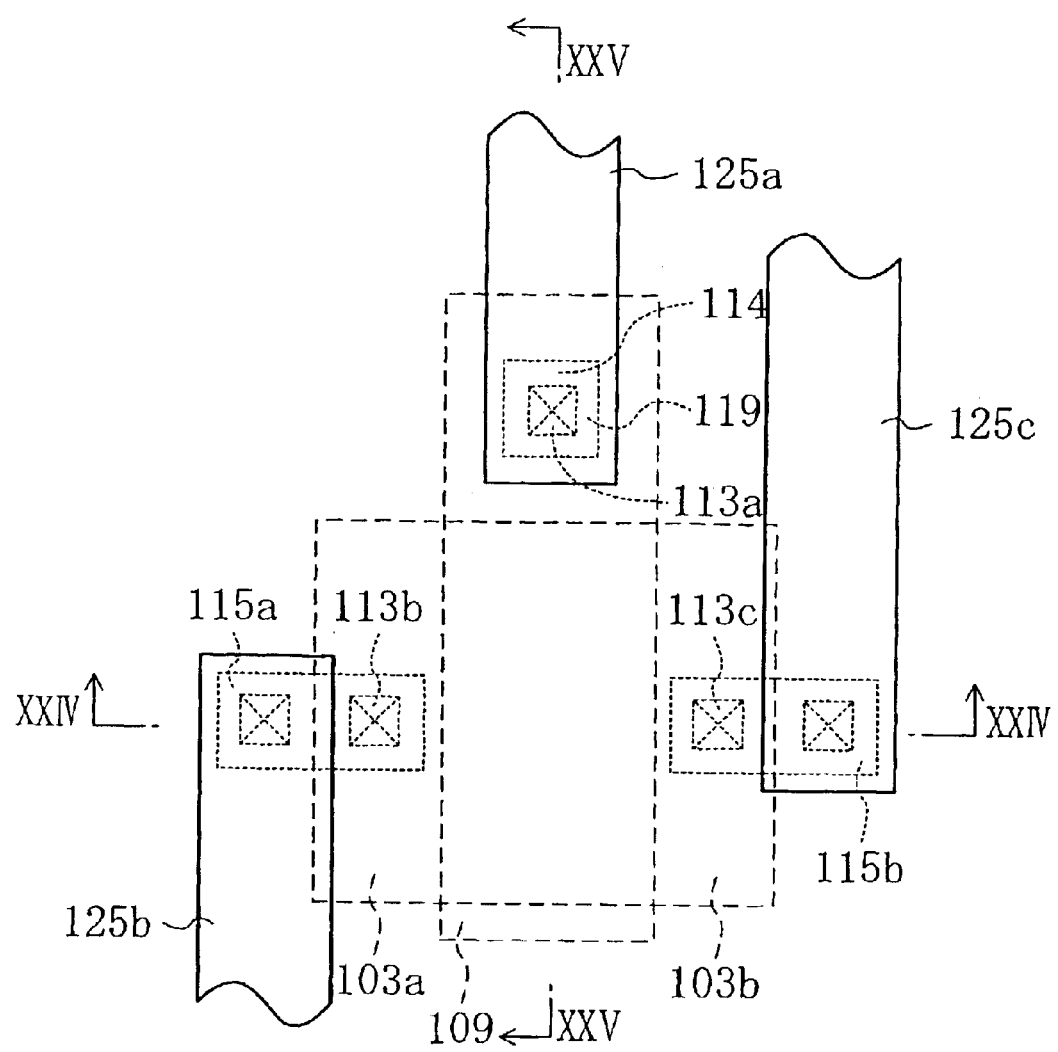
FIG. 23 is a top plan view showing the semiconductor device of the fifth embodiment.
Figure 24:
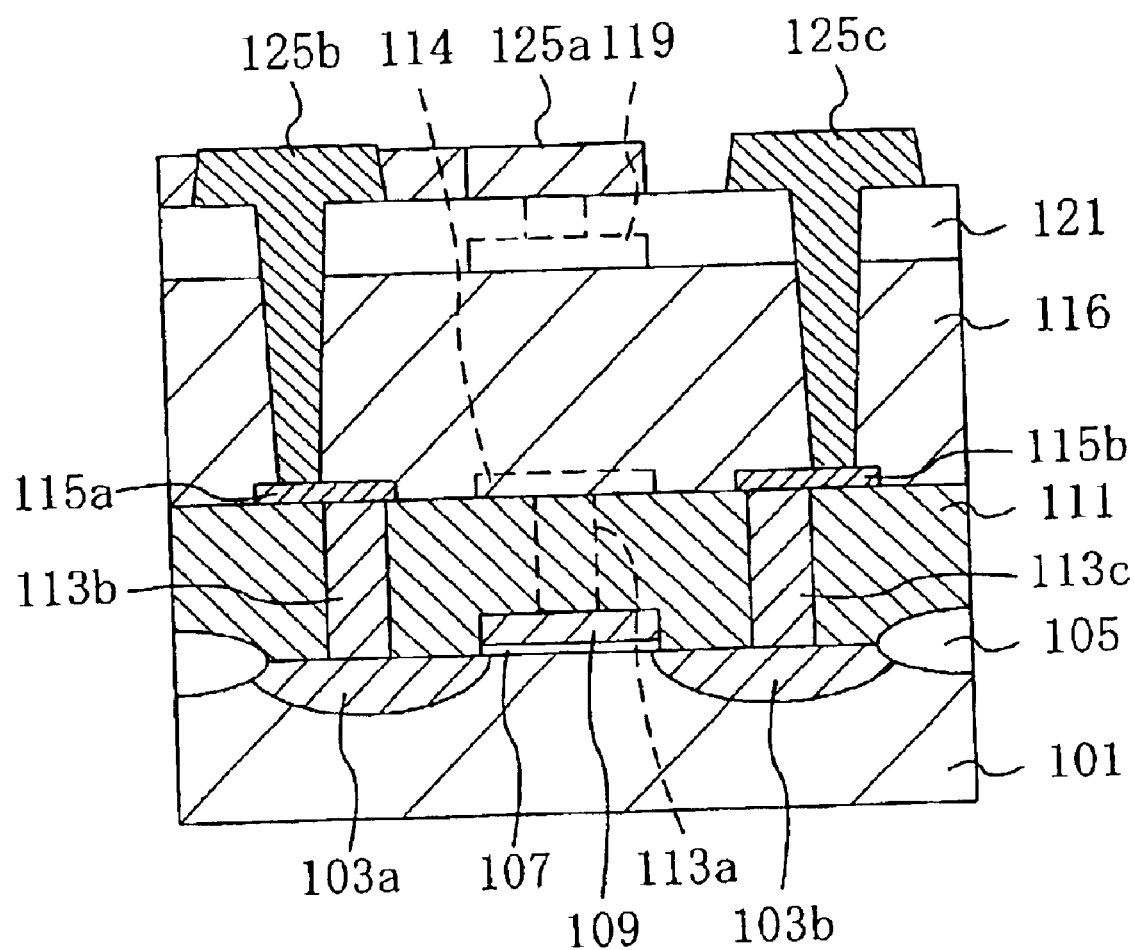
FIG. 24 is a cross-sectional view showing the semiconductor device of the fifth embodiment, taken along the line XXIV—XXIV in FIG. 23.
Figure 25:
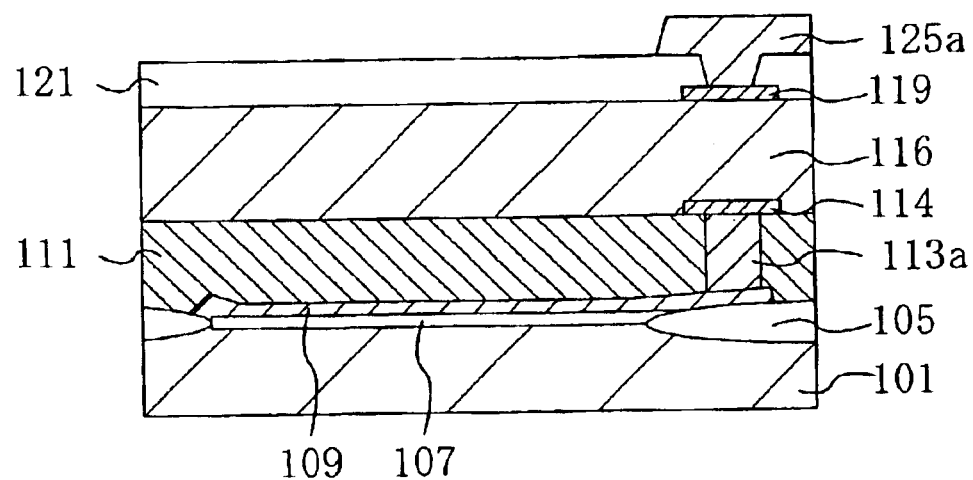
FIG. 25 is a cross-sectional view showing the semiconductor device of the fifth embodiment, taken along the line XXV—XXV in FIG. 23.
Figure 26:
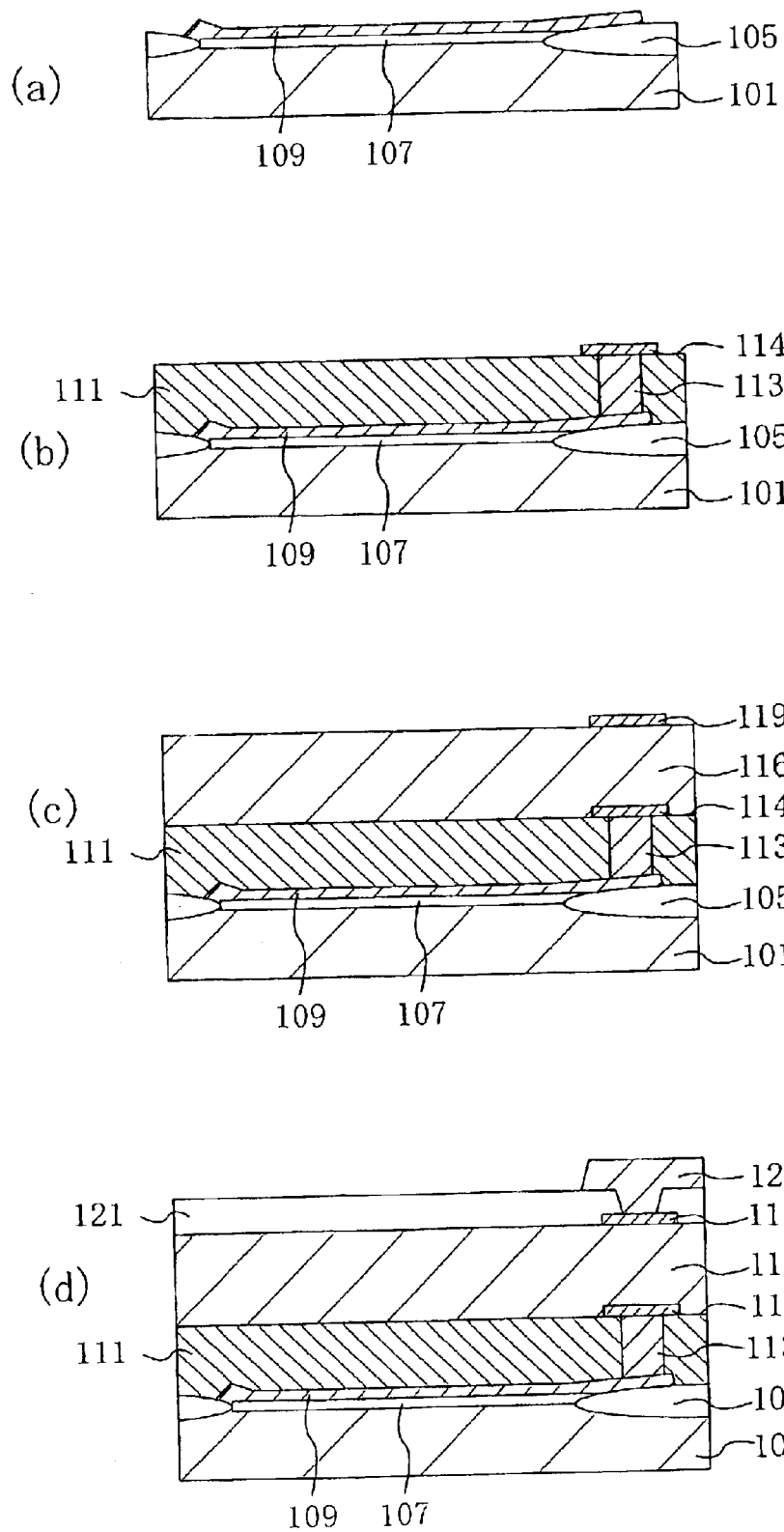
FIGS. 26A through 26D are cross-sectional views showing respective process steps for fabricating the semiconductor device of the fifth embodiment.

FIG. 23 shows a top plan view of the semiconductor device of this embodiment. FIG. 24 shows a cross-sectional view taken along the line XXIV—XXIV in FIG. 23. FIG. 25 shows a cross-sectional view taken along the line XXV—XXV in FIG. 23. In FIG. 23, hatch patterns are omitted and only components on the uppermost surface are indicated by solid lines for better viewability. Some of the components also shown in FIGS. 24 and 25 are also omitted for better viewability. In FIGS. 24 and 25, components behind the cross section are omitted in part.

As shown in FIGS. 23, 24 and 25, the semiconductor device of this embodiment includes: a p-type Si substrate 101 including an active region, for example; a substrate electrode 108 (shown only in FIG. 22) formed on a plane facing the active region of the Si substrate 101; an isolation oxide film 105 formed in the Si substrate 101 to surround the active region; a gate insulating film 107 of $SiO_2$ having a thickness of 5 nm and formed on the Si substrate 101; a gate electrode 109 formed on the gate insulating film 107 and made of polysilicon containing phosphorus; drain and source regions 103a and 103b formed in the Si substrate 101 to the sides of the gate electrode 109 and containing an n-type impurity; a first interlevel dielectric film 111 formed on the Si substrate 101 and made of an insulator such as $SiO_2$; pads 115a and 115b and an intermediate electrode 114 that are formed on the first interlevel dielectric film 111 and made of a titanium nitride (TiN) film having a thickness of 20 nm and a Pt film having a thickness of 50 nm; a plug interconnect 113a of polysilicon connecting the gate electrode 109 to the intermediate electrode 114 through the first interlevel dielectric film 111; plug interconnects 113b and 113c of polysilicon connecting the drain region 103a to the pad 115a and connecting the source region 103b to the pad 115b, respectively, through the first interlevel dielectric film 111; a dielectric layer 116 of barium strontium titanate (hereinafter referred to as BST) formed on the first interlevel dielectric film 111 and having a thickness of 100 nm; an upper electrode 119 of Pt formed on the dielectric layer 116 and having a thickness of 50 nm; a second interlevel dielectric film 121 formed on the dielectric layer 116; an interconnect 125a made of a conductor such as an AlSiCu alloy and penetrating through the second interlevel dielectric film 121 to connect with the upper electrode 119; and interconnects 125b and 125c made of a conductor such as an AlSiCu alloy and penetrating through the second interlevel dielectric film 121 and the dielectric layer 116 to connect with the pads 115a and 115b, respectively.

Each of the intermediate electrode 114 and the upper electrode 119 has a size of 2.5 $\mu$m×4 $\mu$m, which is the same as the size of the MOS transistor including the gate electrode 109.

In the semiconductor device of this embodiment, the dielectric layer 116 and the intermediate and upper electrodes 114 and 119, between which the dielectric layer 116 is sandwiched, together form a capacitor. In addition, the dielectric layer 116 also constitutes the resistor 106 (see FIG. 22). Operation of the semiconductor device in consideration of this structure will be described later.

Next, a method for fabricating the semiconductor device of this embodiment will be hereinafter described with reference to FIGS. 26A through 26D.

FIGS. 26A through 26D are cross-sectional views taken along the line XXV—XXV in FIG. 23 and showing respective process steps for fabricating the semiconductor device of this embodiment. Components not appeared in the XXV—XXV cross-sections in FIGS. 26A through 26D and components omitted therein will be described using the reference numerals used in the descriptions for FIGS. 23 through 25.

First, in a process step shown in FIG. 26A, a p-type Si substrate 101 is subjected to oxidation using a silicon nitride film (not shown) formed thereon as a mask, thereby forming an isolation oxide film 105 (a LOCOS process). Thereafter, the silicon nitride film is removed by heated phosphoric acid, for example, and then the substrate is subjected to a pyrogenic oxidation at 900° C., thereby forming a $SiO_2$ film with a thickness of 5 nm on the Si substrate 101. Then, polysilicon doped with an n-type impurity such as phosphorus is deposited by a LPCVD process, for example, over the $SiO_2$ film and then is patterned by dry etching, thereby forming a gate insulating film 107 and a gate electrode 109. Subsequently, a p-type impurity such as boron is implanted using the gate electrode 109 as a mask, and then heat treatment is performed at 900° C. for 30 minutes, thereby forming drain and source regions 103a and 103b in the Si substrate 101 to the sides of the gate electrode 109. The MOS transistor fabricated in this process step has a gate length of 1 μm and a gate width of 10 μm.

Next, in a process step shown in FIG. 26B, $SiO_2$ is deposited by an LPCVD process, for example, over the substrate, thereby forming a first interlevel dielectric film 111. Then, after a resist pattern (not shown) has been formed on the first interlevel dielectric film 111, the first interlevel dielectric film 111 is dry-etched, thereby forming contact holes reaching the gate electrode 109 and the drain and source regions 103a and 103b, respectively. Thereafter, polysilicon is deposited by an LPCVD process, for example, over the substrate, and then the substrate surface is planarized by a CMP process, thereby forming plug interconnects 113a, 113b and 113c filling in the respective contact holes. Then, after TiN has been deposited by a sputtering process to a thickness of 20 nm over the first interlevel dielectric film 111, Pt is deposited by a sputtering process to a thickness of 50 nm. Subsequently, a $SiO_2$ film that has been deposited by a sputtering process is patterned to form a hard mask (not shown). The Pt/TiN layer is then patterned by Ar milling using the hard mask, thereby forming an intermediate electrode 114 and pads 115a and 115b on the plug interconnects 113a, 113b and 113c, respectively. Thereafter, the hard mask is removed by diluted hydrofluoric acid or the like.

In this case, the TiN layer is formed so as to prevent Pt and polycrystalline silicon from forming silicide which increases the resistance.

Then, in a process step shown in FIG. 26C, BST is deposited by a sputtering process, for example, over the first interlevel dielectric film 111 under conditions that the substrate temperature is 550° C., the partial pressure of oxygen is 20% and the RF power is 100 W, thereby forming a dielectric layer 116 with a thickness of 100 nm. Then, Pt is deposited by a sputtering process on the dielectric layer 116 and then is patterned by Ar milling using a hard mask of $SiO_2$ (not shown), thereby forming an upper electrode 119 facing the intermediate electrode 114 with the dielectric layer 116 interposed therebetween. Thereafter, the hard mask is removed by diluted hydrofluoric acid or the like.

In this embodiment, each of the intermediate electrode 114 and the upper electrode 119 has a size of 2.5 μm×4 μm, which is the same as the size of the MOS transistor.

Then, in a process step shown in FIG. 26D, $SiO_2$ is deposited by plasma CVD using TEOS (tetraethylorthosilicate) and then is planarized by a CMP process, thereby forming a second interlevel dielectric film 121. Then, the second interlevel dielectric film 121 and the dielectric layer 116 are dry-etched using a resist mask, thereby forming contact holes. Subsequently, an AlSiCu alloy is deposited by a sputtering process over the substrate and then is dry-etched using a resist mask, thereby forming interconnects 125a, 125b and 125c on the second interlevel dielectric film 121 to connect with the upper electrode 119, the pad 115a, and the pad 115b, respectively. The interconnect 125a is connected to a control-voltage supply unit 110 (not shown).

In this manner, the semiconductor device shown in FIG. 22 is fabricated.

The semiconductor device of this embodiment has a structure shown in the equivalent circuit in FIG. 22. However, in reality, as shown in FIGS. 23 through 26, the dielectric capacitor 104 having a structure in which the dielectric layer 116 is interposed between the intermediate electrode 114 and the upper electrode 119 operates also as an electric resistor shown in FIG. 22. That is to say, the dielectric capacitor 104 and the resistor 106 shown in FIG. 22 are one and the same, and electric resistance is a resistance component of the dielectric capacitor. Therefore, in the semiconductor device of this embodiment, the structure shown in the equivalent circuit in FIG. 22 is made simple, as compared to the case where the dielectric capacitor 104 and the resistor 106 are disposed separately.

Hereinafter, a driving method for and operation of the semiconductor device of this embodiment will be described.

Figure 27:
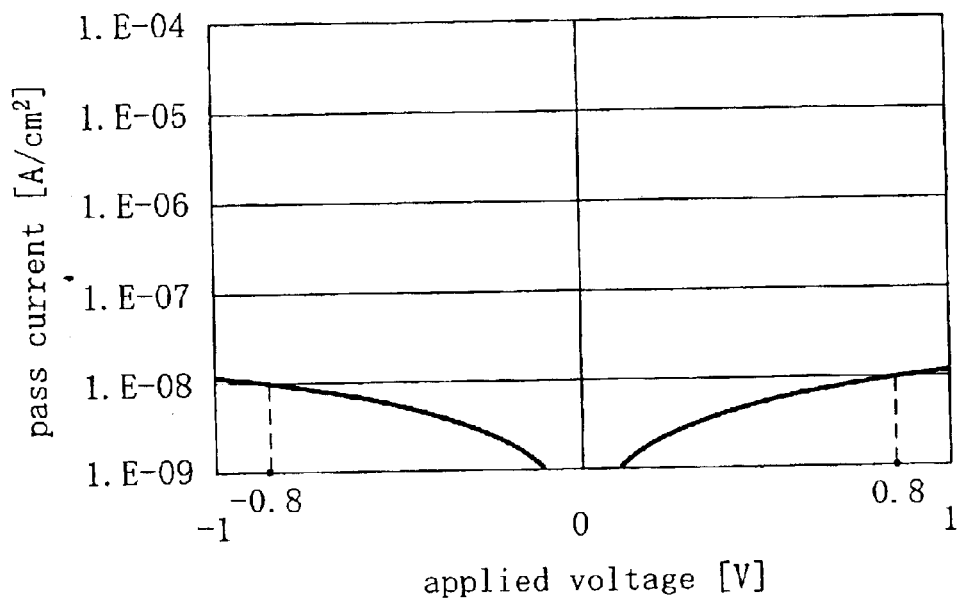
FIG. 27 is a graph showing an applied voltage-pass current characteristic of a dielectric capacitor used in the semiconductor device of the fifth embodiment.

FIG. 27 is a graph showing a characteristic of a pass current flowing between the intermediate electrode 114 and the upper electrode 119 through the dielectric layer 116 upon the application of a voltage to both electrodes of the dielectric capacitor 104 including the dielectric layer 116 of BST. As shown in FIG. 27, the material BST has a characteristic that the resistance value is almost constant while the electric field intensity is low, so that a pass current value varies in proportion to the voltage. In FIG. 27, since the abscissa uses a log scale, the characteristic in the graph is represented by axisymmetric curves with respect to 0V in the negative- and positive-voltage ranges.

A method for driving the semiconductor device of this embodiment including the dielectric layer 116 having such a characteristic and operation of the device will be hereinafter described.

Figure 28:
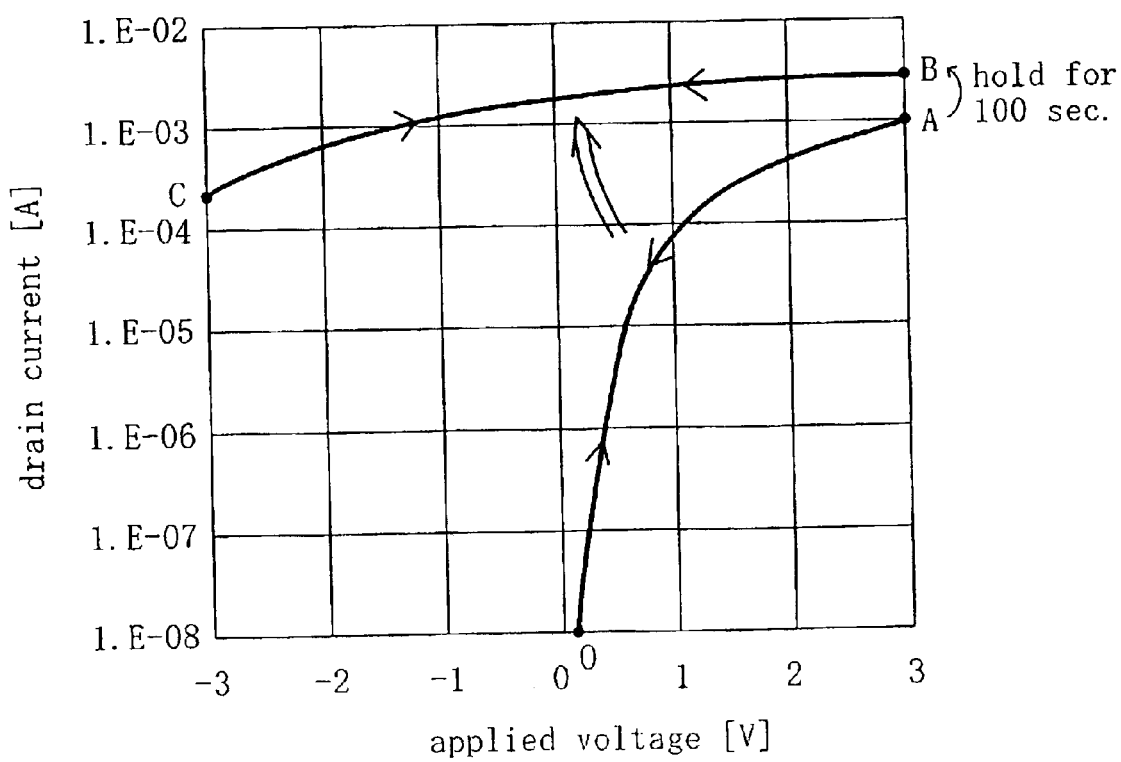
FIG. 28 is a graph showing an applied voltage-drain current characteristic of the semiconductor device of the fifth embodiment.

FIG. 28 is a graph showing a drain current-applied voltage characteristic for describing a driving method for and operation of the semiconductor device of this embodiment. In FIG. 28, the abscissa represents a voltage applied between the Si substrate 101 and the interconnect 125a (hereinafter simply referred to as an applied voltage), while the ordinate represents a drain current flowing between the drain and source regions 103a and 103b. In evaluating the drain current-applied voltage characteristic for each of the semiconductor devices according to this embodiment and the following embodiments, a voltage of 1V is applied between the drain and source regions 103a and 103b.

The semiconductor device of this embodiment has a structure in which the MOS capacitor, in which the gate insulating film 107 is sandwiched between the Si substrate 101 and the gate electrode 109, and the dielectric capacitor 104, in which the dielectric layer 116 is sandwiched between the intermediate electrode 114 and the upper electrode 119, are connected in series. Thus, in the semiconductor device, the applied voltage is applied, being distributed to the respective capacitors.

For example, in an measurement of the semiconductor device of this embodiment shown in FIG. 28 where the applied voltage is set in the range of −3 V to +3 V, when the maximum voltage of +3 V is applied, voltages of 2.2 V and 0.8 V are respectively distributed to the MOS capacitor and the dielectric capacitor. As shown in FIG. 27, in the dielectric capacitor, a leakage current is very small in the voltage range of −0.8 V to 0.8 V, both inclusive, in this measurement.

As shown in FIG. 28, when the semiconductor device of this embodiment in an initial state operates at high speed and at a pulse voltage with a frequency of about 1 MHz, for example, the semiconductor device exhibits a characteristic represented by a characteristic curve including points A and O (hereinafter referred to as an A-O curve).

In the range not higher than about 0 V, though the A-O curve is not shown therein, the drain current is at a noise level, i.e., at a level sufficiently smaller than $10^{-8}$ (A). Therefore, when the applied voltage is 3 V, for example, a drain current of about $1 \times 10^{-3}$ (A) flows (the point A in FIG. 28). When the applied voltage is then decreased to 0 V, the drain current is at a noise level (the point O in FIG. 28). That is to say, when the semiconductor device of this embodiment operates at a high speed of about 1 MHz, the drain current increases according to the applied voltage, so that the device operates as the MOS transistor.

Next, if the state represented by the point A in FIG. 28, i.e., the state in which a voltage of +3 V is applied to the upper electrode 119, is maintained, a charge is gradually accumulated in the intermediate electrode 114 by the pass current flowing through the dielectric layer 116. In this state, a charge is also accumulated in the gate electrode 109 of the MOS transistor connected to the intermediate electrode, thus changing the threshold value of the MOS transistor. Accordingly, the applied voltage-drain current characteristic of the semiconductor device also changes.

For example, if an applied voltage of +3 V is held for 100 seconds and then a voltage is applied to the upper electrode 119 at about 1 MHz, the characteristic changes, drawing a curve including points B and C in FIG. 28. That is to say, the applied voltage-drain current characteristic (hereinafter referred to as a VG-ID characteristic) of the MOS transistor can be changed using the product of the magnitude of the applied voltage and the holding time thereof.

The difference in drain current between the initial state and the state with an applied voltage of +3 V held for 100 seconds is one or more orders of magnitude upon the application of a voltage of +2 V, while being five or more orders of magnitude upon the application of a voltage of 0 V. Thus, if the semiconductor device of this embodiment is used as a memory, for example, multilevel information can be read out by detecting the drain current.

In this manner, in the semiconductor device of this embodiment, a long application of a voltage to the upper electrode 119 in a voltage range in which the resistance value of the dielectric capacitor 104 can be considered almost constant is used as write information, thereby allowing modulation of the characteristics of the MOS transistor such that the drain current increases with the applied voltage as compared to the initial state. On the other hand, though not shown, if the state is held at a negative voltage of −3 V, for example, the characteristics of the MOS transistor can be modulated such that a smaller amount of drain current flows upon the applied voltage than that in the initial state.

As described above, the semiconductor device of this embodiment can perform a storing operation by a driving method completely different from that for the known semiconductor device functioning as a multilevel memory.

In addition, the semiconductor device of this embodiment has its characteristics changed, reflecting the history of earlier written information. Therefore, the semiconductor device is applicable not only as a multilevel memory but also as a neuron element.

In the application as a neuron element, a plurality of semiconductor devices according to this embodiment are connected to each other so that a load signal is applied to each interconnect 125a and an output signal from a previous-stage neuron element is added to each drain region 103a. At this time, if a voltage applied to the interconnect 125a is high and the pulse width thereof is long, current easily flows from the semiconductor devices. Such an application to a neuron element will be described in detail in a later embodiment.

In the semiconductor device of this embodiment, if an applied voltage of +3 V is hold for 100 seconds to create a state represented by the B-C curve shown in FIG. 28, and then the interconnect 125a, for example, is grounded, the characteristic curve of this semiconductor device gradually moves from the B-C curve toward the A-O curve and then returns to the A-O curve in approximately 100 seconds. This procedure shows a reverse operation of the storing operation for written information and also shows that the device has a function of "forgetting" information once written with the passage of time. In a practical operation, since the device operates at high speed of 100 MHz, for example, such a "forgetting" function is effective in the case where no signal is input for a long period. Specifically, the forgetting function makes an effective change in a portion which is seldom used upon the input of a next leaning operation, thus improving a leaning function of the element.

In the semiconductor device of this embodiment, the amount of a charge accumulated in the intermediate electrode 114 and the gate electrode 109 is adjusted depending on the time period over which the applied voltage is held, thereby controlling flowability of the drain current. As in the case of the speed of writing information, the speed of forgetting can also be adjusted by controlling the magnitude of the pass current in a voltage range in which the pass current varies in proportion to the voltage.

Figure 29:
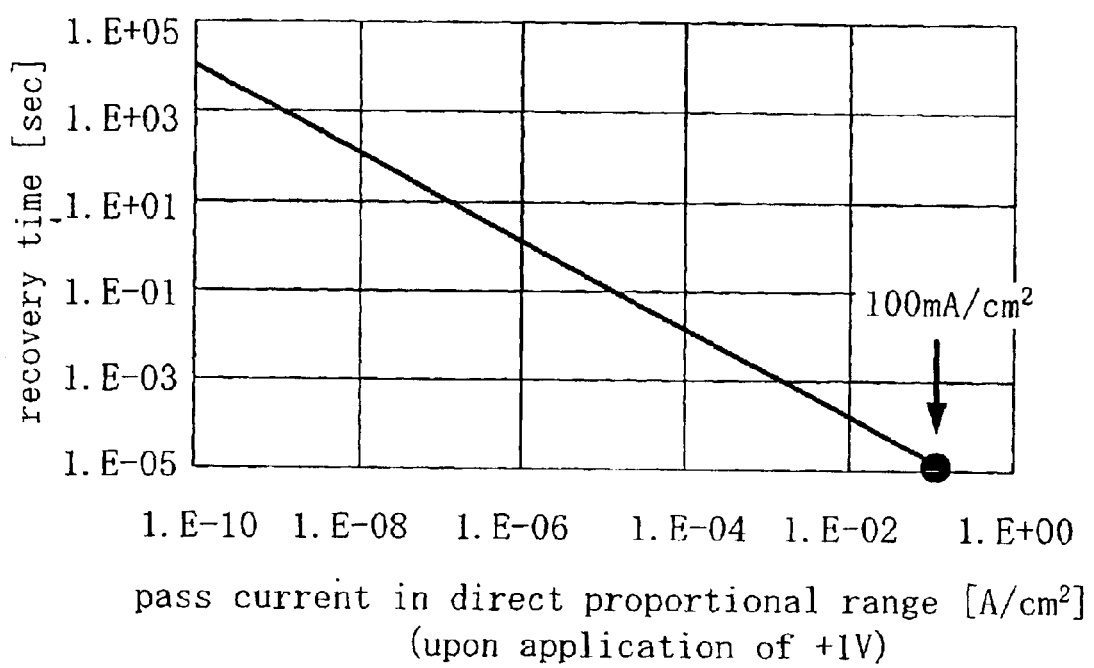
FIG. 29 shows a correlation between a pass current flowing through the dielectric capacitor and a recovery time in the semiconductor device of the fifth embodiment.

FIG. 29 shows a correlation between a pass current flowing through the dielectric capacitor 104 of the semiconductor device of this embodiment and a recovery time. In FIG. 29, the recovery time is a time period over which the semiconductor device returns to the initial state after the application of a write voltage (i.e., time period required for forgetting information).

FIG. 29 shows that the recovery time tends to be shorter as the pass current increases in a voltage range in which the resistance value of the dielectric layer 116 can be considered constant. From this tendency, it is shown that the charge accumulated in the intermediate electrode 114 and the gate electrode 109 by the write voltage is leaking as a pass current.

In FIG. 29, in view of holding stored information, the pass current flowing upon the application of a voltage of 1 V to both ends of the capacitor 104 is set at 100 ($mA/cm^2$) or less and the recovery time has a holding time of 10 $\mu sec.$ or more, such that a modulation memory of the transistor is held for a sufficiently long period relative to a computation time. The pass current needs only to be sufficiently small with respect to a period over which data is to be held.

For example, in the semiconductor device of this embodiment, the pass current is about $10^{-8}$ ($mA/cm^2$) upon the application of 1V as shown in the graph of FIG. 27. Therefore, the holding time is about 100 seconds as shown in FIG. 29.

As described above, the semiconductor device of this embodiment has a structure in which a dielectric capacitor and an electric resistor are disposed in parallel and connected to the gate electrode of a normal MOS transistor, thereby allowing the history of a signal to be stored as the change in an applied voltage-drain current characteristic of the MOS transistor.

In addition, in the semiconductor device of this embodiment, the dielectric capacitor 104 and the resistor 106 are one and the same, thus simplifying the structure of the device. Thus, if the semiconductor device of this embodiment is used as a memory cell by connecting the drain region 103a to a bit line and connecting the interconnect 125a to a word line, for example, a multilevel memory having a small size can be fabricated. Even if the semiconductor device of this embodiment is used as a neuron element, an advantage of allowing higher degree of integration is also obtained.

However, the information once stored is lost after a lapse of the recovery time. In view of this, the dielectric capacitor 104 and the resistor 106 may be fabricated separately and the resistor may be made of a material through which a smaller amount of pass current flows. Then, information can be stored for a longer time.

In the semiconductor device of this embodiment, BST is used as a dielectric material. Alternatively, the dielectric material may be any other material so long as current flows through the film. As such materials, strontium titanate, titanium oxide, tantalum oxide, aluminum oxide, zirconium oxide, cerium oxide, gadolinium oxide, lanthanum oxide, for example; are especially effective.

The distribution ratio of the voltage applied to the upper electrode 119 between the dielectric capacitor and the MOS transistor varies in inverse proportion to the capacitance of the capacitor. Thus, voltages distributed to the respective devices can be adjusted as required by changing the dielectric material, the area of the electrode, the thickness of the dielectric layer 116 or the gate insulating film, for example.

The gate insulating film of the MOS transistor is made of $SiO_2$ in this embodiment. Alternatively, another insulator or dielectric such as silicon nitride may be used. Any type of field-effect transistor as well as the MOS transistor may be used for the semiconductor device of this embodiment. This is also applicable to the following embodiments.

In the semiconductor device of this embodiment, the write time is 100 seconds under a condition that the applied voltage is +3 V. This is only an example of a write time and does not mean that the amount of the charge accumulated in the intermediate electrode is saturated. The time period over which the charge is saturated is a little longer than 100 seconds and will vary by changing the design of the device as described above. The write voltage is not limited to +3 V so long as the resistance value of the dielectric layer 116 is in a certain range. If the write voltage is low, the time period required for writing becomes longer.

In the semiconductor device of this embodiment, the resistance component of the dielectric layer 116 in the dielectric capacitor 104 also functions as the resistor 106. Alternatively, the dielectric capacitor 104 and the resistor 106 may be provided separately from each other. In such a case, although the area increases, design conditions can be adjusted as required. For example, a leakage current from the resistor 106 is reduced or the time period required for writing is shortened, with the dielectric layer 116 and the resistor 106 made of different materials.

In the semiconductor device of this embodiment, a charge is accumulated in the intermediate electrode 114 in proportion to the product of the applied voltage and the application time. Thus, if the device is applied to a neuron element, application time of a maximum voltage is varied, thereby allowing weighting. In addition, a signal once input is "forgotten" after the lapse of the recovery time unless another signal is input thereafter. As a result, for example, neuron elements used for computation are separated from unused neuron elements. That is to say, more effective computation is achieved over the long term as compared to the known neuron element.

Embodiment 6

Next, a sixth embodiment of the present invention will be described with reference to the drawings.

In this embodiment, a method that is for driving the same semiconductor device as in the fifth embodiment but is different from the method described in the fifth embodiment will be described. For this reason, only a driving method for and operation of the semiconductor device will be hereinafter described.

Figure 30:
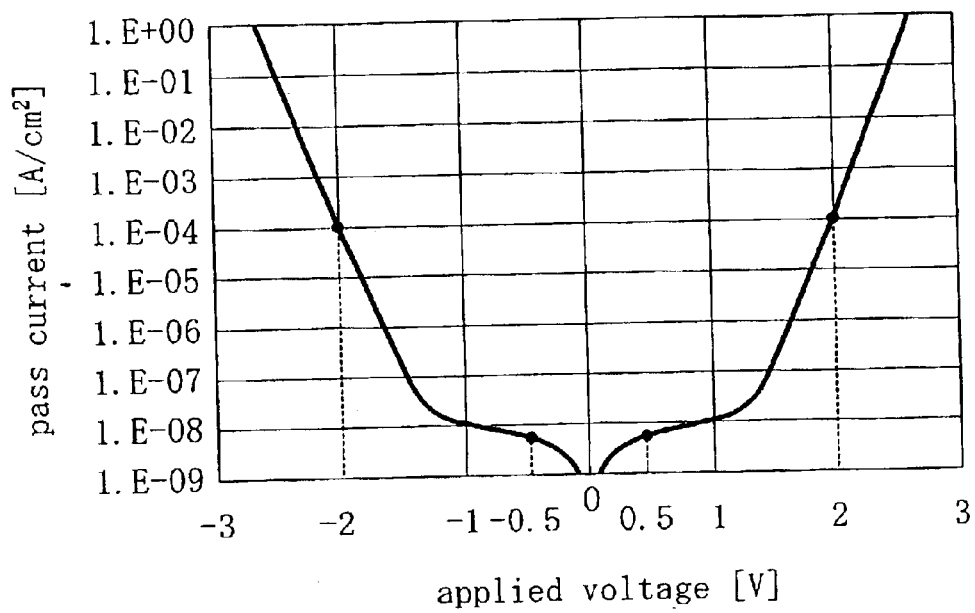
FIG. 30 is a graph showing an applied voltage-drain current characteristic of a dielectric capacitor used in a semiconductor device according to a sixth embodiment of the present invention.

FIG. 30 is a graph showing a characteristic of a pass current flowing between the intermediate electrode 114 and the upper electrode 119 through the dielectric layer 116 when a voltage is applied between both electrodes of the dielectric capacitor 140 including the dielectric layer 116 of BST in the same semiconductor device as in the fifth embodiment shown in FIGS. 23 through 25.

In general, a perovskite oxide such as BST has a characteristic that the resistance value is almost constant in a range in which the electric field intensity is low, but when a voltage is further increased, the pass current increases exponentially with a voltage higher than about 1.3 V, as indicated by the characteristic curve shown in FIG. 30. Even in the negative range of the applied voltage, an applied voltage-pass current characteristic is represented by substantially symmetric curves with respect to the axis of 0V.

This abrupt increase in the pass current can be explained as a Schottky current. Specifically, a barrier is present at the interface between the intermediate or upper electrode 114 or 119 and the dielectric layer 116 so that current hardly flows while the electric field intensity is below a certain degree. However, when the electric field intensity exceeds the certain degree, current begins to flow over the barrier. This current is called a Schottky current.

Hereinafter, a method for driving the semiconductor device of this embodiment utilizing such a characteristic of the dielectric capacitor will be described.

Figure 31:
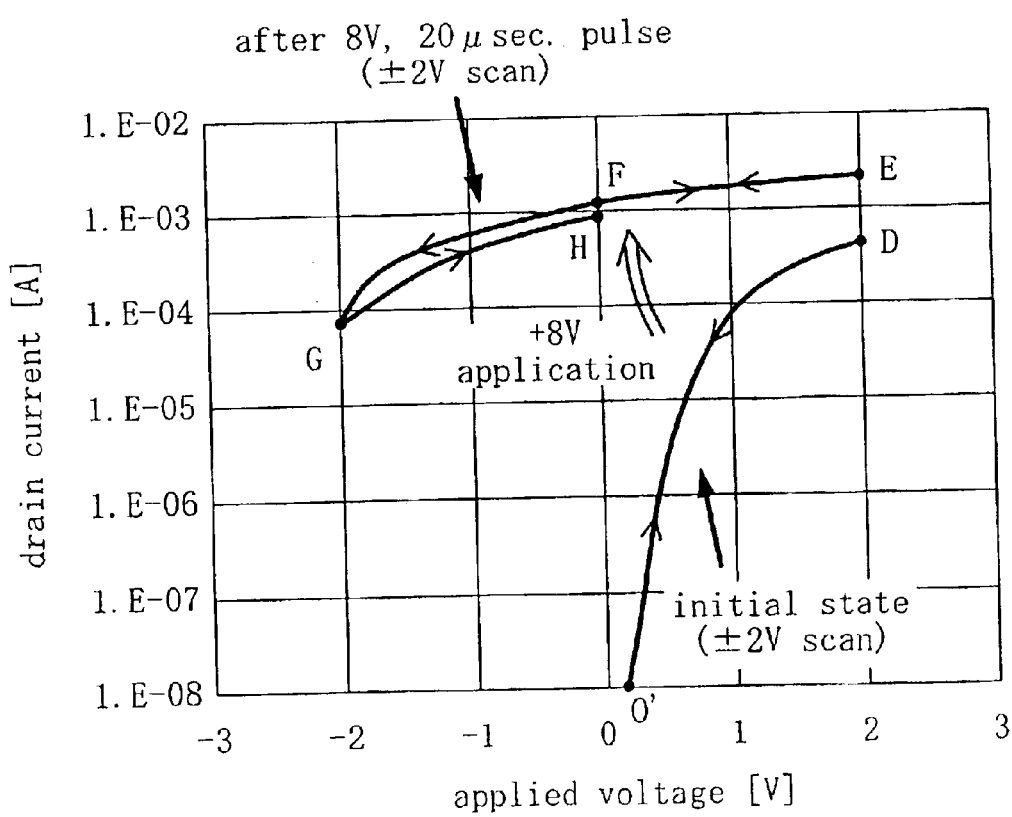
FIG. 31 is a graph showing an applied voltage-drain current characteristic of the semiconductor device of the sixth embodiment.

FIG. 31 is a graph showing a drain current-applied voltage characteristic for explaining a driving method for and operation of the semiconductor device of this embodiment. In FIG. 31, the applied voltage is a voltage applied between the interconnect 125a (or the upper electrode 119) and the substrate electrode 108.

The semiconductor device of this embodiment has a structure in which the MOS capacitor, in which the gate insulating film 107 is sandwiched between the Si substrate 101 and the gate electrode 109, and the dielectric capacitor, in which the dielectric layer 116 is sandwiched between the intermediate electrode 114 and the upper electrode 119, are connected in series. Thus, the applied voltage is distributed to the respective capacitors. For example, when the applied voltage is +2 V, the applied voltage is distributed to 1.5 V and 0.5 V, which are applied to the MOS capacitor and the dielectric capacitor, respectively. When the applied voltage is +8 V, the applied voltage is distributed to 6.0 V and 2.0 V, which are applied to the MOS capacitor and the dielectric capacitor 104, respectively. As shown in FIG. 30, the dielectric capacitor 104 of this embodiment operates as a resistor having a substantially constant resistance value upon the application of a voltage of 0.5 V, while operating a resistor in which the resistor is a relatively small, i.e., current increases exponentially with the increase in voltage, upon the application of a voltage of 2.0 V.

In the method for driving the semiconductor device of this embodiment, a voltage at about 50 kHz, for example, is applied so as to operate the semiconductor device.

First, in the initial state, supposing the applied voltage is in the range of +2 V, the semiconductor device of this embodiment exhibits a characteristic moving along a characteristic curve including the points D and O' (hereinafter referred to as a D-O' curve) in FIG. 31. In the range not higher than about 0 V, though the D-O' curve is not shown therein, a drain current is at a noise level, i.e., at a level sufficiently smaller than $10^{-8}$(A) In this state, when a voltage of 2 V is applied, for example, a drain current of about $6 \times 10^{-4}$ flows (the point D). Then, when a voltage of 0 V is applied, the drain current returns to the state indicated by the point O at which only current almost at a noise level flows. Even if a voltage of 2 V or less is applied and then a voltage of 0 V is applied, the drain current is substantially at a noise level. That is to say, the semiconductor device of this embodiment operates as the MOS transistor at the applied voltage in the range of −2 V to +2 V.

Then, when a high voltage of +8 V is applied, for example, the pass current flowing through the dielectric layer 116 increases exponentially, so that a charge is accumulated in the intermediate electrode 114 and the gate electrode 109 in a very short time. In this embodiment, the device operates with the frequency of a pulse voltage to be applied set at 50 kHz. Alternatively, if a pulse voltage of +8 V is applied for 20 $\mu$sec., it is possible to shift the characteristic to the curve including points E and F shown in FIG. 31. That is to say, if the applied voltage is increased, the VG-ID characteristic of the MOS transistor can be changed in a short time. The time period required for accumulating a charge is 100 seconds in the fifth embodiment. On the other hand, according to the driving method of this embodiment, the time period is greatly shortened, i.e., 20 $\mu$sec.

Hereinafter, the operation of the semiconductor device of this embodiment will be described in further detail. When a pulse voltage of +8 V is applied, the pass current flowing through the dielectric layer 116 increases exponentially, so that a charge is accumulated in the intermediate electrode 114 and the gate electrode 109 rapidly.

Thereafter, when the applied voltage is returned to 0V, the characteristic changes into the state represented by the point F in FIG. 31 so that the drain current varies. When a voltage of +2 V is further applied to the upper electrode 119, the characteristic changes from the state at the point F to the state at the point E, so that the a drain current of about $3 \times 10^{-3}$ (A) flows. However, when the applied voltage is set at 0V again, the characteristic returns to the state at the point F. That is to say, even if a low pulse voltage of about 0V to 2 V is applied after the input of a high pulse voltage, the drain current-applied voltage characteristic of the semiconductor device does not change. On the other hand, when a negative pulse voltage of −2 V is applied to the upper electrode 119 in the state indicated by the point F, the state of the semiconductor device moves to a point G, so that the drain current decreases by about one order of magnitude. When the applied voltage is then set at 0V again, the state moves to a point H, which is close to the point F and at which the drain current is slightly smaller than in the state at the point F but the drain current does not change largely.

Based on the same principle, a voltage of −8 V is applied, for example, the characteristic of the device naturally changes into the state in which the drain current varies very slightly with a scan of +2 V upon the application of the voltage of −8 V.

As described above, according to the method for driving the semiconductor device in this embodiment, information is written in a voltage range in which the pass current flowing through the dielectric capacitor 104 increases exponentially with the rise of the applied voltage. In reading out the information, for example, the MOS transistor is driven in a voltage range in which the pass current varies substantially in proportion to the applied voltage. With this method, the time period required for writing information can be greatly shorten, as compared to the method for driving the semiconductor device described in the fifth embodiment.

By the method for driving the semiconductor device in this embodiment, the history of earlier written information can be stored as variations in device characteristics. Therefore, the semiconductor device of this embodiment can be applied not only as a multilevel memory but also as a neuron element. If the device is used as a neuron element, the time period required for writing information can be greatly shortened as compared to the method in the fifth embodiment, thus improving the computation speed largely.

Unlike the method of the fifth embodiment, the method for driving the semiconductor device in this embodiment is characterized in that the VG-ID characteristic of the MOS transistor can be changed not using the length of an applied voltage pulse but using the magnitude of the absolute value of the applied voltage. That is to say, the VG-ID characteristic can be modulated by setting only the value of the pulse voltage to be applied with the pulse thereof set periodic.

In the method for driving the semiconductor device of this embodiment, the write voltage is 8 V. Alternatively, the writing operation may be performed at higher voltages. However even when the voltage applied to the interconnect 125a or the upper electrode 119 is less than 8 V, for example, the write time can be shortened by reducing the capacitance of the dielectric layer through the process of reducing the area of the dielectric capacitor, the process of increasing the thickness of the dielectric layer, or other suitable processes, and eventually increasing the voltage to be distributed to the dielectric capacitor.

In the method for driving the semiconductor device of this embodiment, the interconnect 125a, for example, is grounded, so that the state of the semiconductor device returns to the initial state represented by the D-O' curve in FIG. 31 with a lapse of time. That is to say, the semiconductor device of this embodiment has a function of "forgetting", as described in the fifth embodiment.

In the method for driving the semiconductor device of this embodiment, in view of holding stored information, the pass current flowing upon the application of a voltage of 1 V to both ends of the dielectric capacitor 104 is set at 100 (mA/cm$^2$) or less and the recovery time has a holding time of 10 $\mu$sec. or more. This is distinguished from the case where a pulse voltage having a large absolute value is applied. The method is conducted under the same conditions as in the fifth embodiment, so that the time period required for recovery is about 100 seconds in this embodiment.

Embodiment 7

A semiconductor device according to a seventh embodiment of the present invention is the same as the semiconductor device of the sixth embodiment, except for part of the structure, a driving method for and operation of the device.

Figure 32:
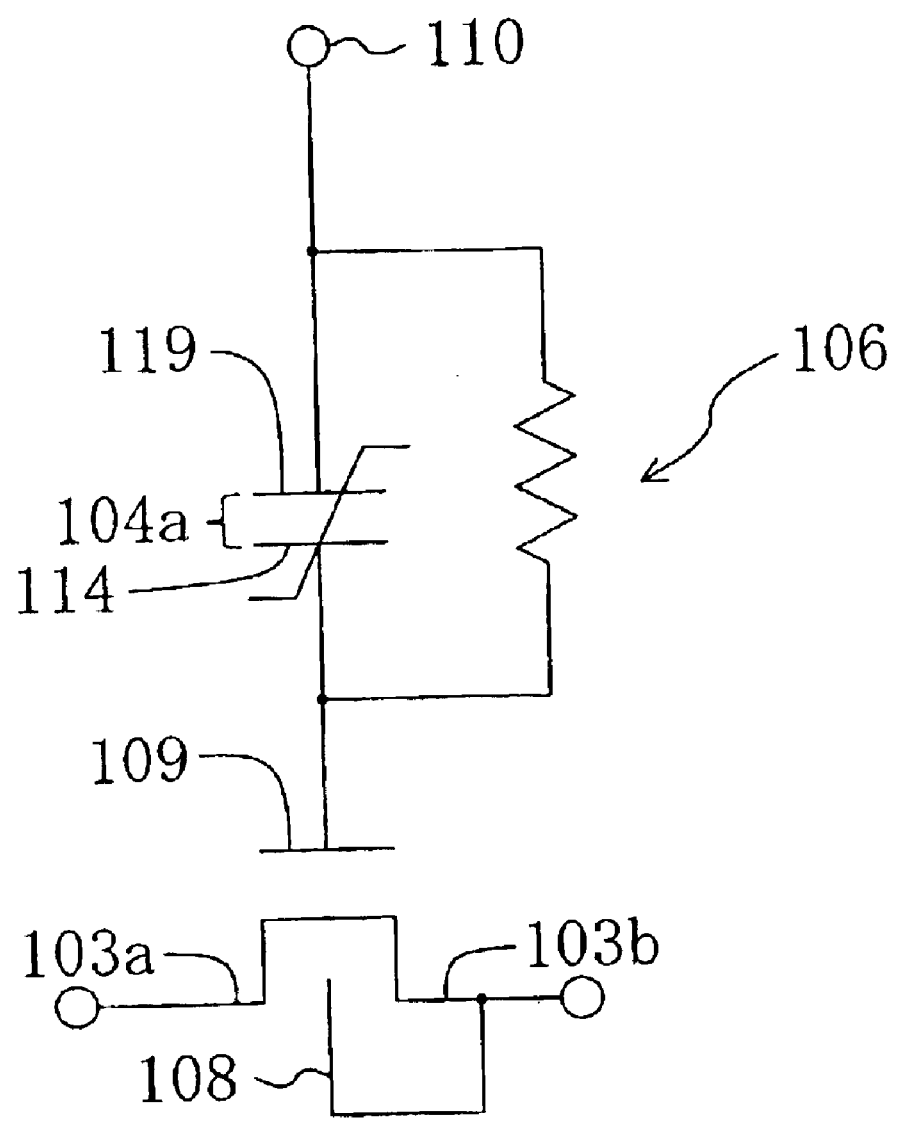
FIG. 32 is an equivalent circuit diagram showing a semiconductor device according to a seventh embodiment of the present invention.

FIG. 32 is an equivalent circuit diagram showing the semiconductor device of this embodiment. As shown in FIG.

32, the semiconductor device of this embodiment is characterized by having a structure in which a dielectric capacitor 104a and a resistor 106 are disposed in parallel and connected to a gate electrode 109 of a field-effect transistor (hereinafter referred to an MOS transistor).

The semiconductor device of this embodiment has substantially the same structure as those of the devices in the fifth and sixth embodiments but is different from the devices in that a ferroelectric layer 131 of a ferroelectric material is used instead of the dielectric layer 116.

Specifically, the semiconductor device of this embodiment includes: a control-voltage supply unit 110; an MOS transistor including the gate electrode 109, drain and source regions 103a and 103b and a substrate electrode 108; the ferroelectric capacitor 104a; and the resistor 106. The ferroelectric capacitor 104a and the resistor 106 are disposed in parallel and interposed between the gate electrode 109 of the MOS transistor and the control-voltage supply unit 110. The ferroelectric capacitor 104a includes: an upper electrode 119; an intermediate electrode 114; and a ferroelectric layer 131 of bismuth titanate (BIT) sandwiched between the upper electrode 119 and the intermediate electrode 114 and having a thickness of 300 nm. In the semiconductor device of this embodiment, the ferroelectric layer 131 also functions as the resistor 106. The source region 103b and the substrate electrode 108 are connected to each other.

FIGS. 33A through 33D are cross-sectional views showing respective process steps for fabricating the semiconductor device of this embodiment. In FIGS. 33A through 33D, the same components as those shown in FIGS. 26A through 26D are identified by the same reference numerals.

Figure 33:
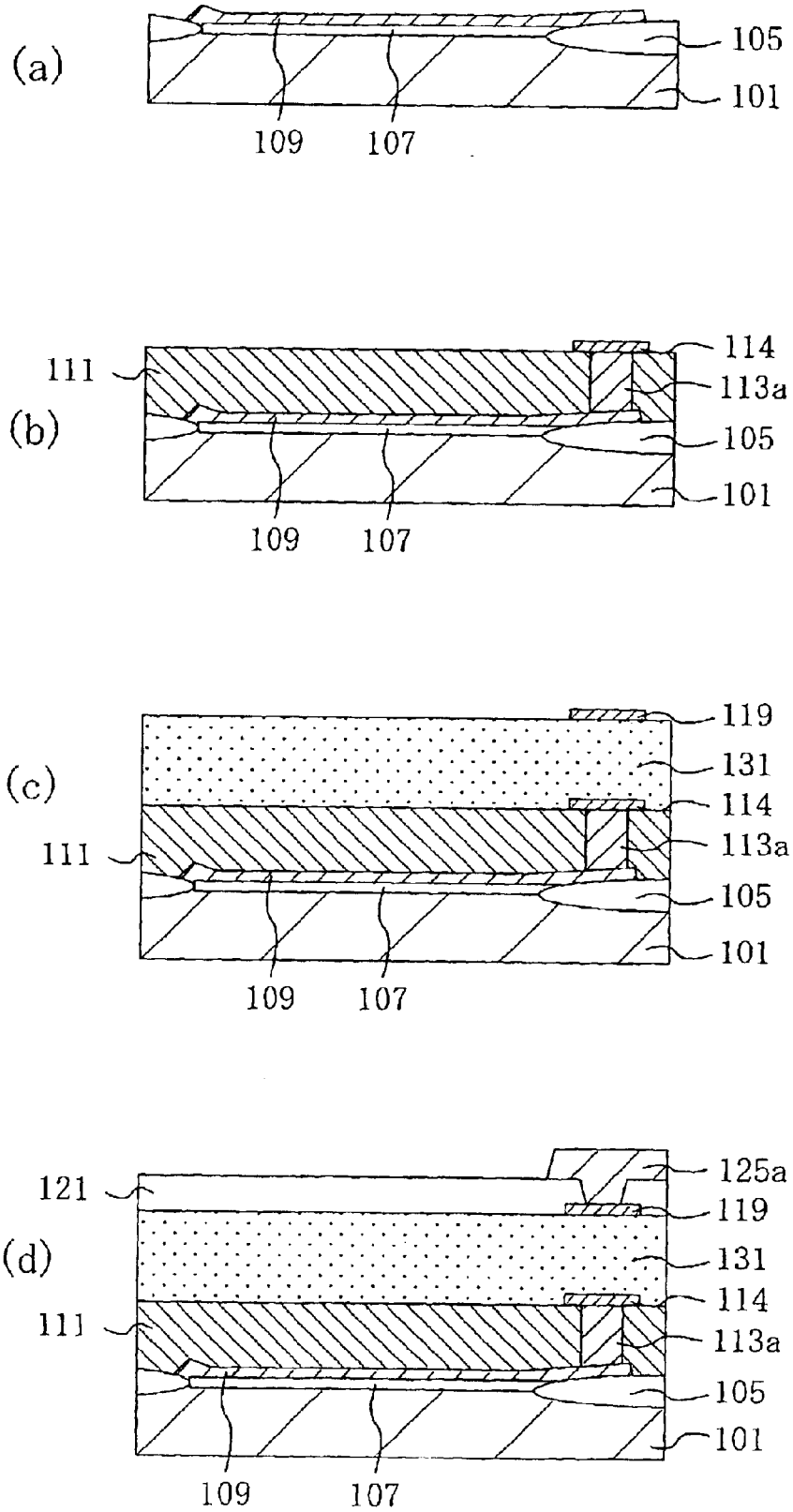
FIGS. 33A through 33D are cross-sectional views showing respective process steps for fabricating the semiconductor device of the seventh embodiment.

First, in a process step shown in FIG. 33A, through the same procedure as in the fifth embodiment, an isolation oxide film 105 is formed in a Si substrate 101 by a LOCOS process. Thereafter, a $SiO_2$ film having a thickness of 5 nm is formed by a pyrogenic oxidation performed on the substrate, and then polysilicon containing an n-type impurity is deposited over the $SiO_2$ film. Then, the polysilicon layer and the $SiO_2$ film are patterned, thereby forming a gate electrode 109 and a gate insulating film 107, respectively, over the Si substrate 101. Subsequently, a p-type impurity such as boron is implanted into the Si substrate 101, thereby forming drain and source regions 103a and 103b to the sides of the gate electrode 109. The MOS transistor fabricated in this process step has a gate length of 1 μm and a gate width of 10 μm.

Next, in a process step shown in FIG. 33B, through the same procedure as in the fifth embodiment, after a first interlevel dielectric film 111 of $SiO_2$ has been formed over the substrate, contact holes are formed by dry etching using a resist mask and then are filled with polysilicon, thereby forming plug interconnects 113a, 113b and 113c of polysilicon, respectively. Thereafter, an intermediate electrode 114 connected to the gate electrode 109 via the plug interconnect 113a, a pad 115a connected to the drain region 103a via the plug interconnect 113b, and a plug interconnect 15b connected to the source region 103b via the plug interconnect 113c, are formed. The components are respectively made of the same materials as corresponding ones in the fifth embodiment. However, the intermediate electrode has a size of 1 μm×2 μm, which is one-fifth of the area of the MOS transistor.

Then, in a process step shown in FIG. 33C, BST is deposited by a sputtering process under conditions that the substrate temperature is 600° C., the partial pressure of oxygen is 20% and the RF power is 100 W, thereby forming a first ferroelectric layer 131 having a thickness of 300 nm over the substrate. Thereafter, through the same procedure as in the fifth embodiment, an upper electrode 119 is formed on part of the ferroelectric layer 131, facing the intermediate electrode. The upper electrode 119 has a size of 1 μm×2 μm, which is the same as the size of the intermediate electrode 114 and one-fifth of the area of the MOS transistor.

Then, in a process step shown in FIG. 33D, through the same procedure as in the first embodiment, a second interlevel dielectric film 121 is formed on the ferroelectric layer 131. Subsequently, an interconnects 125a, 125b and 125c are formed on the second interlevel dielectric film 121 to reach the upper electrode 119, the pad 115a and the pad 115b, respectively.

In the semiconductor device of this embodiment fabricated by the method described above, the ferroelectric capacitor 104a and the resistor 106 are one the same, and the resistor 106 is a resistance component of the ferroelectric capacitor 104a.

Therefore, the structure shown in FIG. 32 can be achieved in a relatively small area. In addition, the number of fabrication process steps is smaller than in the case where the ferroelectric capacitor 104a and the resistor 106 are fabricated separately.

Hereinafter, a driving method for and operation of the semiconductor device of this embodiment will be described.

Figure 34:
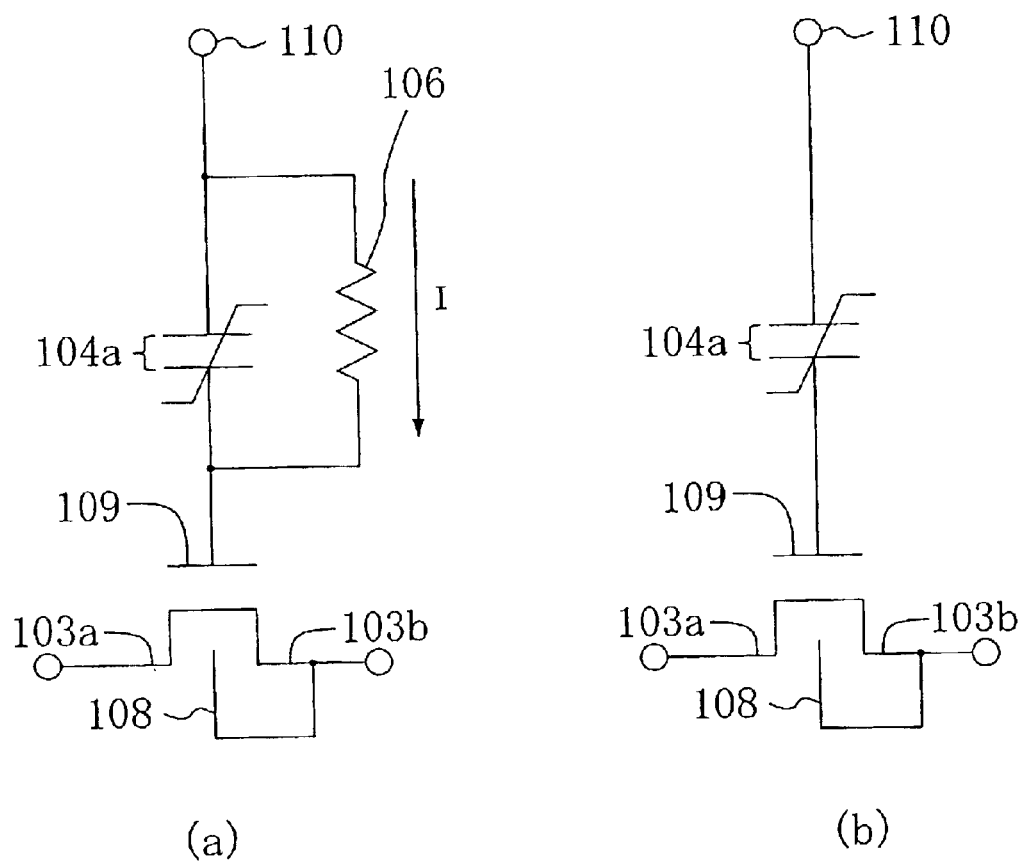
FIG. 34A is a diagram showing an equivalent circuit in a coarse control in which stored information is changed largely in the semiconductor device of the seventh embodiment.
FIG. 34B is a graph showing an equivalent circuit in a fine control in which stored information is changed slightly in the semiconductor device of the seventh embodiment.
Figure 35:
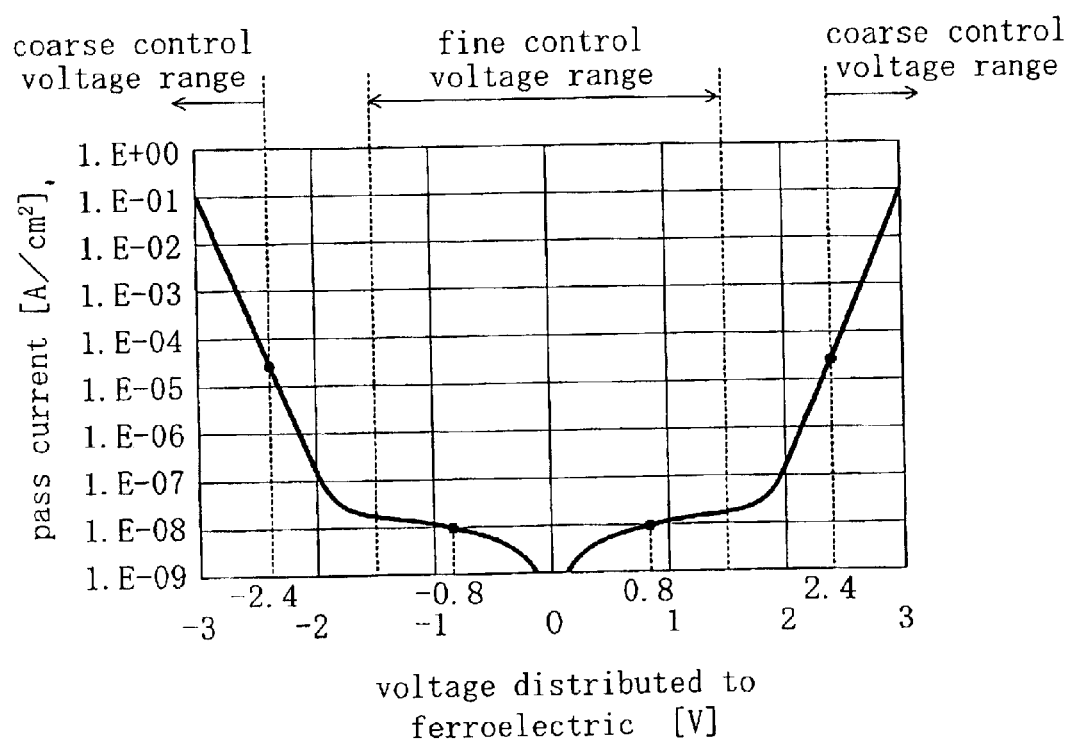
FIG. 35 is a graph showing an applied voltage-pass current characteristic of a ferroelectric capacitor used in the semiconductor device of the seventh embodiment.

FIG. 34A shows an equivalent circuit in a coarse control in which stored information is changed largely in the semiconductor device of this embodiment. FIG. 34B shows an equivalent circuit in a fine control in which stored information is changed slightly in the semiconductor device of this embodiment. FIG. 35 is a graph showing a characteristic of a pass current when a voltage is applied to both ends of the ferroelectric capacitor 104a. In this embodiment, the pass current is a current flowing between the intermediate electrode 114 and the upper electrode 119 through the ferroelectric layer 131.

In this embodiment, an oxide, e.g., BIT used as a ferroelectric material, whose elements have a composition represented as $ABO_3$ and whose crystal structure has a perovskite structure, exhibits the following characteristic, as BST used in the first and sixth embodiments. Specifically, the resistance value thereof is so small that it may be ignored while an applied electric field intensity is small. When the voltage is further increased, the pass current increases exponentially. FIG. 35 shows that the pass current also increases exponentially upon the application of a voltage higher than about 1.8 V in the ferroelectric capacitor 104a of this embodiment. When a negative voltage is applied, the characteristic is represented by substantially symmetric curves with respect to the axis of 0V.

Therefore, as shown in FIG. 35, when a voltage distributed to the ferroelectric is in a coarse control, i.e., not higher than −2.3 V or not lower than +2.3 V, the ferroelectric also functions as the resistor 106, so that a leakage current I flows. In this case, the equivalent circuit has a configuration in which the ferroelectric capacitor 104a and the resistor 106 are disposed in parallel and connected to the gate electrode 109 of the MOS transistor, as shown in FIG. 34A.

On the other hand, when a voltage distributed to the ferroelectric is in a fine control, i.e., in the range of −1.4 V to +1.4 V, both inclusive, current hardly flows in the ferroelectric so that the ferroelectric functions as an insulator. In this case, the equivalent circuit has a configuration in which only the ferroelectric capacitor 104a is connected to the gate electrode 109 of the MOS transistor, as shown in FIG. 34B.

The semiconductor device of this embodiment has a structure in which the MOS capacitor, in which the gate insulating film 107 is sandwiched between the Si substrate 101 and the gate electrode 109, and the ferroelectric capacitor, in which the ferroelectric layer 131 is sandwiched between the intermediate electrode 114 and the upper electrode 119, are connected in series. Thus, the applied voltage is distributed to the respective capacitors. For example, when a voltage of +2 V is applied to the entire device, the applied voltage is distributed to 1.2 V and 0.8 V, which are applied to the MOS transistor and the ferroelectric capacitor 104a, respectively. When the applied voltage is +6 V, the applied voltage is distributed to 3.6 V and 2.4 V, which are applied to the MOS transistor and the ferroelectric capacitor 104a, respectively.

In the semiconductor device of this embodiment, if the voltage to be distributed to the ferroelectric capacitor 104a is set in the coarse control range, the leakage current can be increased and the potential at the floating gate (i.e., the gate electrode 109) can be changed largely. If the voltage to be distributed to the ferroelectric capacitor 104a is set in the fine control range, the leakage current can be reduced, information can be stored, and the potential at the floating gate can be finely adjusted by changing the polarization of the ferroelectric.

Figure 36:
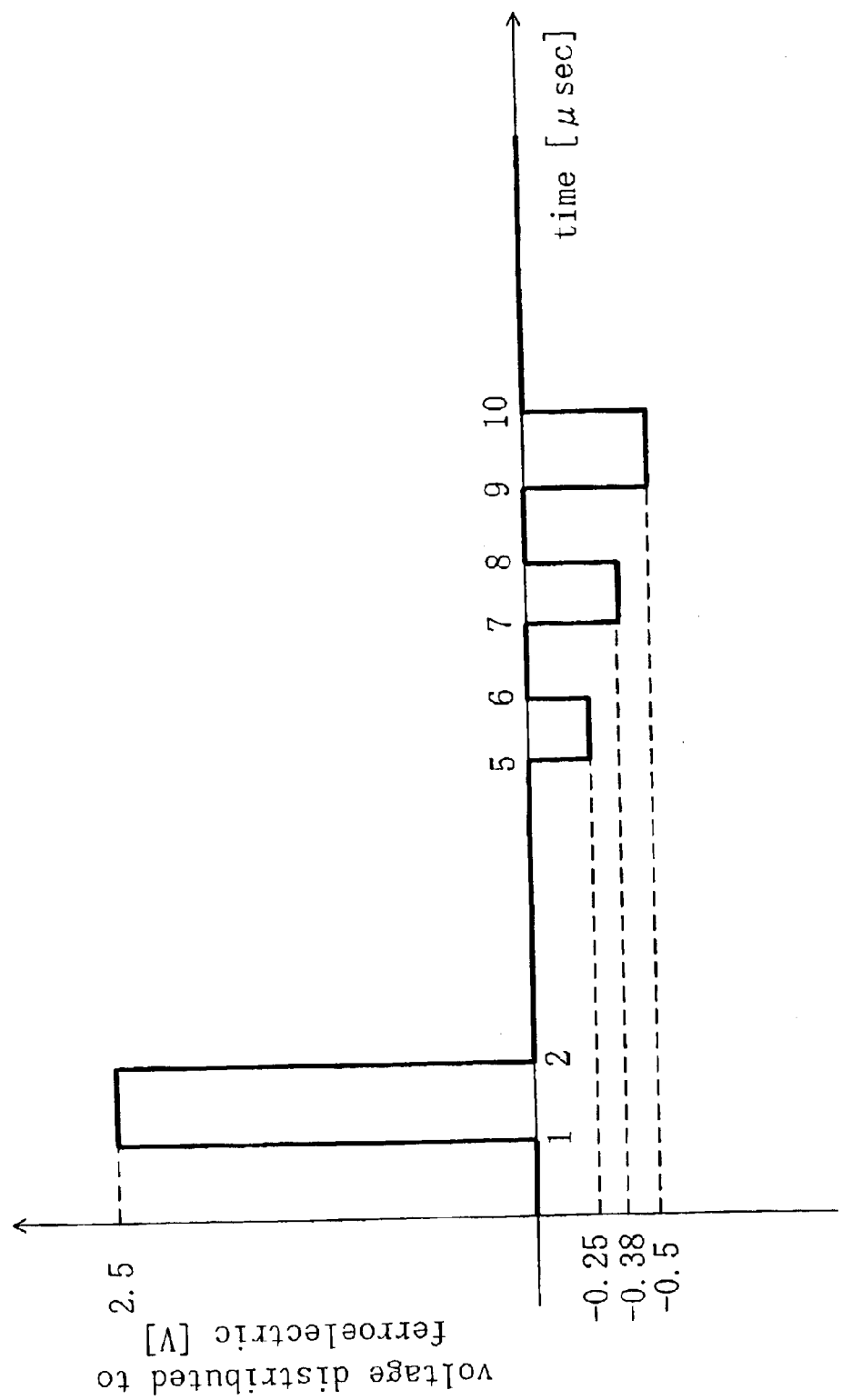
FIG. 36 is a graph showing an example of a method for applying a voltage in the semiconductor device of the seventh embodiment.

FIG. 36 is a graph showing an example of an actual method for applying a voltage based on the findings described above. In this example, a pulse voltage of 2.5 V is applied to the ferroelectric in an initial period of 1 $\mu$sec. This allows a charge to be accumulated in the floating gate through the ferroelectric at high speed. During this period, the ferroelectric is polarized in one direction.

Next, after 5 $\mu$sec., a small negative voltage is applied to the ferroelectric for 1 $\mu$sec. During this period, the leakage current from the ferroelectric is so small that it may be neglected, resulting in that the polarization of the ferroelectric is gradually inverted little by little. In this manner, the amount of the charge accumulated in the floating gate can be varied slightly.

In a general ferroelectric gate transistor, the amount of charge in the floating gate can be varied only by the polarization value of the ferroelectric. On the other hand, if the driving method of this embodiment is used, the amount of the charge can be varied in a very wide range. Specifically, an ON resistance value of the MOS transistor can be determined in a very wide range and in detail. This means that the device of this embodiment functions as an analog memory in which multilevel information can be continuously stored according to the amount of the charge accumulated in the floating electrode.

Figure 37:
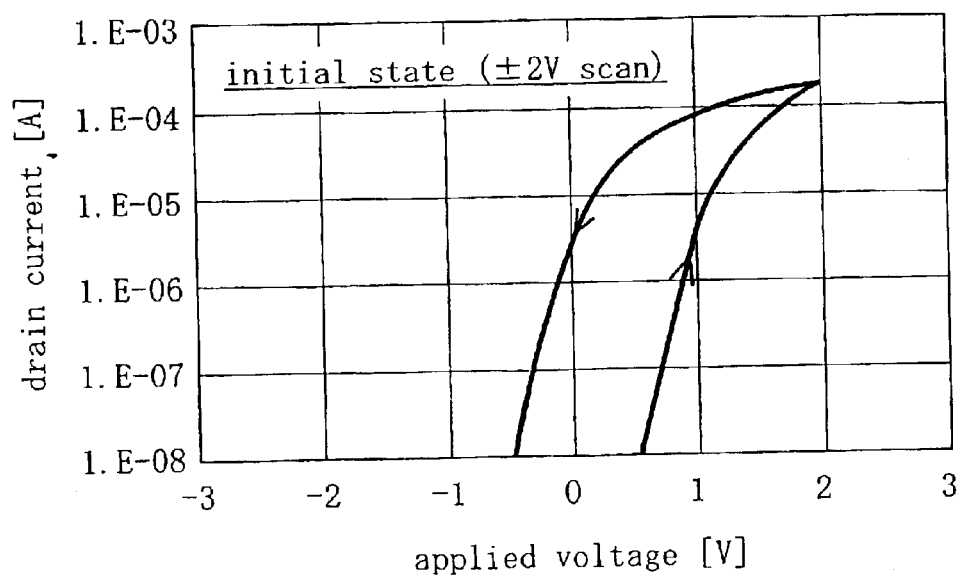
FIG. 37 is graph showing an applied voltage-drain current characteristic of the semiconductor device of the seventh embodiment in an initial state.

FIG. 37 is a characteristic graph for describing operation of the semiconductor device of this embodiment in the initial state. In FIG. 37, the abscissa represents an applied voltage, while the ordinate represents a drain current. In this graph, the applied voltage indicates a voltage applied between the interconnect 125a (or the upper electrode 119) and the Si substrate 101.

As shown in FIG. 37, when a voltage in the range of ±2 V is applied to the semiconductor device of this embodiment in the initial state, the VG-ID characteristic of the MOS transistor in the device exhibits a hysteresis moving counterclockwise. That is to say, the semiconductor device of this embodiment operates as a so-called ferroelectric gate transistor.

Therefore, even when a voltage of +2 V is applied to the semiconductor device and then removed, for example, a charge is induced into the intermediate electrode 114 due to the polarization of the ferroelectric layer 131, thus causing a potential. Thus, a drain current of about 2 $\mu$A flows even upon the application of a voltage of 0 V. On the other hand, when a voltage of −2 V is applied and then removed, the drain current becomes extremely small (i.e., $10^{-8}$ A or less, not shown) conversely. In this case, the voltage between source and drain is also 1 V, as in the fifth embodiment.

If a voltage of +6 V is then applied to the semiconductor device of this embodiment, the drain current can be set at another value.

Figure 38:
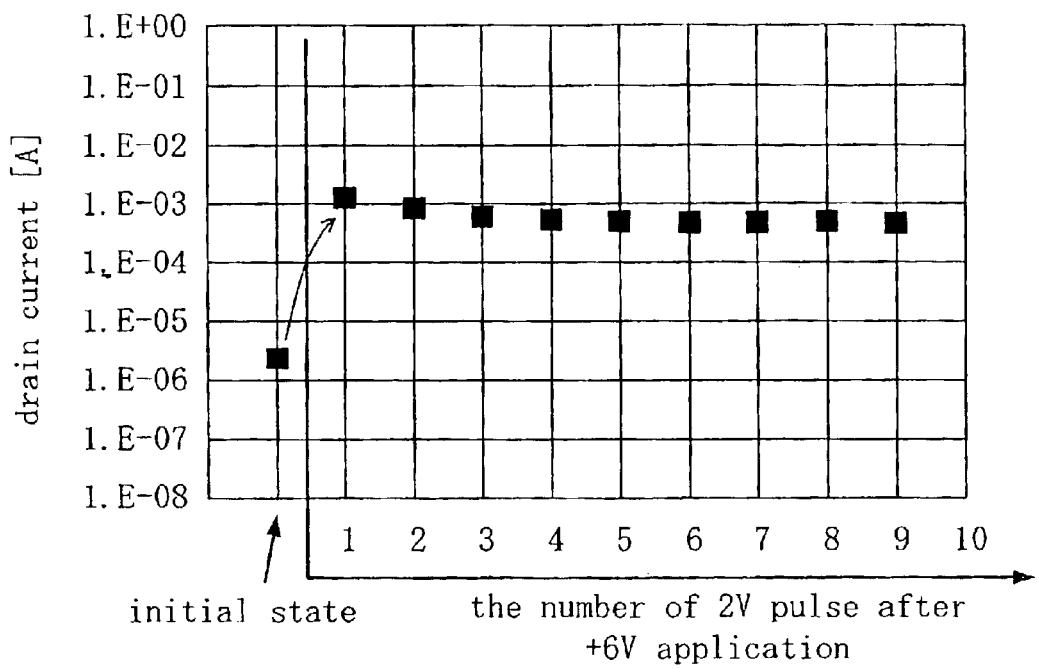
FIG. 38 is a graph showing a drain current in the case where a voltage of +6 V is applied and then a pulse voltage is continuously applied in the semiconductor device of the seventh embodiment.

FIG. 38 is a graph showing a drain current when a pulse voltage of 2 V is repeatedly applied to the semiconductor device of this embodiment to which a write voltage of +6 V has been applied. The interval of the pulse voltage in this graph is 20 $\mu$sec.

As shown in FIG. 38, when a write voltage of +6 V is applied to the semiconductor device of this embodiment in the initial state, a voltage of 2.4 V is distributed to the ferroelectric capacitor, so that the pass current increases exponentially. Accordingly, a charge is accumulated in the intermediate electrode 114 and the gate electrode 109 so that the drain current increases by more than two orders of magnitude. Even if the same pulse voltage of +2 V is input thereafter, the device exhibits the characteristic that the drain current hardly varies and is about $1 \times 10^{-3}$ (A).

This graph shows that data can be stored in the semiconductor device of this embodiment with stability by applying a high write voltage thereto.

Figure 39:
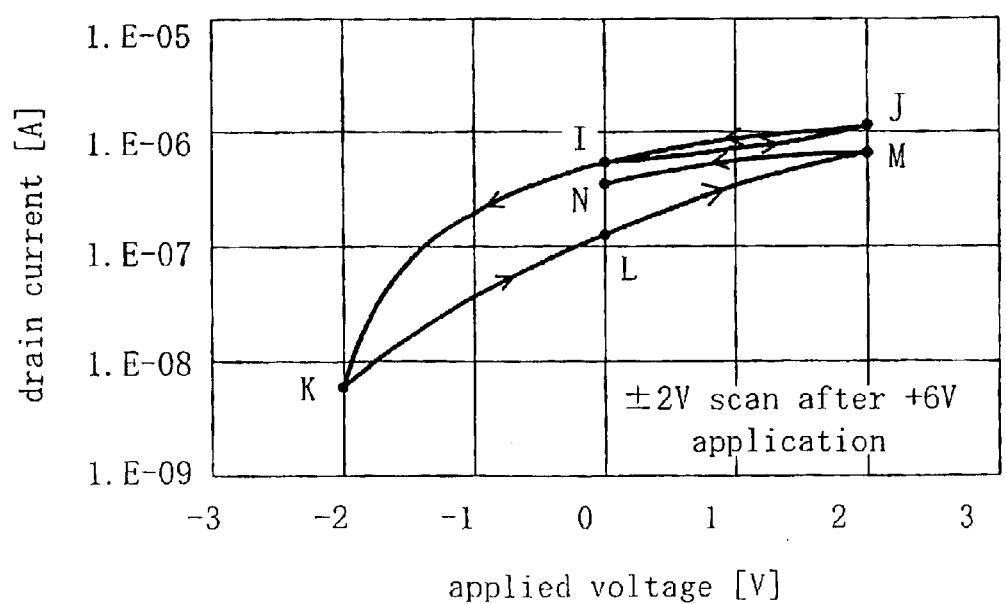
FIG. 39 is a graph showing an applied voltage-drain current characteristic of the semiconductor device of the seventh embodiment when scanned in the applied-voltage range of ±2 V after the application of a voltage of +6V.

FIG. 39 is a graph showing an applied voltage-drain current characteristic of the semiconductor device of this embodiment when scanned in the applied-voltage range of ±2 V after the application of +6V.

First, when a voltage of +6 V is applied to the semiconductor device and then is removed, the drain current takes a value indicated by a point I in FIG. 39.

Next, when a voltage of 2 V is applied to the semiconductor device in the state indicated by the point I and then the voltage is removed, the drain current describes a trajectory from the point I to a point J shown in FIG. 39. After the removal of the voltage, the drain current returns to the point I. The state indicated by the point I corresponds to the state in which a pulse voltage is applied as shown in FIG. 38.

If a voltage of −2 V is applied to the semiconductor device in the state indicated by the point I, the drain current moves to the point K, i.e., decreases by about two orders of magnitude to be $1 \times 10^{-5}$ (A) or less. Subsequently, when the voltage is removed, the drain current moves to a point L, i.e., decreases by about one order of magnitude as compared to the state at the point I before the application of the voltage.

In the semiconductor device of the sixth embodiment, there is no substantial difference in the drain current between the point F and a point H in FIG. 31. This makes the semiconductor device of this embodiment differ largely from the semiconductor devices of the fifth and sixth embodiments.

In this manner, the semiconductor device of this embodiment can hold more data than the semiconductor devices of the fifth and sixth embodiments.

Then, when a voltage of +2 V is applied to the semiconductor device in the state indicated by the point L in FIG. 39, the drain current moves to a point M. When the voltage is then removed, the drain current moves to a point N. In this case, the drain current varies, as describing the trajectory indicated by the points L→M→N, so that the drain current at the point N is larger than that at the previous point L. Thus, by thus scanning using a small applied voltages of ±2 V after the application of a high voltage of +6 V, the drain current can be further modulated.

On the other hand, a high negative pulse voltage may be input as a write voltage.

Figure 40:
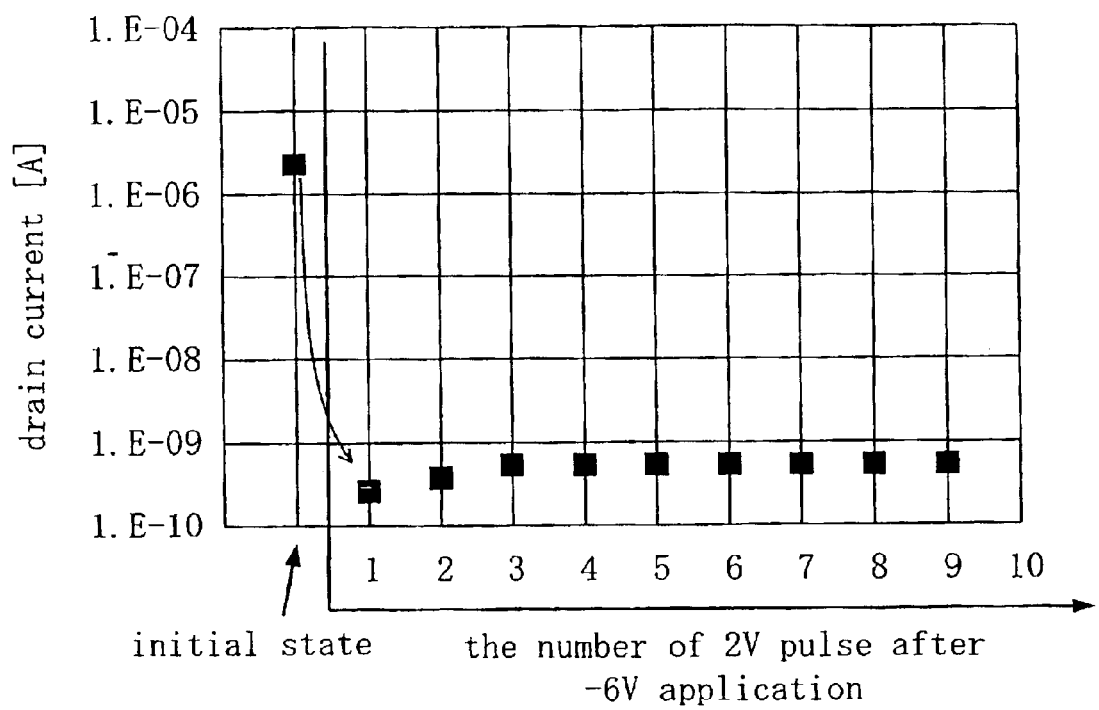
FIG. 40 is a graph showing a drain current in the case where a voltage of −6 V is applied and then a pulse voltage is continuously applied in the semiconductor device of the seventh embodiment.

FIG. 40 is a graph showing a drain current in the case where a voltage of −6 V is applied to the semiconductor device of this embodiment before a pulse voltage of +2 V is applied and then removed. The pulse interval of the pulse voltage is 20 μsec.

As shown in FIG. 40, by applying a voltage of −6 V to the semiconductor device of this embodiment in the initial state, the drain current at 0 V is four orders of magnitude smaller than that in the initial state. In this case, the variations in the drain current are small when a pulse voltage of +2 V is repeatedly applied and removed.

Figure 41:
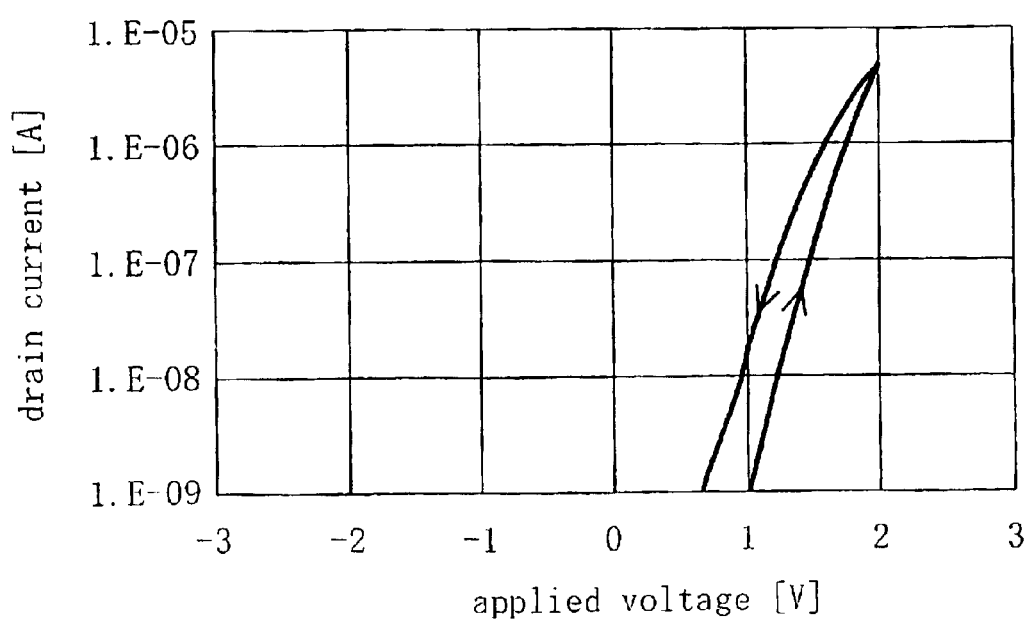
FIG. 41 is a graph showing an applied voltage-drain current characteristic of the semiconductor device of the seventh embodiment when scanned in the applied-voltage range of ±2 V after the input of a pulse voltage of −6 V.

FIG. 41 is a graph showing an applied voltage-drain current characteristic of the semiconductor device of this embodiment when scanned in the applied voltage range of ±2 V after the input of a pulse voltage of −6 V. Though hysteresis is also observed in this state at an applied voltage of 0V, the drain current is extremely low even upon the application of a voltage with each polarity. By thus applying a negative voltage, a small drain current, which is distinguished from that in the case of application of a positive voltage, is obtained.

As described above, in the semiconductor device of this embodiment, operations of driving the MOS transistor in a voltage range in which a resistance component of the ferroelectric capacitor 104a has a substantially constant resistance value (a low voltage range), and of writing in a range in which a current flowing through the ferroelectric capacitor 104a increases exponentially, are properly used.

In the semiconductor device of this embodiment, the change in the applied voltage-drain current characteristic depends on the change in the VG-ID characteristic of the MOS transistor which is caused by accumulating a charge in the intermediate electrode 114 through the ferroelectric layer 131 and thereby accumulating a charge also in the gate electrode 109 of the MOS transistor. Especially, in the semiconductor device of this embodiment, the amount of the charge accumulated in the intermediate electrode and the gate electrode 109 can be changed depending on the direction of polarization of the ferroelectric 104a. Thus, the semiconductor device of this embodiment is usable as a multilevel memory which can take much more levels than the semiconductor devices of the fifth and sixth embodiments.

A large modulation of the drain current caused by a high pulse voltage and a small modulation of the drain current caused by a low pulse voltage can be respectively reflected as modulations of the drain current. Therefore, the semiconductor device of this embodiment is applicable as a neuron element with extremely high flexibility in weighting.

As the semiconductor devices of the fifth and sixth embodiments, the semiconductor device of this embodiment also has a function of "forgetting" by making the interconnect 125a to be grounded, for example, and thereby restoring the characteristic to the initial state.

In the semiconductor device of this embodiment, to hold stored information, the pass current flowing upon the application of a voltage of 1 V to both ends of the ferroelectric capacitor is set equal to or smaller than 100 (mA/cm$^2$) and the recovery time is set equal to or longer than 10 μsec., thus making a clear difference between the modulation of the drain voltage caused by the polarization of the ferroelectric and the modulation in the device of this embodiment. This tendency is substantially the same as in the semiconductor device of the fifth embodiment shown in FIG. 29. The time period required for recovery is about 100 seconds.

In the semiconductor device of this embodiment, the ferroelectric layer 131 and the resistor 106 may be separately provided, as in the semiconductor device of the fifth embodiment. In such a case, to extend the time period required for holding information, for example, the semiconductor device can be designed properly to meet requirements by making the resistor 106 out of a ferroelectric material that is less conductive than a ferroelectric material constituting the ferroelectric layer 131.

In the case where the ferroelectric layer 131 and the resistor 106 are provided separately, a dielectric may be used as a material for the resistor 106.

In the method for driving the semiconductor device of this embodiment, a voltage range in which the ferroelectric layer has a substantially constant resistance value and a voltage range in which the pass current increases exponentially with the voltage are properly used. If the semiconductor device is driven only in a narrow voltage range in which the resistance value of the ferroelectric layer is so small that it may be neglected and the pulse width of the applied voltage is set sufficiently shorter than the recovery time, as in the fifth embodiment, the amount of the charge accumulated in the intermediate electrode 114 and the gate electrode 109 can be varied, as in the fifth embodiment.

In the semiconductor device of this embodiment, BIT is used as a material for the ferroelectric layer. Alternatively, other materials exhibiting similar ferroelectric properties such as lead titanate, lead zirconate titanate or strontium tantalite may be used as a material for the ferroelectric layer.

Embodiment 8

In a semiconductor device according to an eighth embodiment of the present invention, the resistor 106 of the seventh embodiment is replaced by a resistor 150, which is a variable resistor (a varistor) and is made of zinc oxide (ZnO). The resistor 150 and a ferroelectric are provided separately.

Figure 42:
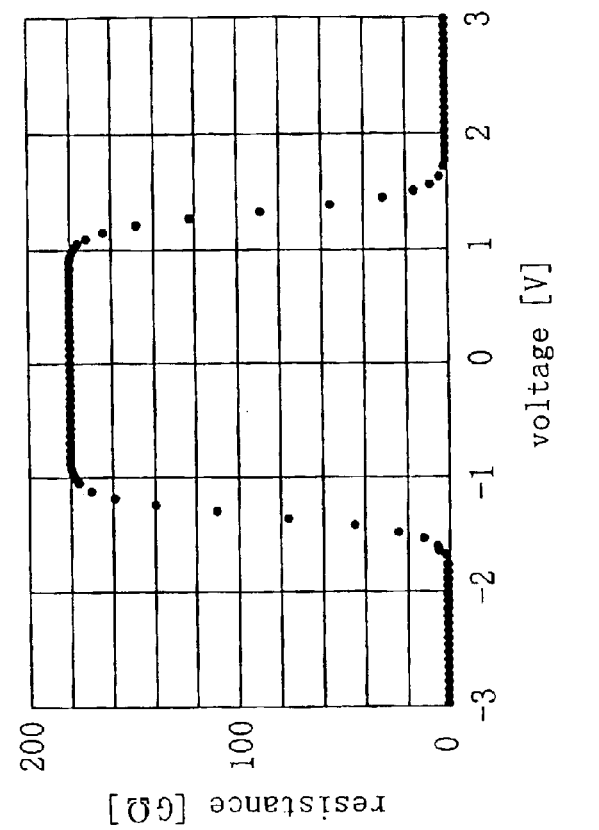
FIG. 42A is a circuit diagram showing a semiconductor device according to an eighth embodiment of the present invention.
FIG. 42B is a graph showing a varistor characteristic of a resistor.
Figure 42:
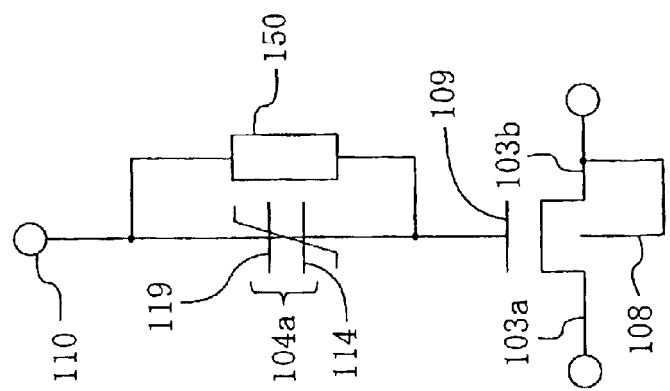

FIG. 42A is a circuit diagram showing the semiconductor device of this embodiment. FIG. 42B is a graph showing a varistor characteristic of the resistor 150. Components already shown in FIG. 32 are indicated by the same reference numerals.

As shown in FIG. 42B, some metal oxides such as ZnO have a characteristic that the resistance value changes largely with an applied voltage. Specifically, the resistor 150 of this embodiment having an electrode area of 10 μm$^2$ exhibits a resistance value of as much as about 180 GΩ in the voltage range of −1 V to +1 V, both inclusive, while the resistance value decreases drastically when the absolute value of the voltage exceeds 1.5 V.

Thus, if the voltage ranges not more than −2 V and not less than +2 V are taken as a coarse control voltage range and the range of −1 V to +1 V, both inclusive, is taken as a fine control voltage range, the semiconductor device can operate as the semiconductor device of the seventh embodiment.

In addition, in the semiconductor device of this embodiment, the resistor 150 may be made of any material, so that the range of an operating voltage can be set flexibly. For example, the voltage corresponding to the low resistance state of the resistor 150 is set slightly higher than the voltage at which the polarization of the ferroelectric is saturated, for example, a coarse control and a fine control can be performed at lower driving voltages.

Figure 43:
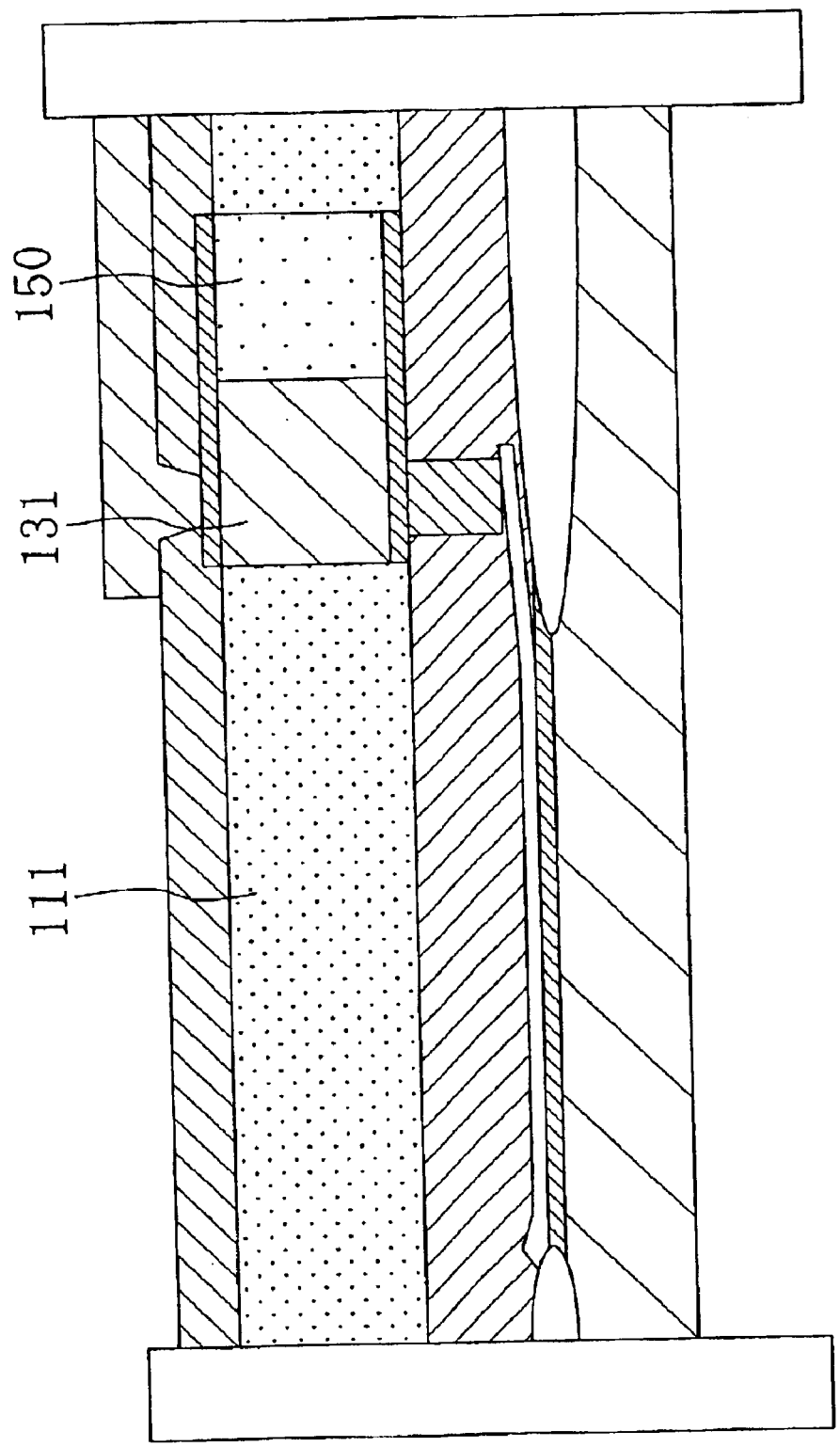
FIG. 43 is a cross-sectional view showing a structure of the semiconductor device of the eighth embodiment.

FIG. 43 is a cross-sectional view showing a structure of the semiconductor device of this embodiment.

As shown in FIG. 43, a ferroelectric 131 and the resistor 150 of this embodiment may share upper and lower electrodes. Such a structure can be easily attained by using publicly known techniques. For example, a ferroelectric is deposited over the entire surface of a lower electrode and is selectively etched in part, and then, ZnO is deposited over part of the lower electrode where the ferroelectric has been removed. FIG. 43 shows an example in which the ferroelectric and the resistor are in contact with each other. Alternatively, the ferroelectric and the resistor may be apart from each other.

The resistor may be made of a perovskite oxide such as $Ba_xSr_{1-x}TiO_3$, a $TiO_2$-based oxide, a $Fe_2O_3$-based oxide, or a $Cu_2O$-based oxide as well as ZnO. $Ba_2O_3$ or a rate-earth element may be added to the metal oxide described above so as to reduce the resistance of the metal oxide. Then, the resistivity and a rate of change in resistance of the metal oxide material can be controlled as required. A P-N junction of Si, an Al-added SiC semiconductor, Se, and the like may be used as a material for the resistor.

In the semiconductor device of this embodiment, a coarse control and a fine control are used properly so as to hold multilevel information excellently. An element connected in parallel with the ferroelectric is not limited to a resistor but may be any other element or circuit so long as a charge to be accumulated in a floating gate can be controlled by an applied voltage.

Embodiment 9

In a semiconductor device according to a ninth embodiment of the present invention, the resistor 106 of the seventh embodiment is replaced by two diodes connected in parallel with each other and disposed in opposite orientations.

Figure 44:
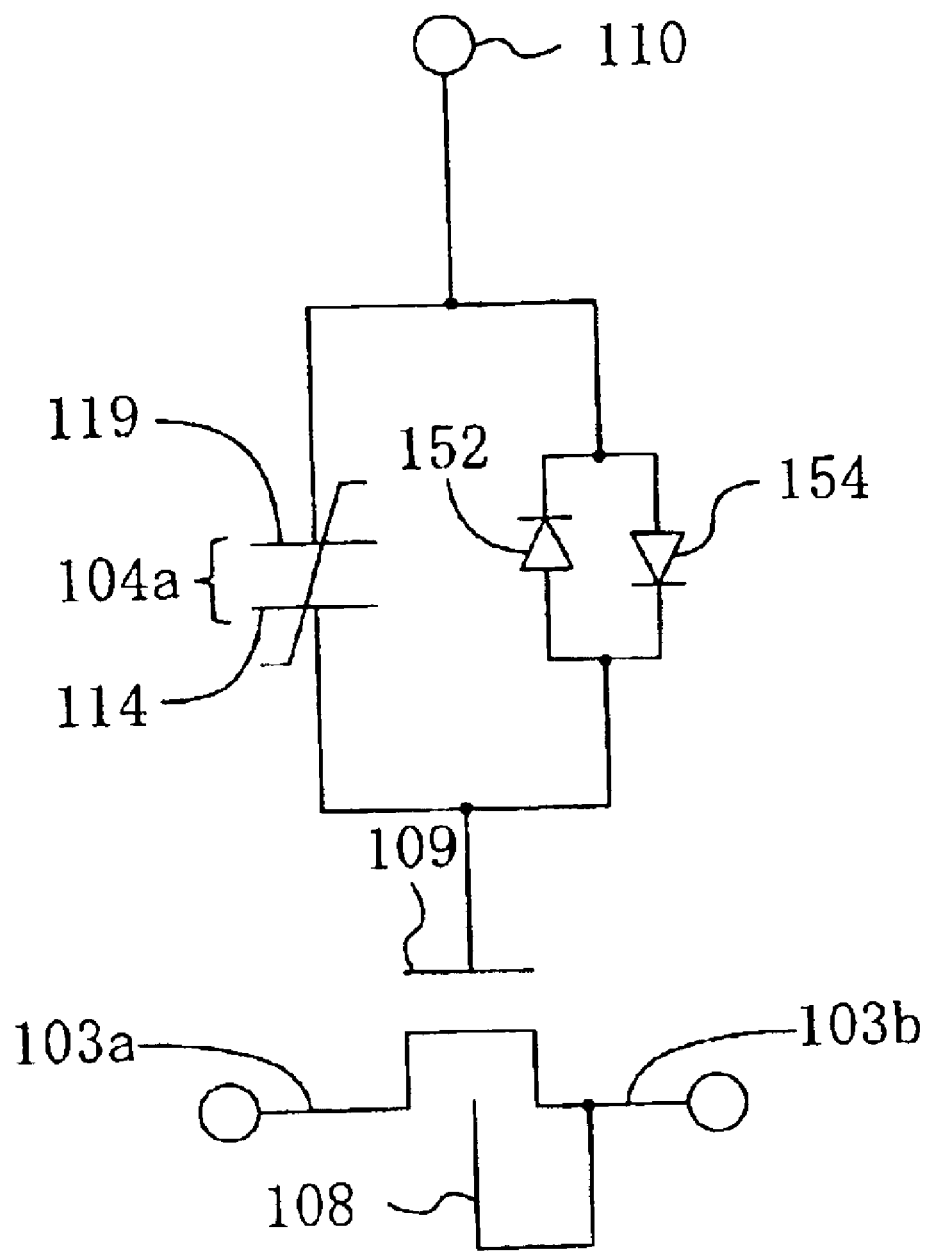
FIG. 44 is a circuit diagram showing a semiconductor device according to a ninth embodiment of the present invention.

FIG. 44 is a circuit diagram showing the semiconductor device of this embodiment. Components already shown in FIG. 32 are indicated by the same reference numerals.

As shown in FIG. 44, the semiconductor device of this embodiment includes: a control-voltage supply unit 110; an MOS transistor; a ferroelectric capacitor 104a; a diode 152; and a diode 154. The ferroelectric 104 and the diodes 152 and 154 are connected to a gate electrode 109 of the MOS transistor and arranged in parallel. The diodes 152 and 154 are disposed in opposite orientations. That is to say, the respective input ports of the diodes 152 and 154 are connected to respective output ports.

In this embodiment, the diodes 152 and 154 are PN diodes, for example. When a forward voltage at a given level or higher is applied to these diodes, current flows, while current hardly flows upon the application of a voltage lower than the given level. Below a breakdown voltage, current hardly flows even upon the application of a reverse voltage.

As shown in FIG. 44, by connecting the two diodes in opposite orientations in parallel, current hardly flows in the voltage range of –t V to +t V, both inclusive, while current flows when the absolute value of the voltage is t V or higher, allowing a charge to be flown into the floating gate (where the threshold voltage of the diodes is t V).

Thus, as in the third and eighth embodiments, multilevel data can be stored, taking a range in which the absolute value of the distributed voltage is high as a coarse control, and a range in which the absolute value of the distributed voltage is small as a fine control.

In the semiconductor device of this embodiment, PN diodes are used as the diodes 152 and 154. Alternatively, any other diode such as a Schottky diode may be used instead.

Embodiment 10

In a semiconductor device according to a tenth embodiment of the present invention the resistor 106 of the seventh embodiment is replaced by an MIS transistor which is turned ON or OFF by a control voltage Vr.

Figure 45:
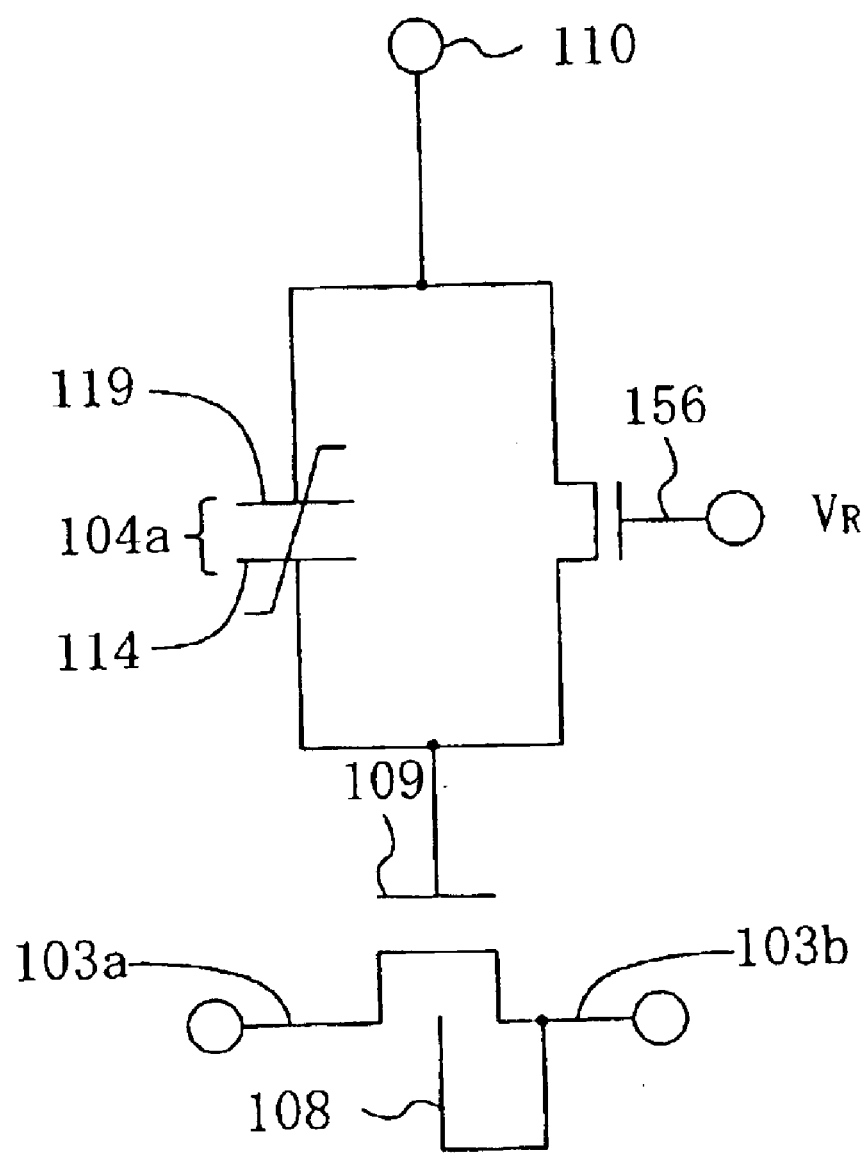
FIG. 45 is a circuit diagram showing a semiconductor device according to a tenth embodiment of the present invention.

FIG. 45 is a circuit diagram showing the semiconductor device of this embodiment.

As shown in FIG. 45, the semiconductor device of this embodiment includes: a control-voltage supply unit 110; an MOS transistor; a ferroelectric capacitor 104a connected to a gate electrode 109 of the MOS transistor; an MIS transistor 156 interposed between the control-voltage supply unit 110 and the gate electrode 109. The MIS transistor 156 is controlled by a control voltage Vr.

In the semiconductor device of this embodiment, the MIS transistor 156 is appropriately turned ON or OFF by an external control circuit or the like, so that a coarse control or a fine control of the potential at the floating gate can be used properly as described in the third through fifth embodiments. For example, when the absolute value of the voltage applied to the MOS transistor is equal to or higher than a given value, the MIS transistor 156 is turned ON. When the absolute value of the voltage applied to the MOS transistor is lower than the given value, the MIS transistor 156 is turned OFF.

In the semiconductor device of this embodiment, a coarse control and a fine control can be switched by changing the control voltage Vr without depending on the structure of the MIS transistor. Thus, the device can be operated in an arbitrary voltage range.

In the semiconductor device of this embodiment, a bipolar transistor may be used instead of the MIS transistor 156.

Embodiment 11

In a semiconductor device according to an eleventh embodiment of the present invention, the resistor 106 of the seventh embodiment is replaced by a variable resistance element 158 whose crystallinity is controlled by a resistance control signal Vw.

Figure 46:
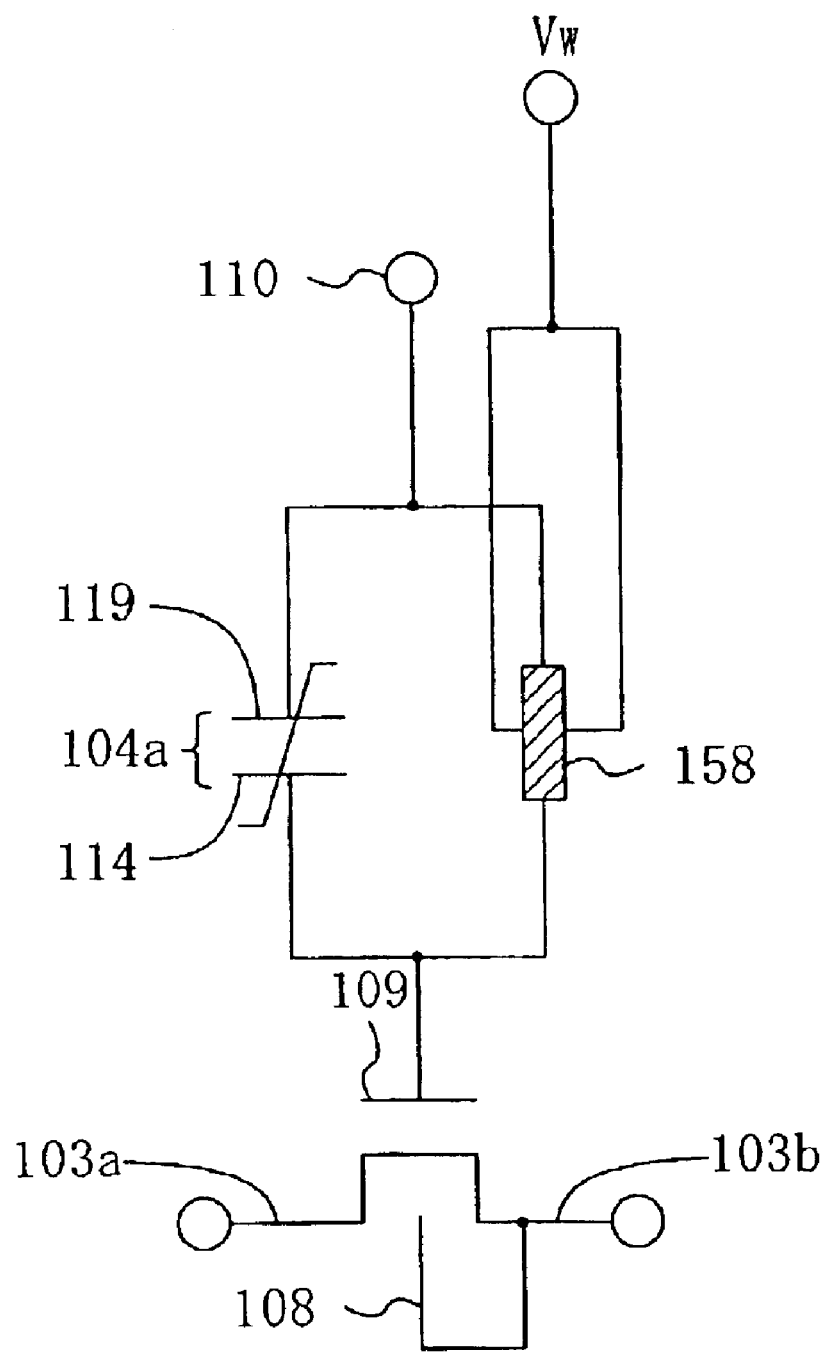
FIG. 46 is a circuit diagram showing a semiconductor device according to an eleventh embodiment of the present invention.

FIG. 46 is a circuit diagram showing the semiconductor device of this embodiment.

As shown in FIG. 46, the semiconductor device of this embodiment includes: a control-voltage supply unit 110; an MOS transistor; a ferroelectric capacitor 104a interposed between the control-voltage supply unit 110 and a gate electrode 109 of the MOS transistor; and the variable resistance element 158 interposed between the control-voltage supply unit 110 and the gate electrode 109 of the MOS transistor and arranged in parallel with the ferroelectric 104a. The variable resistance element 158 is made of an alloy containing three elements of germanium (Ge), tellurium (Te) and antimony (Sb), for example, as main components. The crystallinity of the variable resistance element 158 is controlled by a resistance control signal Vw.

The variable resistance element 158 is in an amorphous state when the resistance control signal Vw has a high voltage pulse of a given value or higher, so that the resistance value is high. When the Vw pulse is then reduced, the resistance value decreases gradually to be adjusted to an arbitrary value. Thus, in accumulating a charge in the floating gate, a voltage is supplied from the control-voltage supply unit 110 with the Vw pulse set at a low voltage. In a fine control of the potential at the floating gate or in holding data, the Vw pulse is set at a high voltage, and a voltage in a fine control voltage range shown in FIG. 35 is applied to the ferroelectric capacitor 104a. Then, a leakage current from the ferroelectric as well as a leakage current from the variable resistance element can be reduced. By thus using the variable resistance element, a semiconductor device in which multilevel information can be stored excellently is implemented.

The variable resistance element 158 of this embodiment is preferably made of a chalcogenide material other than Ge, Te and Sb.

Embodiment 12

As a twelfth embodiment of the present invention, a neurocomputer in which the semiconductor device of the seventh embodiment is used as a neuron element according to will be described.

Figure 48:
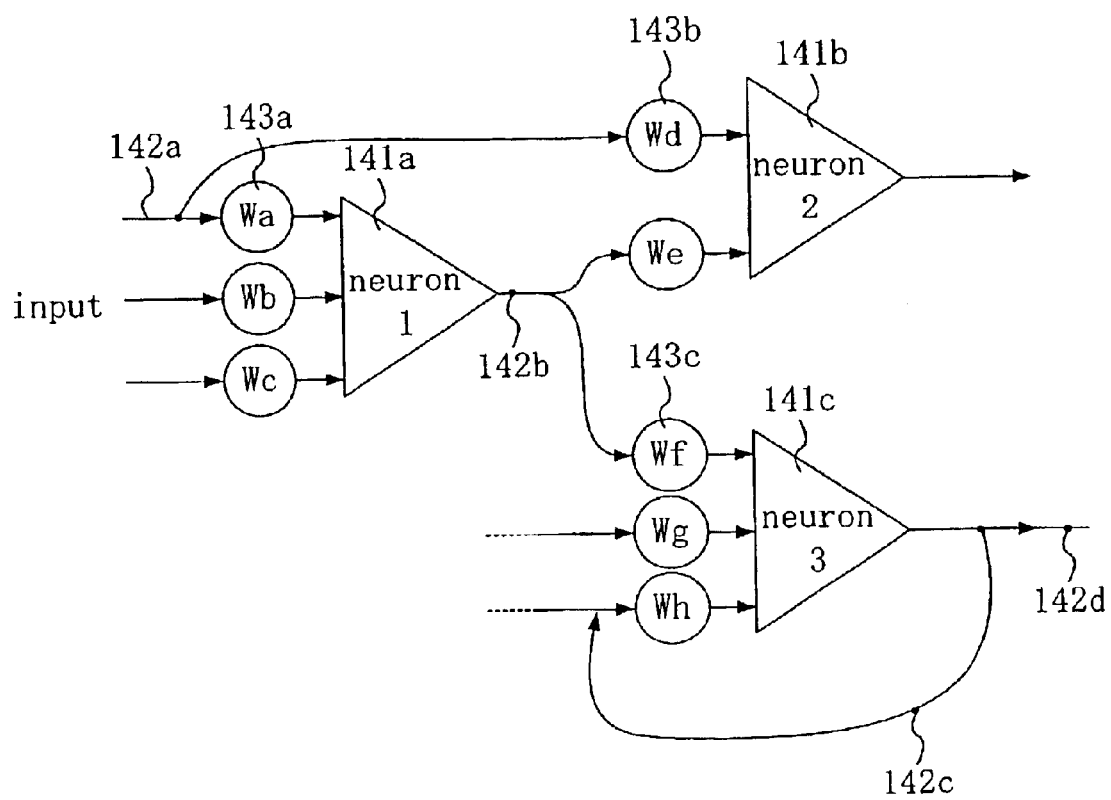
FIG. 48 is a diagram showing a model representing a simplified structure of a fundamental unit of the brain of an animal.
Figure 49:
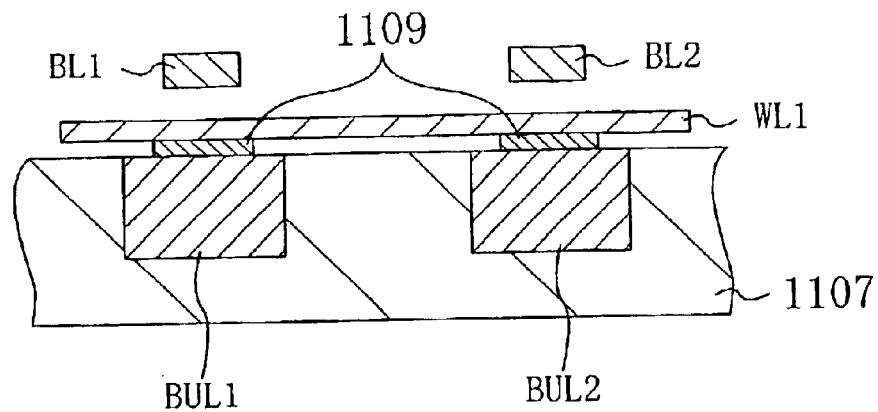
FIG. 49 is a cross-sectional view showing a known semiconductor device functioning as a multilevel memory.
Figure 50:
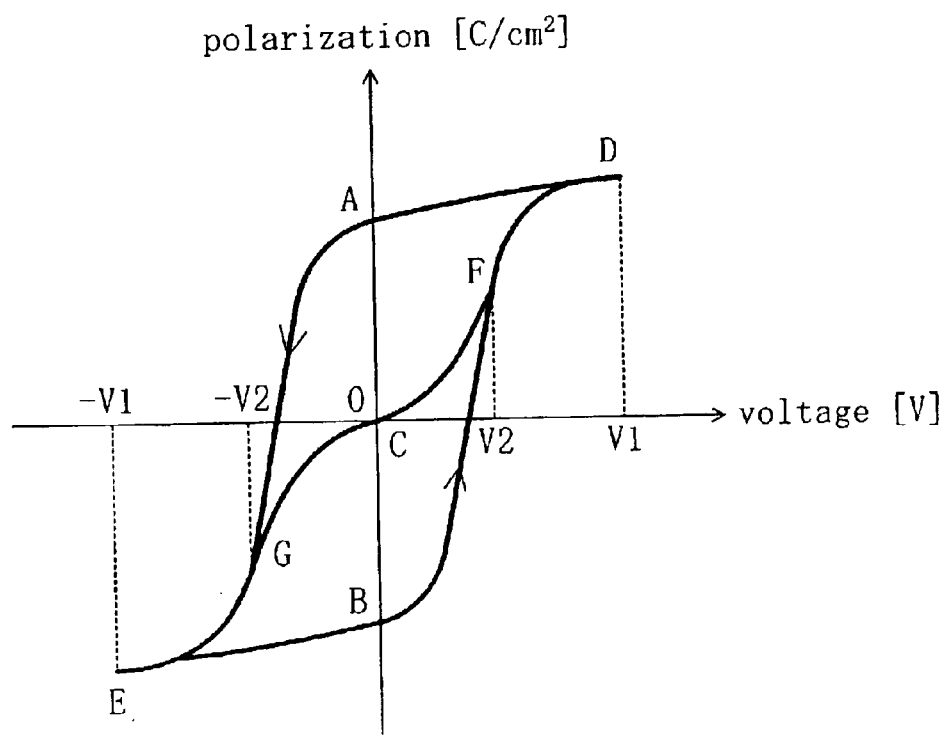
FIG. 50 is a graph showing hysteresis characteristics of the known semiconductor device functioning as a multilevel memory.
Figure 51:
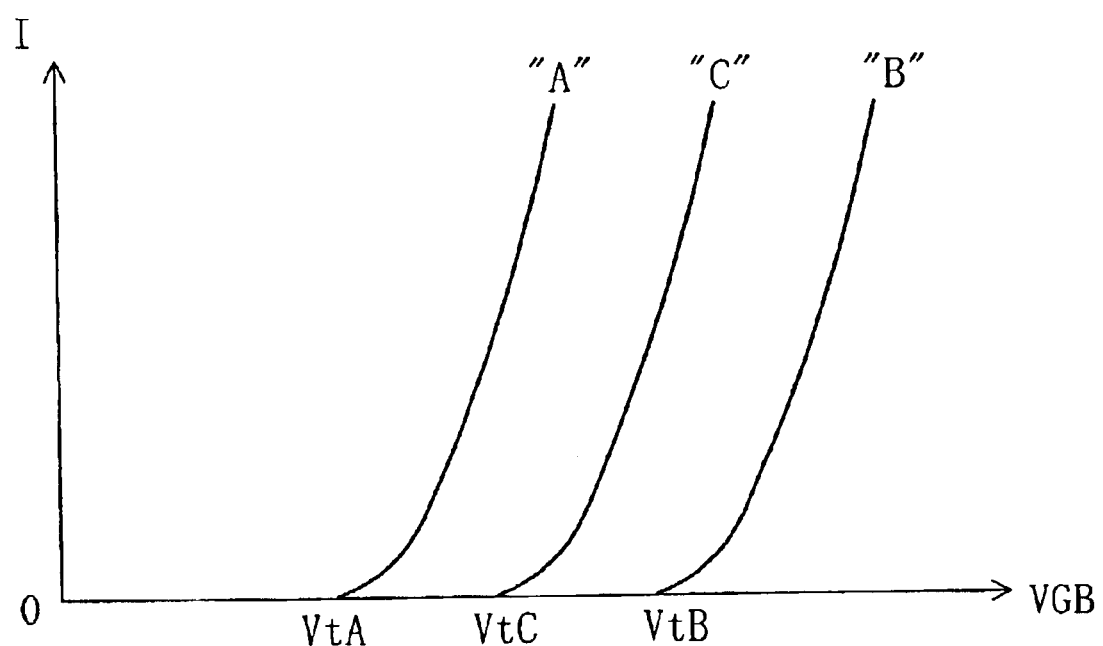
FIG. 51 is a graph showing the relationship between a gate voltage and a drain current in a memory cell of the known semiconductor device.

FIG. 48 is a diagram showing a model representing a simplified structure of a fundamental unit of the brain of an animal. As shown in FIG. 48, the brain of an animal includes: a previous-stage neuron 141a and subsequent-stage neurons 141b and 142c that are nerve cells having a computation function, nerve fibers 142a, 142b and 142c transmitting computation results from neurons; and synaptic connections 143a, 143b and 143c which add weights to signals transmitted through the nerve fibers and which input the signals to the neurons.

Specifically, a signal transmitted through a large number of nerve fibers including the nerve fiber 142a receives weights such as weights Wa, Wb and Wc at a large number of synaptic connections including the synaptic connection 143a and then is input to the neuron 141a. At the neuron 141a, a linear sum of the strengths of input signals is taken. When the sum exceeds a threshold value, the neuron 141a is activated to output a signal to the nerve fiber 142b. The action of outputting a signal upon the activation of a neuron is called "firing" of the neuron.

The output signal is divided into two, for example. Each of the divided signals receives a weight at a synaptic connection and then input to the subsequent-stage neuron 141b or 141c. At the subsequent-stage neuron 141b or 141c, a linear sum of input signals is also taken. When the sum exceeds a threshold value, the subsequent-stage neuron 141b or 141c is activated and outputs a signal. This operation is repeated at a plurality of stages, thereby outputting a computation result.

Loads added to the synaptic connections are gradually modified through leaning, so that an optimum computation result is finally obtained.

The neurocomputer is designed to use semiconductor devices for executing such a function of the brain.

Figure 47:
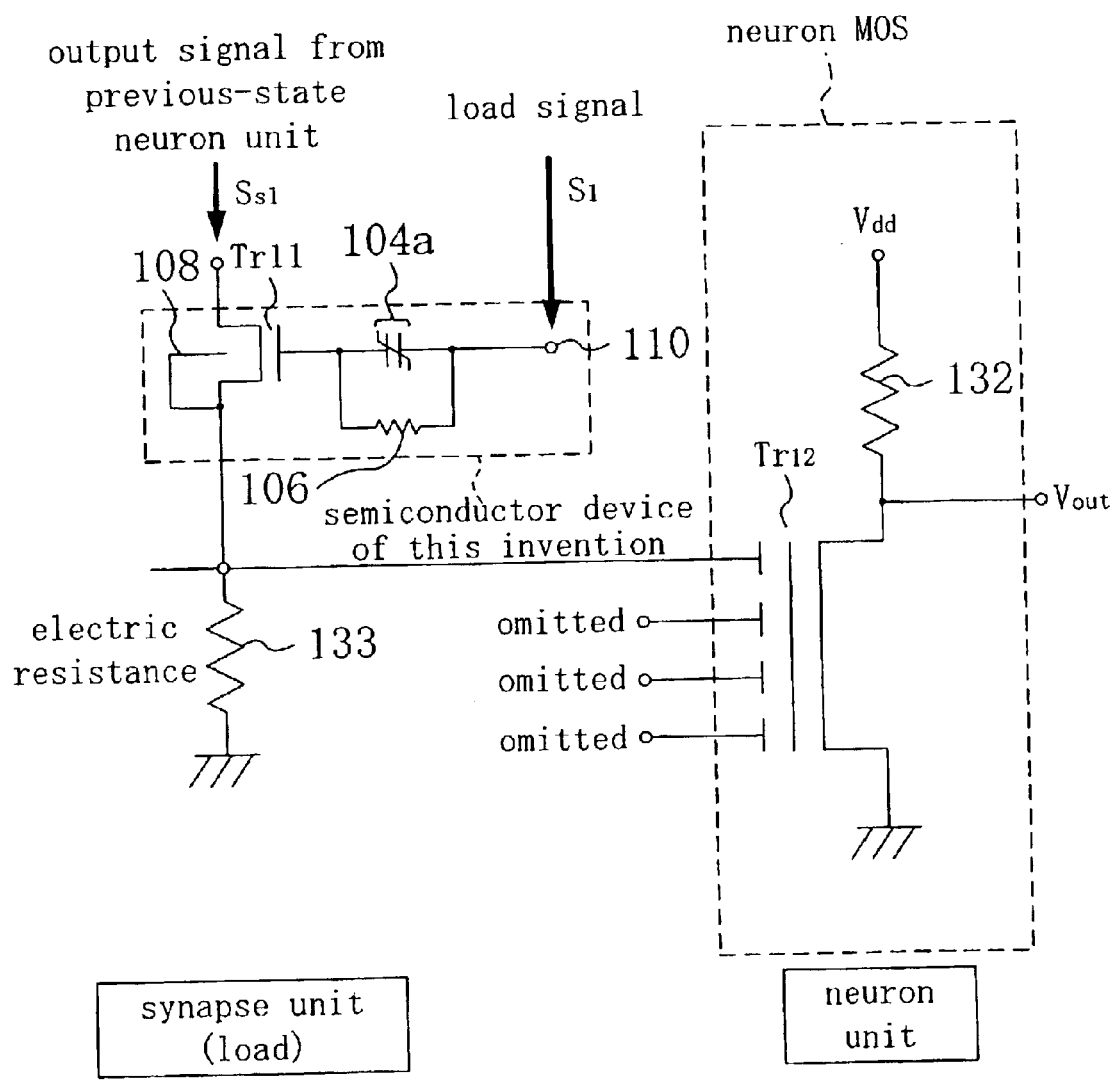
FIG. 47 is a diagram schematically showing a fundamental structure of a neurocomputer according to a twelfth embodiment of the present invention.

FIG. 47 is a diagram schematically showing a fundamental structure of the neurocomputer of this embodiment. In FIG. 47, components already mentioned for the semiconductor device of the seventh embodiment are identified by the same reference numerals shown in FIG. 32.

As described above, the semiconductor device of the seventh embodiment for use in the neurocomputer of this embodiment includes: a control-voltage supply 110; an MOS transistor Tr11 including a gate electrode 109, drain and source regions 103a and 103b and a substrate electrode 108; a ferroelectric capacitor 104a; and the resistor 106. The ferroelectric capacitor 104a and the resistor 106 are disposed in parallel and interposed between the gate electrode 109 of the MOS transistor Tr11 and the control-voltage supply unit 110.

As shown in FIG. 47, the neurocomputer of this embodiment includes: the semiconductor device of the seventh embodiment; an electric resistance 133 interposed between the earth and a source electrode of the MOS transistor Tr11; a node N1 disposed between the source electrode of the MOS transistor Tr11 and the electric resistance 133; a transistor Tr12 including a floating gate, a large number of input gates arranged on the floating gate and source and drain electrodes; and an electric resistance 132 interposed between the source electrode of the transistor Tr12 and a voltage supply line Vdd. The source electrode of the transistor Tr12 is grounded to the earth. The node N1 is connected to one of the input gates.

The semiconductor device of the seventh embodiment, the node N1 and the electric resistance 133 correspond to synapse units (connections between nerve fibers and synapses) of the brain of an animal that transmit signals and add weights. A large number of synapse units are connected to a neuron unit (a neuron MOS) constituted by the transistor Tr12 and the electric resistance 132. The neurocomputer of this embodiment mimics the behavior of the brain and has a structure formed by stacking almost four layers, each of which is made of a synapse unit and a neuron unit connected to each other.

Hereinafter, a signal-flow path will be described. First, an output signal Ss1 from a previous-stage neuron unit is input to a drain electrode of the MOS transistor Tr11, and a load signal $S_1$ is input to the control-voltage supply unit 110. Then, the value of a drain current flowing from the MOS transistor Tr11 varies according to the load signal $S_1$.

Then, a current signal output from the MOS transistor Tr11 is converted into a voltage signal by the electric resistance 133, and is input to one of the input gates of the transistor Tr12. Signals from a large number of other synapse units are also input to the input gates of the transistor Tr12. When the sum of the voltages of these input signals exceeds the threshold value of the transistor Tr12, the neuron unit "fires" to output a signal therefrom. Subsequently, the output signal is transmitted to a subsequent-stage synapse unit.

On the other hand, if the sum of the voltages of the input signals from the synapse units is smaller than the threshold value of the transistor Tr12, no signal is output.

Since the semiconductor device of the seventh embodiment in which multilevel information can be stored at a synapse unit with a simple structure is used for a synapse unit in the neurocomputer of this embodiment, various weights can be added to signals within a small area. As a result, the neurocomputer in which synapse units and neuron units are integrated and which has a leaning function can be downsized.

In the semiconductor device of the seventh embodiment, as described above, the applied voltage-drain current characteristic is changed at a voltage of about 6V, and then a low voltage of about ±2 V is applied, thus varying the drain current in the MOS transistor Tr11 finely,. Therefore, in the neurocomputer of this embodiment, even if the load signal $S_1$ is at a relatively low voltage, it is possible to add weights at various levels corresponding to the voltage.

The synapse units of the neurocomputer of this embodiment has a function of storing the history of the load signal $S_1$ as well as a function of forgetting the history when not used for a long time.

The semiconductor device of the seventh embodiment including the ferroelectric capacitor is used for the synapse unit in the neurocomputer of this embodiment. Alternatively, the semiconductor device of the fifth embodiment including the dielectric capacitor or the semiconductor devices of the eighth through eleventh embodiments may be used.

A semiconductor device according to the present invention is used as a multilevel memory and is applicable to a neurocomputer including a multilevel memory.

What is claimed is:

1. A semiconductor device, comprising:
   a control-voltage supply unit;
   a field-effect transistor including a gate electrode for accumulating a charge; and
   a capacitor and a resistor, disposed in parallel and interposed between the control-voltage supply unit and the gate electrode,
   wherein the semiconductor device can store multilevel information.

2. The semiconductor device of claim 1, wherein a charge is injected from the control-voltage supply unit into the gate electrode.

3. The semiconductor device of claim 1, wherein the semiconductor device functions as an analog memory in which multilevel information can be stored continuously according to the amount of the charge accumulated in the gate electrode.

4. The semiconductor device of claim 1, wherein the resistor is made of a dielectric material.

5. The semiconductor device of claim 4, wherein the resistor has a resistance value that varies according to the strength of an electric field applied to the resistor.

6. The semiconductor device of claim 4, wherein the resistor has a resistance value which is almost constant when the strength of an electric field applied to the resistor is at a level equal to or smaller than a given level and which decreases when the strength of the electric field exceeds the given level.

7. The semiconductor device of claim 4, wherein a pass current flowing through the resistor increases substantially in proportion to a voltage applied to both ends of the resistor when the absolute value of the applied voltage is equal to or smaller than a given value, while the pass current increases exponentially when the absolute value of the applied voltage exceeds the given value.

8. The semiconductor device of claim 7, wherein a pass current flowing per unit area of the resistor is 100 [$mA/cm^2$] or less in a voltage range in which the pass current flowing through the resistor increases substantially in proportion to the voltage.

9. The semiconductor device of claim 4, wherein the capacitor includes a ferroelectric layer, and wherein the resistor is made of a ferroelectric material.

10. The semiconductor device of claim 1, wherein the control-voltage supply unit is an upper electrode of the capacitor, wherein the gate electrode of the field-effect transistor is connected to an intermediate electrode, wherein the capacitor is a dielectric capacitor including the upper electrode, the intermediate electrode and a dielectric layer, the dielectric layer being interposed between the upper electrode and the intermediate electrode, and wherein the dielectric layer has a resistance component functioning as the resistor.

11. The semiconductor device of claim 10, further including at least one resistor provided separately from the capacitor.

12. The semiconductor device of claim 11, wherein the resistor provided separately from the capacitor is a variable resistor that includes an oxide containing an element selected from the group consisting of Ba, Sr, Ti, Zn, Fe and Cu, or includes an element selected from the group consisting of SiC, Si and Se.

13. The semiconductor device of claim 11, wherein the resistors are diodes that are connected in parallel and disposed in opposite orientations.

14. The semiconductor device of claim 11, further including an MIS transistor, wherein the MIS transistor has an ON resistance functioning as the resistor provided separately from the capacitor.

15. The semiconductor device of claim 11, wherein the resistor provided separately from the capacitor is a variable resistance element made of a variable resistance material having a resistance value that varies depending on the crystallinity of the material.

16. The semiconductor device of claim 1, wherein the semiconductor device is used as a synapse unit in a neurocomputer.

17. A method for driving a semiconductor device including a control-voltage supply unit, a field-effect transistor including a gate electrode having a function of accumulating a charge, a capacitor, and a resistor, the capacitor and the resistor being disposed in parallel and interposed between the control-voltage supply unit and the gate electrode, the method comprising the steps of:

a) applying a write voltage to both ends of the resistor to vary the amount of the charge accumulated in the gate electrode via the resistor, thereby changing a threshold voltage of the field-effect transistor; and b) reading out information according to variation in a drain current in the field-effect transistor.

18. The method of claim 17, wherein the capacitor includes a dielectric layer.

19. The method of claim 18, wherein in the step a), a pass current flowing through the resistor increases substantially in proportion to the write voltage when the absolute value of the write voltage is equal to or smaller than a given value, and wherein the pass current increases exponentially as the write voltage increases, when the absolute value of the write voltage exceeds the given value.

20. The method of claim 19, wherein in the step a), when the absolute value of the write voltage is equal to or smaller than the given value, the amount of the charge accumulated in the gate electrode is controlled depending on the length of a time period over which the write voltage is applied.

21. The method of claim 19, wherein in the step a), when the absolute value of the write voltage is equal to or smaller than the given value, a pass current flowing per unit area of the resistor is 100 [$mA/cm^2$] or less.

22. The method of claim 19, wherein in the step a), when the absolute value of the write voltage exceeds the given value, the write voltage is set to have an uniform pulse width and the amount of the charge accumulated in the gate electrode is controlled depending on the magnitude of the absolute value of the write voltage.

23. The method of claim 22, wherein in the step a), when the absolute value of the write voltage exceeds the given value, the amount of the charge accumulated in the gate electrode is subjected to a coarse control, and when the absolute value of the write voltage is lower than the given value, the amount of the charge accumulated in the gate electrode is subjected to a fine control.

24. The method of claim 17, wherein in the step a), the write voltage is in positive- and negative-voltage ranges that extend to an identical absolute value.

* * * * *